(12) United States Patent  
Davies

(10) Patent No.: US 8,896,315 B1  
(45) Date of Patent: Nov. 25, 2014

(54) BATTERY CELL BALANCING SYSTEM AND METHOD

(75) Inventor: Francis J. Davies, Friendswood, TX (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 365 days.

(21) Appl. No.: 13/354,552

(22) Filed: Jan. 20, 2012

Related U.S. Application Data

(63) Continuation-in-part of application No. 12/855,384, filed on Aug. 12, 2010, now Pat. No. 8,570,047, which is a continuation-in-part of application No. 12/370,021, filed on Feb. 12, 2009, now Pat. No. 8,183,870.

(51) Int. Cl.  
*G01N 27/416* (2006.01)

(52) U.S. Cl.  
USPC ........... 324/434; 320/117; 320/118; 320/119; 320/120; 320/121

(58) Field of Classification Search  
CPC ..................... H01M 2220/10–2220/30; H01M 2250/10–2250/40  
USPC ................................... 320/117–127; 324/434  
See application file for complete search history.

(56) References Cited

U.S. PATENT DOCUMENTS

| | | |
|---|---|---|
| 4,217,645 A | 8/1980 | Barry et al. |
| 4,313,080 A | 1/1982 | Park |
| 4,697,134 A | 9/1987 | Burkum et al. |
| 4,839,905 A | 6/1989 | Mantovani |
| 4,956,739 A | 9/1990 | Becker et al. |
| 5,254,930 A | 10/1993 | Daly |
| 5,390,064 A | 2/1995 | Russo |
| 5,656,931 A | 8/1997 | Lau et al. |
| 5,659,237 A | 8/1997 | Divan et al. |
| 5,666,040 A | 9/1997 | Bourbeau |
| 5,839,093 A | 11/1998 | Novosel et al. |
| 5,914,606 A | 6/1999 | Becker-Irvin |
| 5,923,148 A | 7/1999 | Sideris et al. |
| 5,969,625 A | 10/1999 | Russo |
| 5,982,143 A * | 11/1999 | Stuart ........................... 320/119 |
| 6,002,260 A | 12/1999 | Lau et al. |
| 6,018,239 A | 1/2000 | Berkcan et al. |
| 6,031,354 A | 2/2000 | Wiley et al. |
| 6,133,724 A | 10/2000 | Schweitzer et al. |
| 6,181,103 B1 | 1/2001 | Chen |
| 6,268,711 B1 | 7/2001 | Bearfield |
| 6,501,194 B1 * | 12/2002 | Jiang et al. ...................... 307/66 |
| 6,538,414 B1 | 3/2003 | Tsuruga et al. |
| 6,583,603 B1 | 6/2003 | Baldwin |
| 6,664,762 B2 | 12/2003 | Kutkut |
| 6,711,512 B2 | 3/2004 | Noh |
| 6,803,678 B2 | 10/2004 | Gottlieb et al. |

(Continued)

*Primary Examiner* — Huy Q Phan  
*Assistant Examiner* — Temilade S Rhodes-Vivour  
(74) *Attorney, Agent, or Firm* — Theodore U. Ro

(57) ABSTRACT

A battery cell balancing system is operable to utilize a relatively small number of transformers interconnected with a battery having a plurality of battery cells to selectively charge the battery cells. Windings of the transformers are simultaneously driven with a plurality of waveforms whereupon selected battery cells or groups of cells are selected and charged. A transformer drive circuit is operable to selectively vary the waveforms to thereby vary a weighted voltage associated with each of the battery cells.

14 Claims, 46 Drawing Sheets

(56) References Cited

U.S. PATENT DOCUMENTS

| | | |
|---|---|---|
| 6,844,703 B2 | 1/2005 | Canter |
| 6,844,799 B2 | 1/2005 | Attarian et al. |
| 6,915,220 B2 | 7/2005 | Cardinal et al. |
| 6,963,197 B1 | 11/2005 | Feight et al. |
| 6,983,212 B2 | 1/2006 | Burns |
| 7,081,737 B2 | 7/2006 | Liu et al. |
| 7,148,654 B2 | 12/2006 | Burany et al. |
| 7,315,169 B1 | 1/2008 | Fenske et al. |
| 7,425,832 B2 | 9/2008 | Gopal et al. |
| 7,489,048 B2 | 2/2009 | King et al. |
| 7,880,433 B2 | 2/2011 | Oh et al. |
| 7,888,910 B2 | 2/2011 | Zeng |
| 7,932,694 B2 | 4/2011 | Watanabe et al. |
| 7,939,965 B2 | 5/2011 | Oh et al. |
| 2003/0102845 A1 | 6/2003 | Aker et al. |
| 2005/0024015 A1* | 2/2005 | Houldsworth et al. ....... 320/119 |
| 2005/0156431 A1* | 7/2005 | Hennessy ...................... 290/44 |
| 2006/0125449 A1 | 6/2006 | Unger |
| 2007/0001651 A1* | 1/2007 | Harvey ........................ 320/166 |
| 2007/0047100 A1 | 3/2007 | Takahashi et al. |
| 2007/0279003 A1 | 12/2007 | Altermose et al. |
| 2009/0140694 A1* | 6/2009 | Zeng ............................ 320/118 |
| 2010/0283433 A1 | 11/2010 | Oh et al. |
| 2011/0049977 A1 | 3/2011 | Onnerud et al. |

* cited by examiner

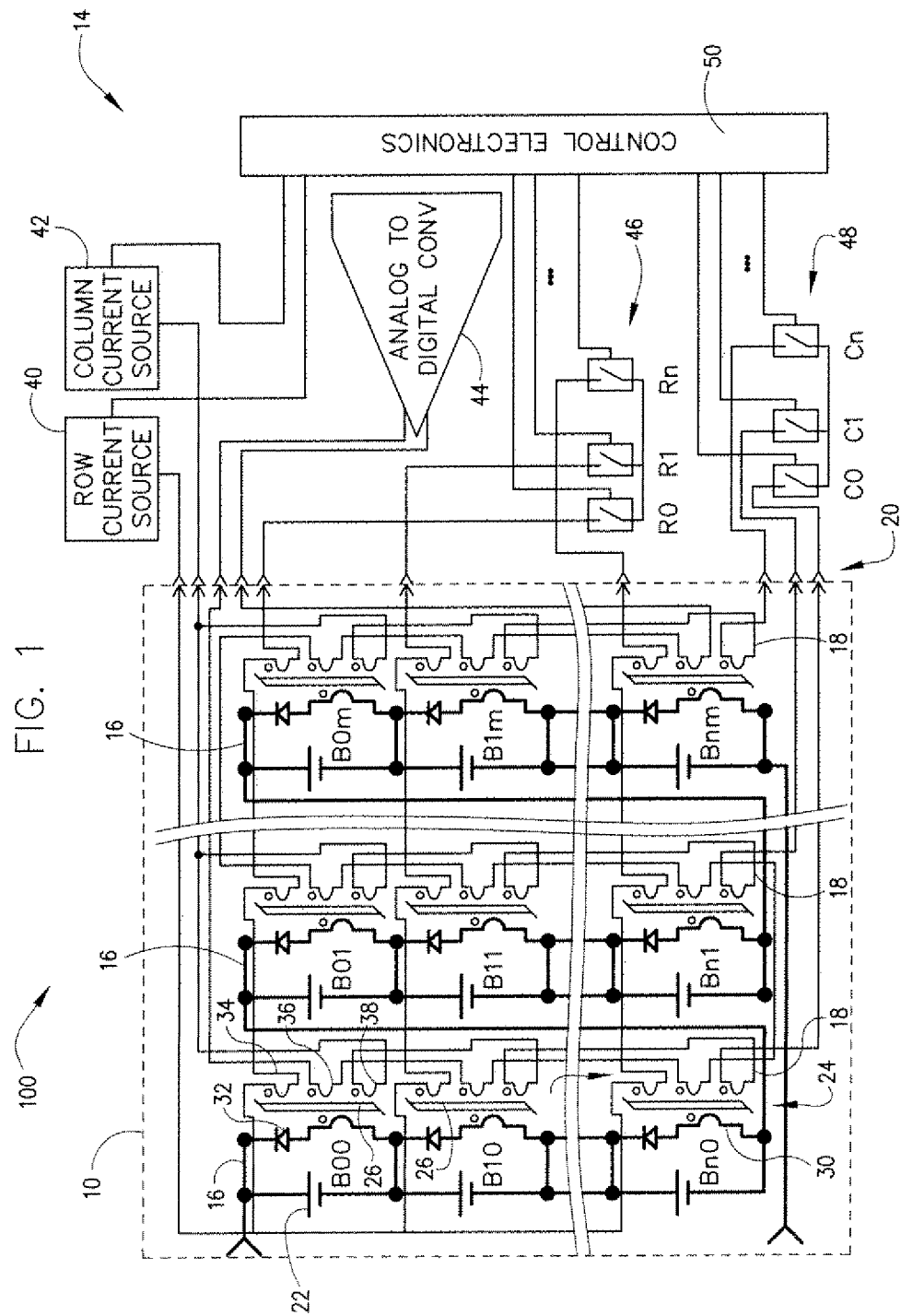

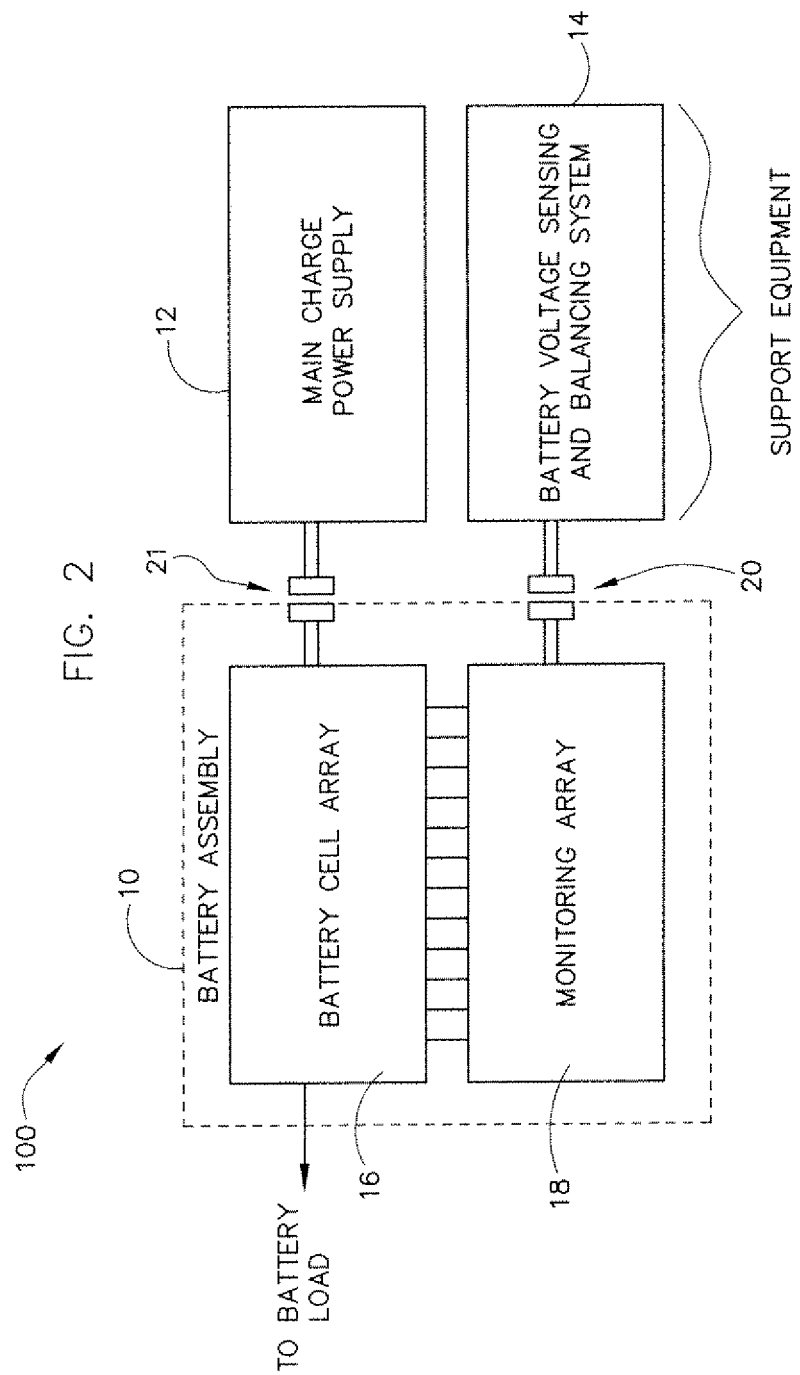

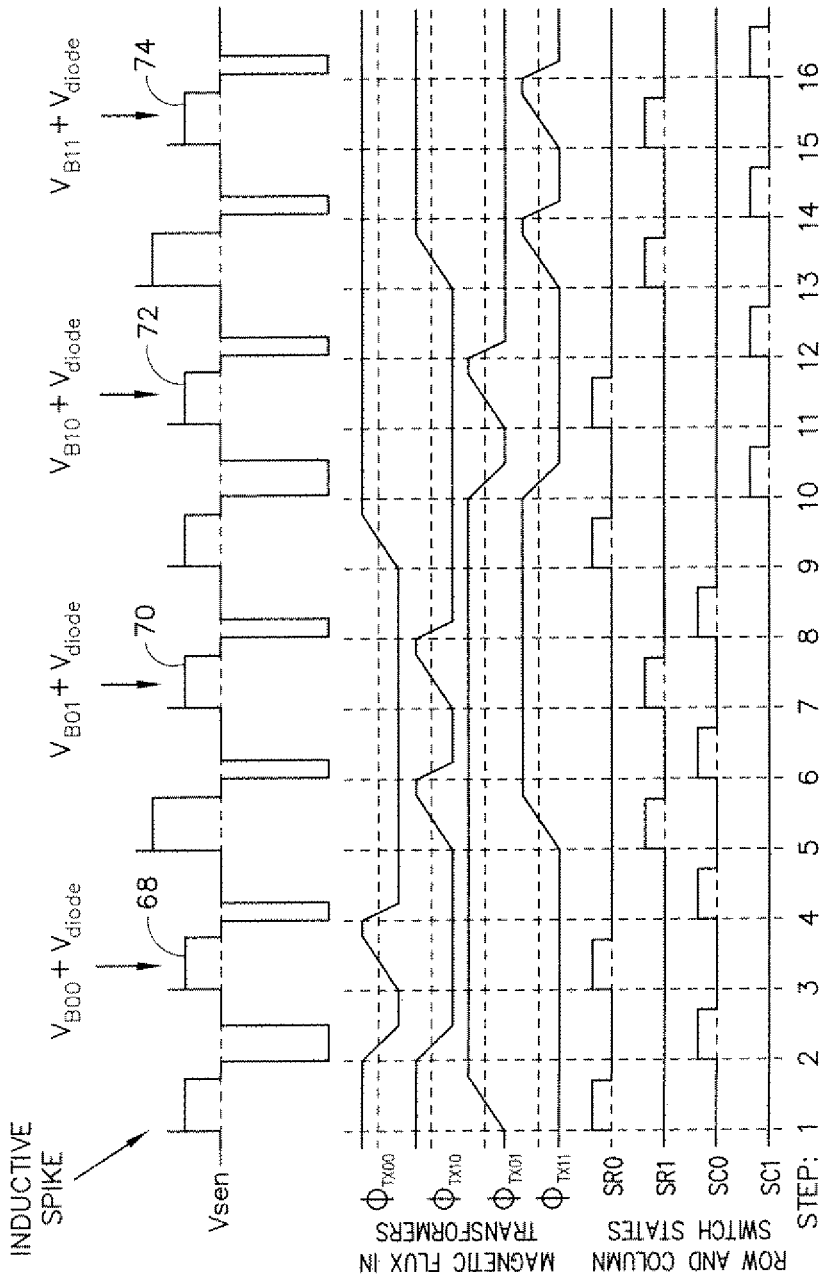

|    | FAULT ON S1 | FAULT ON S2 | FAULT ON S3 | FAULT ON S4 | FAULT ON S5 | FAULT ON S6 | FAULT ON S7 | FAULT ON S8 | NO FAULT |
|----|----|----|----|----|----|----|----|----|----|
| V1 | + | + | + | 0 | 0 | − | − | − | 0 |
| V2 | + | 0 | − | + | − | + | 0 | − | 0 |

FIG. 29

BATTERY CELL BALANCING SYSTEM AND METHOD

This application is a continuation-in-part application of U.S. patent application Ser. No. 12/855,384 filed Aug. 12, 2010 now U.S. Pat. No. 8,570,047, which is a continuation-in-part application of U.S. patent application Ser. No. 12/370,021 filed Feb. 12, 2009 now U.S. Pat. No. 8,183,870. The above applications are incorporated herein by reference.

ORIGIN

The innovation described herein was made by employee(s) of the United States Government and may be manufactured and used by or for the Government of the United States of America for governmental purposes without the payment of any royalties thereon or therefore.

BACKGROUND

1. Field of Innovation

The present innovation relates generally to multi-cell batteries and, in one possible embodiment, to a lightweight monitoring network with minimal connections that may be utilized to safely balance the charge in individual battery cells and/or groups of battery cells.

2. Description of Related Art

High power batteries generally comprise series connections of many cells or cell banks. Examples of high voltage batteries include battery cell arrays for hybrid cars, aerospace/spacecraft applications, telecommunication power supplies, computer power supplies, uninterruptible power supplies, electric utility energy storage, commercial applications, and the like.

High voltage batteries may be of different types including lithium-ion cells, fuel cells, other electrochemical cells, and the like. Batteries may utilize different numbers of individual cells depending on the requirements of the system. For example, batteries may have a few cells, thirty or more cells, over one hundred cells, or more. Thus, the number of connections necessary to provide access to individual cells may be quite large.

In order to maintain high performance over battery life it is desirable to keep the state-of-charge of all the cell banks equal. For this purpose, the charger needs to be able to produce significant current (>1 Ampere) for quick cell balancing. While equalizing or balancing is possible by discharging the individual batteries, a preferred technique equalizes by charging rather than discharging. In general, only a few cells may need equalization charging, as compared with general charging that is applied to all cells. A preferred charger should be able to apply the charging current to those specific cells that need a boost.

Due to the high voltages and power produced by such batteries, it is desirable that DC isolation is provided for safety concerns in the process of balancing and/or monitoring. If there is a failure of a diode or transistor, which is part of many prior art charging systems, there is a need for built-in failure tolerance for safety concerns.

Prior art techniques for balancing charge have utilized various techniques including individual cell discharge for each cell bank, switched capacitors or transformers, and individual chargers on cell banks.

Individual chargers for cell banks are bulky. If the connectors are heavy or bulky, then they may be unsuitable for aerospace/spacecraft applications. Switch arrays to connect a single charger to cell banks are complicated, expensive, and involve safety concerns when switching high voltage DC. Prior art balancing systems typically do not have electrical isolation.

The following patents show prior art efforts regarding the above and other problems:

U.S. Pat. No. 5,659,237, to Divan, et al., issued Aug. 19, 1997, discloses a technique for charge equalization of a series connected string of battery cells. The secondary windings of a transformer having a single primary winding and multiple secondary windings are connected across each battery cell to be equalized. A single power converter applies a charging signal to the primary of the transformer, inducing a charging current in each secondary which is inversely related to the charge on the battery cells to be equalized. The transformer is preferably implemented as a coaxial winding transformer having low secondary-to-secondary winding coupling. The power converter is preferably implemented as a forward converter supplied with DC power from an adjustable DC power source. A source voltage provided by the DC source may preferably be adjusted during the course of charge equalization to preferentially direct charge to weaker cells. The charge equalization system may be used in combination with a bulk charging system to provide for both rapid charging of a battery string as well as equalization of the battery cells within the string.

U.S. Pat. No. 6,538,414, to Tsuruga, et al., issued Mar. 25, 2003, discloses an energy adjusting device which transfers energy charged in an arbitrary cell to the input/output terminals of a unit energy storage device. The energy adjusting device includes a transformer having a plurality of primary coils and a secondary coil mutually coupled magnetically but electrically insulated, switching circuits which open and close the circuits of the primary coils of the transformer connected to the arbitrary cell, a circuit connecting the secondary coil of the transformer via a rectifying circuit to the input/output terminals of the unit energy storage device, and a control circuit which, by operating the switching circuits, adjusts the amount of energy stored in the cells to a specific ratio with respect to the amount of energy stored by the unit energy storage device.

U.S. Pat. No. 7,888,910, to J. Zeng, issued Feb. 15, 2011; discloses techniques for sequencing a switched single capacitor for automatic equalization of batteries connected in series. In one embodiment, a battery equalizer includes a single capacitor, at least two switching circuits to be coupled to each of at least two batteries coupled in series. The battery equalizer further includes at least two driver circuits corresponding the at least two switching circuits and a controller. The controller is programmed to control the driver circuits in order to drive the switching circuits to sequentially couple the single capacitor to one of the batteries coupled in series during charging and/or discharging of the batteries. Only one of the switching circuits is turned on at a given time such that only one of the batteries is coupled to the single capacitor at the given time.

U.S. Pat. No. 7,932,694 to Watanabe, et al., issued Apr. 26, 2011, discloses a battery charger configured to use one of two or more power supplies including a commercial AC power supply and a DC power supply. An AC cable is fixedly secured to the body of the battery charger and a DC cable is detachably connected to the body of the battery charger. A single transformer is employed that has a first primary winding to which the AC power supply is connected a first switching element, a second primary winding to which the DC power supply is connected via a second switching element, and a secondary winding to which a battery pack to be charged is coupled.

U.S. Pat. No. 7,880,433, to Oh, et al., issued Feb. 1, 2011, discloses a charge equalization apparatus, which allows the primary and secondary windings of a transformer to be fabricated. The apparatus controls the flow of charge to batteries depending on the charged states of series-connected batteries, and can prevent overcurrent from flowing into a battery currently being charged.

U.S. Pat. No. 5,254,930, to J. Daly, issued Oct. 19, 1993, discloses a battery charger for charging a plurality of batteries includes a voltage supply connected by a pair of switches to a power converter including a transformer having a primary winding and a plurality of secondary windings. Each secondary winding is coupled to a battery. Voltage is transferred from the voltage supply to the primary winding when the switches are closed and current is transferred from the secondary windings to the batteries when the switches are open. Charge control circuitry monitors the voltage of each battery and the total battery voltage and determines the amount of current to supply to the batteries. Supervisory logic monitors the current received from the secondary windings by each of the batteries and the voltage of each of the batteries to determine the charge status of each battery and the operating status of the power converter.

U.S. Pat. No. 6,664,762, to N. Kutkut, issued Dec. 16, 2003, discloses a battery charger for charging high voltage battery strings, which includes a DC-to-AC converter that drives the primary of a transformer having multiple secondaries. Each secondary winding has a corresponding output stage formed of a rectification circuit, output inductor, and output capacitor. The output terminals of the output stages are connectable either in parallel or series. In either configuration, inductor current and capacitor voltage automatically balance among the output stage circuits. A controller normally regulates output terminal voltage by operating in voltage mode, but limits current by operating in a current mode when the average of inductor currents exceeds a specified limit. Reconfiguration from parallel to series, or vice versa, is obtained physical reconnection of the output stage terminals and adjustment of a single voltage feedback scaling factor. Connecting the output stages in series to produce a high voltage output reduces voltage stresses on the rectification circuits and enables use of Schottky diodes to avoid reverse recovery problems.

U.S. Pat. No. 6,844,703, to S. Canter, issued Jan. 18, 2005, discloses a battery cell balancing system for a battery having a plurality of cells. The system includes a power supply and a plurality of transformer/rectifier circuits electrically coupled to the cells. Preferential charging occurs for a cell with the lowest state of charge. At least one current limiting device is electrically coupled to the transformer/rectifier circuits and the power supply. The current limiting device buffers a source voltage from a reflected voltage of at least one of the plurality of cells.

U.S. Pat. No. 7,939,965, to Oh, et al., issued May 10, 2011, discloses a charge equalization apparatus with series-connected battery cells and, more particularly, to a charge equalization apparatus, in which series-connected battery cells are connected in parallel with the primary windings of transformers, switches for controlling the flow of current of the primary windings are connected in series with the primary windings, and multiple secondary windings corresponding to the primary windings are connected in parallel with each other.

U.S. Pat. No. 4,313,080, to R. Park, issued Jan. 26, 1982, discloses a method for controlling the charging of fast discharge and recharge type propulsion battery components of engine-electric hybrid drive systems for road vehicles, wherein the control objectives are to, minimize discharge of gas through battery cell vents, minimize fuel use, allow employment of a small battery, and provide for long discharge-recharge cycle life.

U.S. Pat. No. 4,839,905, to J. Mantovani, issued Jun. 13, 1989, discloses an automatic amplifying and equalizing circuit for bipolar data signals that has first and second voltage controlled amplifiers controlled by the output of a peak detector. The first amplifier provides even amplification of frequency spectrum components of the data signals while the second amplifier provides amplification of only higher frequency spectrum components of the data signals to compensate for losses of differing length transmission lines. Switches in filtering and frequency dependent circuits provide for operation at several data rates.

United States Patent Application 2006/0125449, to T. Unger, published Jun. 15, 2006, discloses a duty cycle controller apparatus for producing a duty cycle signal for controlling switching of switches of a battery charger having an AC input for receiving power and an output for supplying power to charge a battery in response to switching of the switches, while maintaining a high power factor at the AC input. The duty cycle controller apparatus includes a current command signal generator having a plurality of signal inputs for receiving a plurality of signals representing a plurality of operating conditions of the charger, a plurality of current command outputs and a processor operably configured to generate a plurality of current command signals at the current command outputs in response to respective sets of operating conditions.

United States Patent Application 2011/0049977, to Onnerud et al., published Mar. 3, 2011, discloses an electric vehicle power system including a battery system, a bus configured to transfer power to a motor drive, and a control circuit to selectively couple the battery to the bus. The control circuit is discharges capacitance of the bus to a chassis in response to a disconnect between the battery and the bus. Further, the control circuit measures impedance across the bus. As a result, the control circuit can monitor integrity of the bus and detect a fault, such as a short circuit or degraded bus insulation.

United States Patent Application 2010/0283433, to Oh et al., published Nov. 11, 2010, discloses a charge equalization apparatus for batteries and, more particularly, to a charge equalization apparatus, in which the primary windings of a number of transformers corresponding to the number of battery cells are connected in parallel with each other, a switch for controlling the flow of current of the primary windings of the parallel-connected transformers is connected in series with the parallel-connected primary windings, respective secondary windings corresponding to the primary windings are connected in parallel with the battery cells, and the battery cells are connected in series with each other.

United States Patent Application 2003/0102845, to Aker et al., published Jun. 5, 2003, discloses a charger for high capacity. The charger preferably comprises a rectified AC input of single or preferably three phases, with an optional power factor corrected input, minimally filtered with high frequency, high ripple current capacitors, which is switched with a power switching circuit in the "buck" configuration into an inductor/capacitor output filter. Metallized film capacitors are employed, to minimize the rectified 350 Hertz AC component filtering while providing transient switch protection and ripple current requirements for the buck regulator, to provide a high current fast charger with substantially improved power factor. High power, high frequency switching with minimized output filter size provides a highly filtered DC output. The fast charger is adapted to be constructed in a modular design for simple maintenance.

United States Patent Application 2005/0024015 to Houldsworth et al., published Feb. 3, 2005, discloses a system for managing energy stored in a plurality of series connected energy storage units that has a plurality of energy storage unit controllers, each controller being associated with one of the plurality of energy storage units, a balancing circuit between two of the energy storage units, the balancing circuit being controlled by at least one of the energy storage unit controllers, a serial electrical interface between the energy storage unit controllers for providing voltage isolated bi-directional communication, and a central controller in electrical communication with the energy storage unit controllers.

United States Patent Application 2007/0047100, to Takahashi et al., published Mar. 1, 2007, discloses a backup unit which can insert and pull out its hot line into a switching power supply unit casing and has a secondary battery and its state monitoring/control unit is built in the unit, and proper charge/discharge management of the secondary battery can be made. When the backup unit is unnecessary, a backup unit formed by a plurality of capacitors whose hot lines can be similarly inserted and pulled out can be built in an enclosing space of the backup unit.

U.S. Pat. No. 7,489,048, issued Feb. 10, 2009, to King et al, discloses a battery load leveling system for an electrically powered system in which a battery is subject to intermittent high current loading, the system including a first battery, a second battery, and a load coupled to the batteries. The system includes a passive storage device, a unidirectional conducting apparatus coupled in series electrical circuit with the passive storage device and poled to conduct current from the passive storage device to the load, a series electrical circuit coupled in parallel with the battery such that the passive storage device provides current to the load when the battery terminal voltage is less than voltage on the passive storage device, and a battery switching circuit that connects the first and second batteries in either a lower voltage parallel arrangement or a higher voltage series arrangement.

U.S. Pat. No. 7,425,832, issued Sep. 16, 2008, to Gopal et al, discloses a method and system for measuring impedance and voltage characteristics of individual cells of multi-cell electrochemical devices, for example a battery or a fuel cell stack. The electrochemical system comprises a plurality of cells; a measuring device including a plurality of inputs connected across the plurality of cells to generate voltage and current signals indicative of voltage and current characteristics of the plurality of cells; a current supply/draw means for superimposing modulated current values through the plurality of cells; and a controller for controlling at least one system operating condition based on the voltage and current characteristics received from the measuring device, the controller being connected to the measuring device. The method comprises (a) superimposing modulated current values across a plurality of cells of the electrochemical device; (b) drawing current from the plurality of cells to generate voltage and current signals indicative of voltage and current characteristics of the plurality of cells; and, (c) controlling the at least one system operating condition based on the voltage and current characteristics of the plurality of cells, wherein the at least one system operating condition comprises at least one of temperature, humidity and reactant flow rates, within the electrochemical system.

U.S. Pat. No. 7,315,169, issued Jan. 1, 2008, to Fenske et al, discloses a fault indicator for indicating the occurrence of a fault in an electrical conductor that has a housing, a high capacity battery, at least one light emitting diode (LED) visible from the exterior of the fault indicator upon the occurrence of a fault, which may be automatically reset to a non-fault indicating position a predetermined time after the occurrence of the fault, and electronic circuitry for sensing a fault, for actuating the LEDs to indicate a fault and for resetting the LEDs to a non-fault indicating condition a predetermined time after the fault has occurred. The electronic circuitry conserves energy by drawing insubstantial current from the high capacity battery during non-fault conditions. The electronic circuitry may also include in-rush restraint to avoid false tripping of the fault indicator during surges. An inrush restraint circuit has an output signal that is logically combined with a fault indicator signal to disable the fault indicator during inrush conditions. An improved electrostatic sensor senses the electromagnetic field associated with a monitored conductor, provides less susceptibility to affects from adjacent conductors and provides operating power to the inrush restraint circuitry.

U.S. Pat. No. 6,963,197, issued Nov. 8, 2005, to Feight et al, discloses a fault indicator for indicating the occurrence of a fault in an electrical conductor that is reset at a predetermined time after the fault is detected, such as about 4 hours. The fault indicator has a housing, a high capacity battery, a fault sensor, a display for indicating a fault condition, and a programmable controller with a sleep state that draws low quiescent current. As a result, the battery is expected to last the lifetime of the fault indicator. The fault indicator may optionally include current inrush restraint and/or voltage inrush restraint to inhibit the controller from activating the display to the fault indicating condition during the inrush conditions. The electromagnetic field about the conductor causes an electrostatic sensor to develop a differential voltage signal between two electrodes of different areas for the voltage in rush restraint circuit. Auxiliary contacts are provided to remotely monitor the fault indicator.

U.S. Pat. No. 6,915,220, issued Jul. 5, 2005, to Cardinal et al. discloses an integrated battery monitoring device that includes a pair of input leads for coupling across the terminals of a battery cell to be monitored and a sensor for sensing a desired battery cell parameter. A self-contained power supply has the voltage across the battery cell terminals as an input thereto, the self-contained power supply being configured for providing power to the sensor. A pair of output leads communicates data generated by the sensor.

U.S. Pat. No. 6,844,799, issued Jan. 18, 2005, to Attarian et al, discloses a current sensor and current transformer for monitoring electrical current with a magnetic core having a mixture of magnetic materials to provide a low cost design in a compact configuration with an expanded dynamic range. The mixed material core can be fabricated either from stamped laminations or from coil stock and may include an air gap for activating a magnetic flux sensor. Multiple core configurations are disclosed.

U.S. Pat. No. 6,711,512, issued Mar. 23, 2004, to Noh, discloses a pole transformer load monitoring system using a wireless Internet network. The load monitoring system is capable of measuring, in real time, a variety of load parameters (phase voltages, phase currents and temperatures) of a pole transformer placed on a distribution line. The results of the measurements are transferred to an operator in a branch operating station over the wireless Internet network so as to prevent losses resulting from overloaded and unbalanced states.

U.S. Pat. No. 6,133,724, issued Oct. 17, 2000, to Schweitzer, Jr. et al, discloses a fault indicator contained within a protective equipment closure of the type used to house padmounted components of a power distribution system detects the occurrence of a fault current in a monitored conductor and provides a light indication thereof. The fault indicator includes a circuit monitoring module, having an integral fault indicator flag module, and a remote fault indicator light module. A status-indicating flag is rotatably mounted in the integral fault indicator flag module. The flag is positioned in either a reset indicating position or a fault indicating position by a magnetic pole piece, which is magnetized in one magnetic direction or the other by momentary application of a current in one direction or the other to an actuator winding on the pole piece. A magnetically actuated reed switch in an auxiliary magnetic circuit comprising an auxiliary pole piece magnetized by the actuator winding and a bias magnet magnetically aligned to oppose the reset magnetic orientation and reinforce the trip magnetic orientation of the magnetic pole piece closes upon occurrence of the fault current to connect an internal battery to an LED contained within the remote fault indicator light module so that the LED is visible from the exterior of the protective equipment enclosure. The light indication of the fault occurrence may be reset automatically by a timed reset circuit or manually by a manual reset circuit.

U.S. Pat. No. 6,018,239, issued Jan. 25, 2000, to Berkcan et al, discloses a self-powered axial current sensor for generating a signal which represents current in a power line includes, in one embodiment, a housing having a bus bar opening of substantially rectangular shape extending longitudinally therethrough. The housing also includes current sensor core retaining walls which define a current sensor region, and a cover base wall which defines, with one of the retaining walls, a power core region. A current sensor core and coil are located in the current sensor region and are positioned proximate the bus bar opening. The current sensor core and coil also are substantially symmetrical with respect to the center axis of the bus bar opening. The current sensor further includes a power core and a power coil located in the power core region and positioned substantially symmetrically with respect to the center axis of bus bar opening.

U.S. Pat. No. 6,002,260, issued Dec. 14, 1999, to Lau et al, discloses a fault sensor suitable for use in a heterogeneous power distribution system that executes a stored program and causes sufficient information to be collected to distinguish a source of fault current as being from a public utility portion of the power distribution network or from a distributed generator. Short circuit current and magnetizing current are distinguished based on differences in VI "signatures." In addition, the fault sensor periodically senses a condition of a battery of the fault sensor. When the condition of the battery indicates the battery power is low, the fault sensor sends a digital data signal including a low battery indication to a remote location. Subsequent to occurrence of a sustained power outage, the sensor detects that power has been restored and sends to a remote location a digital data signal including an indication that power has been restored. The sensor periodically measures peak line voltage and peak line current and reports peak values to the remote location.

U.S. Pat. No. 5,969,625, issued Oct. 19, 1999, to Russo, discloses the method and the apparatus for detecting a deteriorating condition in a bank of standby batteries includes injecting an audio frequency current into one of the battery buses or cables, detecting an audio frequency current signal, matched to the injected audio frequency current signal, that is carried by the battery bus and detecting a voltage drop, at the audio frequency, across the bank of standby batteries. In one embodiment, current transformers are utilized in connection with an oscillator (to inject the AF current signal) and detection circuits (comparators and operational amplifiers) are utilized to generate a representative current signal and a representative voltage signal. The device detects when the standby batteries are operating in a normal, stable condition, that is, when the bank is neither being recharged nor is discharging DC power to the load. During normal, stable operating conditions, a differential relationship is established between the representative voltage and representative current signals. In one embodiment, a microprocessor-based system monitors the float voltage of the battery in order to ascertain when the battery system is in a normal, stable operating condition. The microprocessor also initially establishes the differential between the representative voltage and the representative current signals. The method includes determining when the differential relationship between the voltage and current signals exceeds a predetermined value and issues an alarm signal at that time. The alarm signal may be deferred until the differential relationship exceeds the predetermined value for a predetermined period of time. In one embodiment, this analysis is conducted in the microprocessor-based system.

U.S. Pat. No. 5,659,237, issued Aug. 19, 1997, to Divan et al, discloses a technique for charge equalization of a series connected string of battery cells. The secondary windings of a transformer having a single primary winding and multiple secondary windings are connected across each battery cell to be equalized. A single power converter applies a charging signal to the primary of the transformer, inducing a charging current in each secondary which is inversely related to the charge on the battery cells to be equalized. The transformer is preferably implemented as a coaxial winding transformer having low secondary-to-secondary winding coupling. The power converter is preferably implemented as a forward converter supplied with DC power from an adjustable DC power source. A source voltage provided by the DC source may preferably be adjusted during the course of charge equalization to preferentially direct charge to weaker cells. The charge equalization system may be used in combination with a bulk charging system to provide for both rapid charging of a battery string as well as equalization of the battery cells within the string.

U.S. Pat. No. 5,254,930, issued Oct. 19, 1993, to Daly, discloses a battery charger for charging a plurality of batteries that includes a voltage supply connected by a pair of switches to a power converter including a transformer having a primary winding and a plurality of secondary windings. Each secondary winding is coupled to a battery. Voltage is transferred from the voltage supply to the primary winding when the switches are closed and current is transferred from the secondary windings to the batteries when the switches are open. Charge control circuitry monitors the voltage of each battery and the total battery voltage and determines the amount of current to supply to the batteries. Supervisory logic monitors the current received from the secondary windings by each of the batteries and the voltage of each of the batteries to determine the charge status of each battery and the operating status of the power converter. If one battery continues drawing a greater proportion of the maximum current relative to the remaining batteries after the predetermined voltage limit has been reached, this indicates that there is a short circuited cell causing one battery to draw a greater proportion of current or that there is a cell with high impedance causing one battery to draw a smaller proportion of current. For both fault conditions, the supervisory circuit detects the current imbalance and generates a shutdown signal. The shutdown signal is also asserted when the supervisory circuit detects an over voltage condition in any of the batteries, or an over current in the primary winding. The shutdown signal subsequently precludes further operation of the charge control circuit for a predetermined time period, alerting the system operator of a problem within the battery backup system.

U.S. Pat. No. 7,081,737, issued Jul. 25, 2006, to Liu et al, discloses a monitoring circuit for monitoring a voltage level from each of a plurality of battery cells of a battery pack includes an analog to digital converter (ADC) and a processor. The ADC is configured to accept an analog voltage signal from each of the plurality of battery cells and convert each analog voltage signal to a digital signal representative of an accurate voltage level of each battery cell. The processor receives such signals and provides a safety alert signal based on at least one of the signals. The ADC resolution may be adjustable. A balancing circuit provides a balancing signal if at least two of the digital signals indicate a voltage difference between two cells is greater than a battery cell balance threshold. An electronic device including such monitoring and balancing circuits is also provided.

U.S. Pat. No. 6,983,212, issued Jan. 3, 2006, to Burns, discloses a battery management system for control of individual cells in a battery string. The battery management system includes a charger, a voltmeter, a selection circuit and a microprocessor. Under control of the microprocessor, the selection circuit connects each cell of the battery string to the charger and voltmeter. Information relating to battery performance is recorded and analyzed. The analysis depends upon the conditions under which the battery is operating. By monitoring the battery performance under different conditions, problems with individual cells can be determined and corrected.

U.S. Pat. No. 6,844,703, issued Jan. 18, 2005, to Canter, discloses a battery cell balancing system for a battery having a plurality of cells. The system includes a power supply and a plurality of transformer/rectifier circuits electrically coupled to the cells. Preferential charging occurs for a cell with the lowest state of charge. At least one current limiting device is electrically coupled to the transformer/rectifier circuits and the power supply. The current limiting device buffers a source voltage from a reflected voltage of at least one of the plurality of cells.

U.S. Pat. No. 6,583,603, issued Jun. 24, 2003, to Baldwin, discloses an apparatus and method for controllably charging and discharging individual battery cells or groups of battery cells in a string of batteries employed as a back-up power supply. The apparatus includes battery supply modules for at least partially isolating battery strings from the load bus and primary power supply. The partial isolation is effected by a switching network including two controlled switches arranged in parallel to selectively isolate the string of batteries. In certain disclosed embodiments, one of the controlled switches is turned on to connect the string of batteries to the load bus until the other controlled switch closes. The system includes a main power supply that supplies a power bus to a regulator in each battery supply module, which is used for charging the battery string, and a discharge bus to each battery supply module for discharging the batteries.

U.S. Pat. No. 5,982,143, issued Nov. 9, 1999, to Stuart, discloses an electronic battery equalization circuit that equalizes the voltages of a plurality of series connected batteries in a battery pack. The current waveform is in the shape of a ramp for providing zero current switching. The transformer has a primary winding circuit and at least one secondary winding circuit. In one embodiment, each secondary winding circuit is connected to a different pair of batteries. The equalizing current is provided to the lowest voltage batteries in one-half of the battery pack during one-half of the charging cycle. The equalizing current is then provided to the lowest voltage batteries in the other half of the battery pack during the other half of the charging cycle. In another embodiment, each secondary winding circuit is connected to a different single battery. The equalizing current is supplied to a lowest voltage battery in the battery pack during each half of the switching cycle. The electronic battery equalization circuit also includes a feedback control circuit coupled to the primary winding circuit for controlling the current from the equalizing current supply source. In another embodiment, optically coupled switches are connected to a battery voltage monitor to provide equalizing current to the lowest voltage even and odd numbered battery in the battery pack.

U.S. Pat. No. 5,923,148 issued Jul. 13, 1999, to Sideris et al, discloses an on-line battery monitoring system for monitoring a plurality of battery cells identifies and computes individual cell and battery bank operating parameters. The system comprises a controller for designating a given battery cell to be monitored, a multiplexer responsive to designation by the controller for selecting a given battery cell to be monitored or for selecting a battery pack to be monitored, an analog board for receiving electrical signals from a given battery cell for providing an output representing measurement of a parameter (voltage, temperature, and the like) of the given battery cell, a voltage sensor circuit for sensing voltage appearing across positive and negative terminals of the battery pack, and a control board responsive to address information for selectively initiating a load test, battery bank charging, or common-mode voltage measurement.

U.S. Pat. No. 5,666,040, issued Sep. 9, 1997 to Bourbeau, discloses a safe, low-cost battery monitor and control system. Electronic modules are connected to the terminals of respective batteries that make up a series string. Each module produces a go/no-go signal for each of four battery conditions: over-voltage, under-voltage, over-temperature and float-voltage, which are read by a network controller connected to each module via a single three-wire local area network. Based on the information received, the controller can adjust the charging current to the string, terminate the charge cycle, limit the current drawn from the string when in use, or disconnect the string from the system it is powering. The controller can record a history of the charge and discharge activity of each battery, so that the weakest batteries can be identified and replaced instead of scrapping the entire string. The system controls the charging current delivered to each battery during a charge cycle to insure that each battery is neither overcharged nor undercharged, by connecting a bypass circuit across the battery's terminals to reduce the charging current when an over-voltage condition is detected, or by reducing charge current to the string. A battery's voltage measurement is temperature compensated so that it can be accurately compared to temperature dependant limits. The addressable switch is bidirectional, so that the controller can, for example, force bypass resistors to be connected across selected batteries in order to heat up the batteries in a cold environment.

US Patent Publication 2007/0279003, published on Dec. 6, 2007, to Altemose et al, discloses a system for balancing charge between a plurality of storage battery cells within a storage battery. The battery balancing system sense changes, possibly caused by environmental influences, in the overall resonant frequency of charge balancing circuits contained within the battery balancing system. Using a phase locked loop based controller, the battery balancing system compensates for the change in resonant frequency by driving the battery balancing circuits at a frequency that matches the actual sensed resonant frequency of the battery balancing circuits.

An article by Kong Zhi-Guo et al, is entitled "Comparison and Evaluation of Charge Equalization Technique for Series Connected Batteries". Power Electronics Specialists Conference, 2006. PESC '06. 37$^{th}$ IEEE 18-22 Jun. 2006, pp. 1-6.

An article by Jim Williams and Mark Thoren is entitled "Novel measurements circuit eases battery-stack-cell design", EDN, Jan. 10, 2008, p. 47.

An article by N. H. Kutkut et al, is entitled "Charge equalization for series connected battery strings", industry Applications, IEEE Transactions on Volume 31, Issue 3, May-June 1995 pp. 562-568.

The above approaches do not solve the aforementioned problems. According to the inventor, it would be desirable to provide a cell charge balancing system with minimal complexity, and provides electrical isolation for each cell. It would be desirable to keep the cost, number of connections, and weight to a minimum. Those of skill in the art will appreciate the present innovation that addresses the above and other problems.

SUMMARY

An object of the present innovation is to provide an improved battery system which is operable for balancing individual cells and/or groups of battery cells.

Another possible object of the present innovation is to provide lightweight circuitry with minimal connections for a battery system for balancing individual cells and/or groups of battery cells.

Yet another possible object of the present innovation is to provide a safer battery system with inherent galvanic isolation, which is operable for balancing individual cells and/or banks of battery cells.

These and other objects, features, and advantages of the present innovation will become apparent from the drawings, the descriptions given herein, and the appended claims. However, it may be understood that the above-listed objectives and/or advantages of the innovation are intended only as an aid in quickly understanding aspects of the innovation, are not intended to limit the innovation in any way, and therefore do not form a comprehensive or restrictive list of objectives, and/or features, and/or advantages.

Accordingly, the present innovation comprises a charge balancing method for use with a plurality of battery cells electrically connected together for balancing a charge state of a selected particular battery cell or a selected particular group of battery cells from the plurality of battery cells. The method comprises steps such as providing a plurality of transformers operatively connected to the battery cells, simultaneously applying a plurality of waveforms to the transformers, and selectively varying the waveforms for selectively balancing the charge state of the particular battery cell or the particular group of battery cells from the plurality of battery cells. The waveforms may be identical and/or inverted, and/or otherwise varied with respect to each other.

The method may comprise connecting a different group of series connected secondary windings to each of the particular battery cells or each particular bank of battery cells.

The method may comprise providing that within each group of series connected secondary windings, each secondary winding is part of a different transformer.

The method comprises utilizing the series connected secondary windings to produce a weighted voltage for selectively balancing the charge state of the particular battery cell or the particular group of battery cells from the plurality of battery cells.

The method may typically comprise providing a plurality of transformers that are significantly fewer in number than the plurality of battery cells.

In one possible embodiment, the step of simultaneously applying a plurality of waveforms comprises utilizing a plurality of substantially identical waveforms which are selectively either inverted or non-inverted with respect to each other.

In another embodiment, an apparatus is provided that is operable for balancing the charge state of a selected particular battery cell or a selected particular group of battery cells. The apparatus may comprise components such as a plurality of transformers with a plurality of output windings operatively connected to the plurality of battery cells.

A transformer drive is operably connected to the input windings. The transformer drive is configured to simultaneously apply a plurality of waveforms to the input windings. The transformer drive is operable to selectively vary the plurality of waveforms with respect to each other whereby the apparatus is operable for selectively balancing the charge state of the particular battery cell or the particular group of battery cells from the plurality of battery cells.

The apparatus comprises series connected output windings that produce a plurality of weighted sums of voltages in response to the waveforms. The weighted sums of voltages are selectively variable for selectively balancing the charge state of the particular battery cell or the particular group of battery cells.

As one possible example, the plurality of output windings may comprise a first group of output windings connected in series to a first particular battery cell or a first particular group of battery cells and a second group of output windings, connected in series to a second particular battery cell or a second particular group of battery cells. In this embodiment each of the first group of output windings are from different transformers and each of the second group of output windings are from different transformers. For example, the first group may comprise an output winding from first and second transformers, and the second group may comprise output windings from the first and second transformers. The first group may or may not comprise an output winding from a third transformer.

In another embodiment, the apparatus may comprise a plurality of transformers operatively connected to the plurality of battery cells, a transformer drive operatively connected to the transformers and being operable for simultaneously applying a plurality of waveforms to the transformers, and a controller operable to control the transformer drive to selectively vary the waveforms for selectively balancing the charge state of the particular battery cell or the particular group of battery cells.

The transformers may comprise a plurality of secondary windings wherein the secondary windings are organized to provide a different plurality of series connected secondary windings operatively connected to each particular battery cell or each of the particular group of battery cells.

The apparatus may be comprised such that each of group of series connected secondary windings is part of a different transformer.

The series connected secondary windings produce a weighted voltage for each particular battery cell or each particular group of battery cells.

In one possible embodiment, the transformer driver is operable producing substantially identical waveforms, which are selectively either inverted or non-inverted with respect to each other. In another embodiment, the transformer driver is operable for producing waveforms which are variable in amplitude with respect to each other.

BRIEF DESCRIPTION OF THE DRAWINGS

FIG. 1 is an electronic schematic diagram of a battery cell array layout in accord with one possible embodiment of the present innovation;

FIG. 2 is a block diagram for battery system in accord with one possible embodiment of the present innovation;

FIG. 7A is a pulse diagram example of selected measurement points in the 2×2 battery cell array of FIG. 6 during sixteen possible battery cell measurement steps that measure the individual voltages of the 2×2 battery cell array in accord with one possible embodiment of the innovation;

FIG. 29 is a graph which utilizes the polarity of two voltages to provide the ability to determine which of eight strings of battery cells in FIG. 28 has a fault in accord with one possible embodiment of the present innovation.

DETAILED DESCRIPTION OF PREFERRED EMBODIMENTS

The present innovation may be used to monitor individual battery cell voltages and/or groups of battery cells. Battery cell voltages may be monitored to detect cells that are not producing as much current and/or which have excessive voltage drop due to reduced charge and/or poor cell health.

In one possible embodiment, a relatively small number of transformers are utilized for many cells and/or cell banks charged. In one possible embodiment, the present innovation utilizes weighted sums of waveforms to perform cell and/or cell bank selection.

The present innovation allows for low component cost by reducing hard-to-integrate magnetic components. The battery cells are isolated by the transformer connections to improve safety. The cell equalization used in the present innovation by adding charge to cells and/or cell banks speeds overall charging process.

The innovation takes advantage that normally only a few cells need equalization at a time. The purpose of one embodiment of this innovation is to perform charge equalization on high voltage battery systems by selectively charging individual cells and/or cell banks. This embodiment of the innovation may be utilized to complement existing high voltage battery chargers and battery instrumentation systems and can operate at the same time as a main charger.

Figure 30:
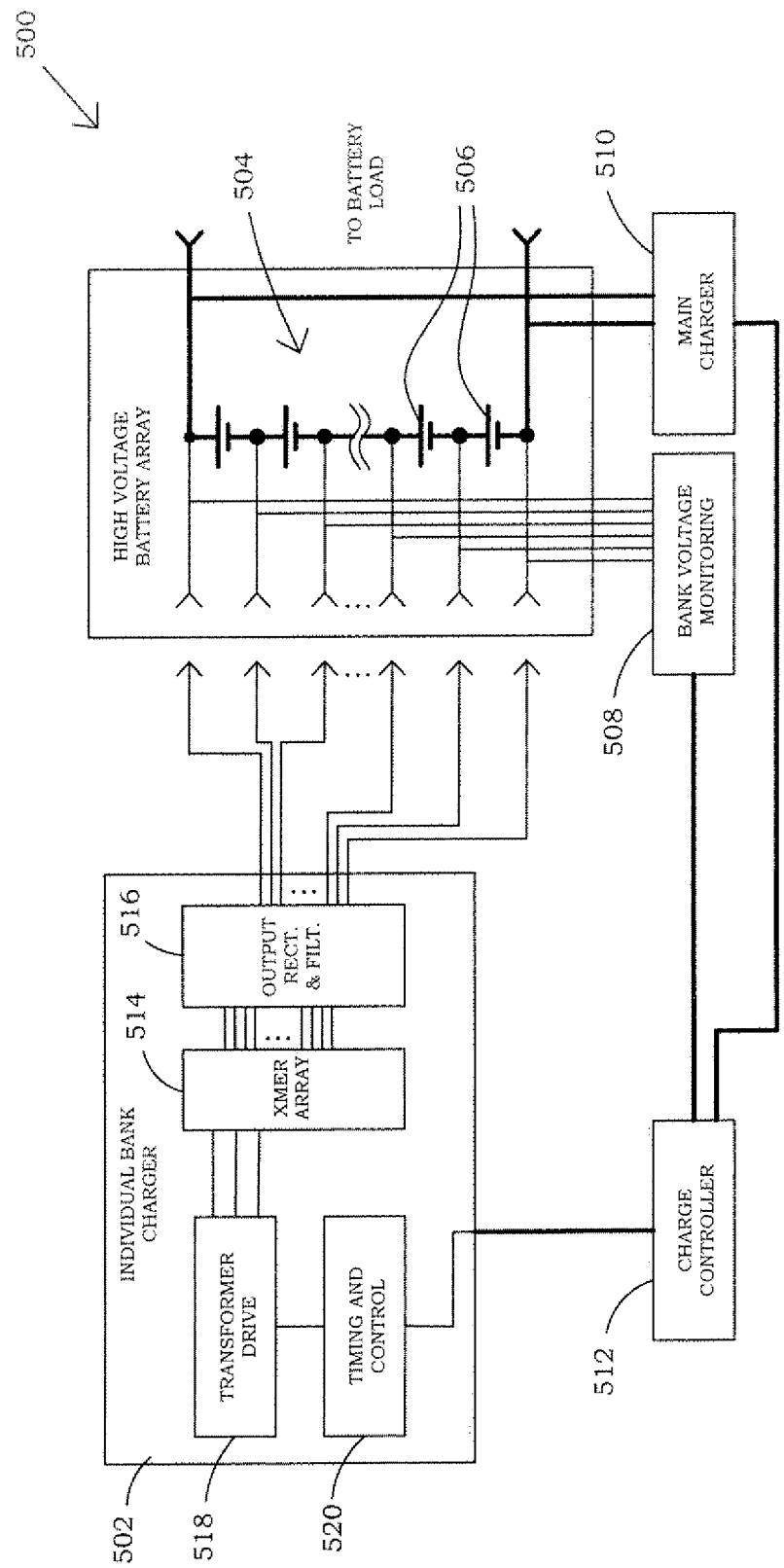
FIG. 30 is a block diagram schematic of a charging system which is operable to provide overall battery charge and also balance the charge of selected individual cells or groups of cells in accord with one possible embodiment of the present innovation.

As an example of one possible embodiment, an individual cell charger forms part of a larger battery charge system 500 as shown in the block diagram of FIG. 30, wherein selectable charging of individual cells or banks of cells is made utilizing individual charger 502.

Battery array 504, shown in darkened lines, comprises a plurality of cells or groups of cells 506, which are shown here as being connected in series. It may be understood that cells 506 represented in the drawings may comprise either a single cell or a group or bank of cells connected in series and/or in parallel. As well, when discussing an individual battery cell either in this specification or in the claims, it will be understood that the discussion may also apply to a bank or group of cells and visa versa. Thus, a treatment of a battery cell also refers a treatment of a group or bank of battery cells and a group or bank of cells may also refer to treatment of a single cell.

Many possible variations of battery cell arrangements are shown and discussed hereinafter with respect to other embodiments of the innovation, but it may be understood that the innovation is not limited to any particular arrangement or matrix of battery cells.

Main charger 510 may be utilized to apply charge to battery 504 for application to all cells. Voltage monitoring device 508 may be utilized to determine cells and/or groups or banks of cells, which need to be balanced. Voltage monitoring device 508 may be similar to voltage monitoring devices discussed hereinafter or may be of other types, as desired. Charge controller 512 may be utilized to control the overall charge of battery 504 by controlling main charger 510 and also individual charger 502.

Individual charger 502 may comprise transformer array 514 connected to the battery array 504 through rectification and filtering circuits 516. Transformer array 514 is connected to a drive circuit 518 and a timing and control circuit 520 that allow individual battery cells or cell banks to be charged.

Timing and control 520 circuit connects to charge controller 512 that uses battery instrumentation to determine which battery cell and/or bank to charge.

An advantage of this embodiment of the present innovation is that individual charger 502 can charge an individual cell or cell bank at the same time that the main battery charger is charging the high voltage battery, if desired.

The fact that the battery cells 506 are at a non-zero voltage, and that they are typically all at similar voltages can be used in charging of individual cells and/or cell banks. Accordingly, a set of transformers in accord with one embodiment utilize series interconnected secondary windings to make weighted sums of the voltages on the primaries. The principle of operation is described in connection with the transformers 550, 552, 554 shown in FIG. 31A and FIG. 31B.

It may be understood that the primary winding may also be referred to herein as an input winding, which receives input waveforms. Likewise, the secondary winding may be referred to as the output winding and produces an output that is summed with other series connected secondary windings for application to particular cells.

The voltage on the secondary of a transformer is proportional to the voltage on the primary and the secondary to primary turns ratio. Notice that in this embodiment of the innovation the winding sense (direction) is relevant, and that if the secondary winding is wound in the opposite direction from the primary (or connected with the outputs reversed), the number of secondary turns should be considered to be a negative number.

$$Vs=Vp*ns/np, \quad \quad 1)$$

where Vs is the voltage on the secondary winding and Vp is the voltage the primary winding.

It is possible to combine the outputs of several transformers by connecting the secondaries in series so that the secondary voltages add up in a weighted sum (Vws).

$$Vws=Vpa*nsa/npa\ Vpb*nsb/npb, \quad \quad 2)$$

where Vpa is the voltage of primary winding of transformer a, and Vpb is the voltage of the primary winding of transformer b. Any number of transformers could be used here. The term npa is the number of turns of the primary winding of transformer a and nsa is the number of turns of the secondary winding of transformer a. Likewise, npb is the number of turns of the primary winding of transformer b and nsa is the number of turns of the secondary winding of transformer b.

Note that these equations hold true for instantaneous voltage, given that the transformers are not driven into saturation. These equations are true for AC waveforms provided that phase is taken into account.

A transformer can easily have more than one secondary winding, and each of the secondary windings may have a different number of turns. This creates several weighted sums. For example, take the case where transformer a and transformer b each have four secondary windings. Each of the four secondary windings of transformer a is series connected with a corresponding secondary winding in transformer b. Assume further that all secondary windings are wound in the same direction. Then there would be four weighted sums of voltage:

$$Vws1=Vpa*nsa1/npa\ Vpb*nsb1/npb$$

$$Vws2=Vpa*nsa2/npa\ Vpb*nsb2/npb$$

$$Vws3=Vpa*nsa3/npa\ Vpb*nsb3/npb$$

$$Vws4=Vpa*nsa4/npa\ Vpb*nsb4/npb, \quad \quad 3)$$

where nsa1 is the number of turns on the first secondary winding of transformer a, nsb1 is the number turns of the first secondary winding on transformer b, where these two secondary windings are connected in series. Vws1 is then the weighted sum of voltages for this first pair of secondaries. The same notation applies for each of the four series connected pair of secondaries.

Note that these equations hold true for AC voltages (measured in RMS, peak or peak-to-peak) or instantaneous voltage, given that the transformers are not driven into saturation in this embodiment. However, for many other embodiments of the innovation discussed hereinafter, transformers are driven into saturation.

If a diode is placed in series between a voltage source (Vs) and a battery with a certain voltage on it (Vbat) with the diode oriented to only allow current to flow into the battery, such current will only flow if the potential of the voltage source is higher than the combination of the battery voltage and diode drop.

$$Vs<=Vbat+Vdiode\ \text{No current, no charge.}$$

$$Vs>Vbat+Vdiode\ \text{Current flows and battery cell gets charged.} \quad \quad 4)$$

Because transformers involve AC voltage, another way to express this is in terms of AC peak voltage as follows:

$$Vac\text{peak}<=Vbat+Vdiode\ \text{No current, no charge.}$$

$$Vps>Vbat+Vdiode\ \text{Current flows and battery cell gets charged.}$$

If a set of transformers are connected to a set of batteries through diodes, it is possible to drive the transformers with primary voltage levels such that only one of the batteries will receive charge current. Other sets of primary voltage levels will result in other batteries receiving charge current.

Figure 31A:
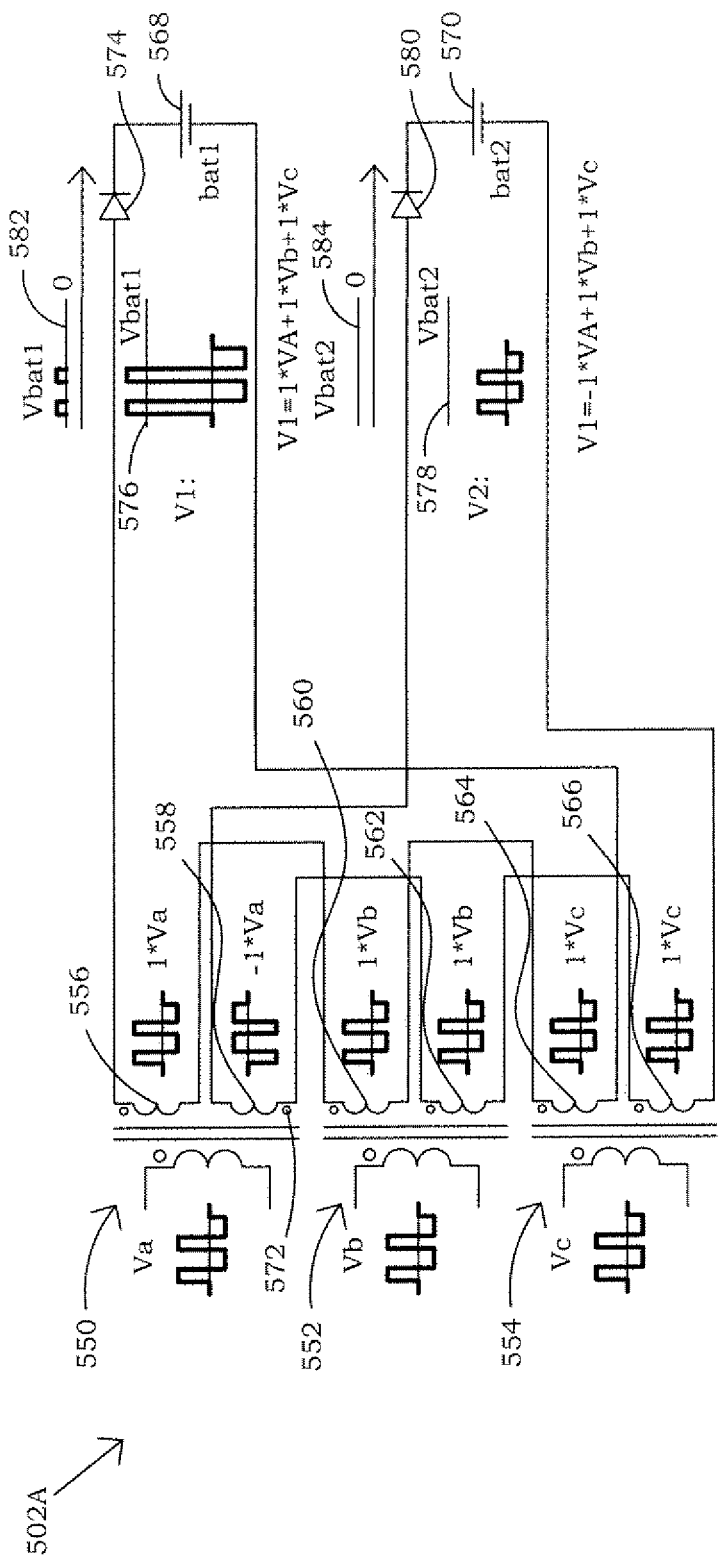
FIG. 31A is a circuit diagram simplified schematic which shows principles of operation for selecting and charging a first battery cell or group of cells in accord with one possible embodiment of the present innovation.
Figure 31B:
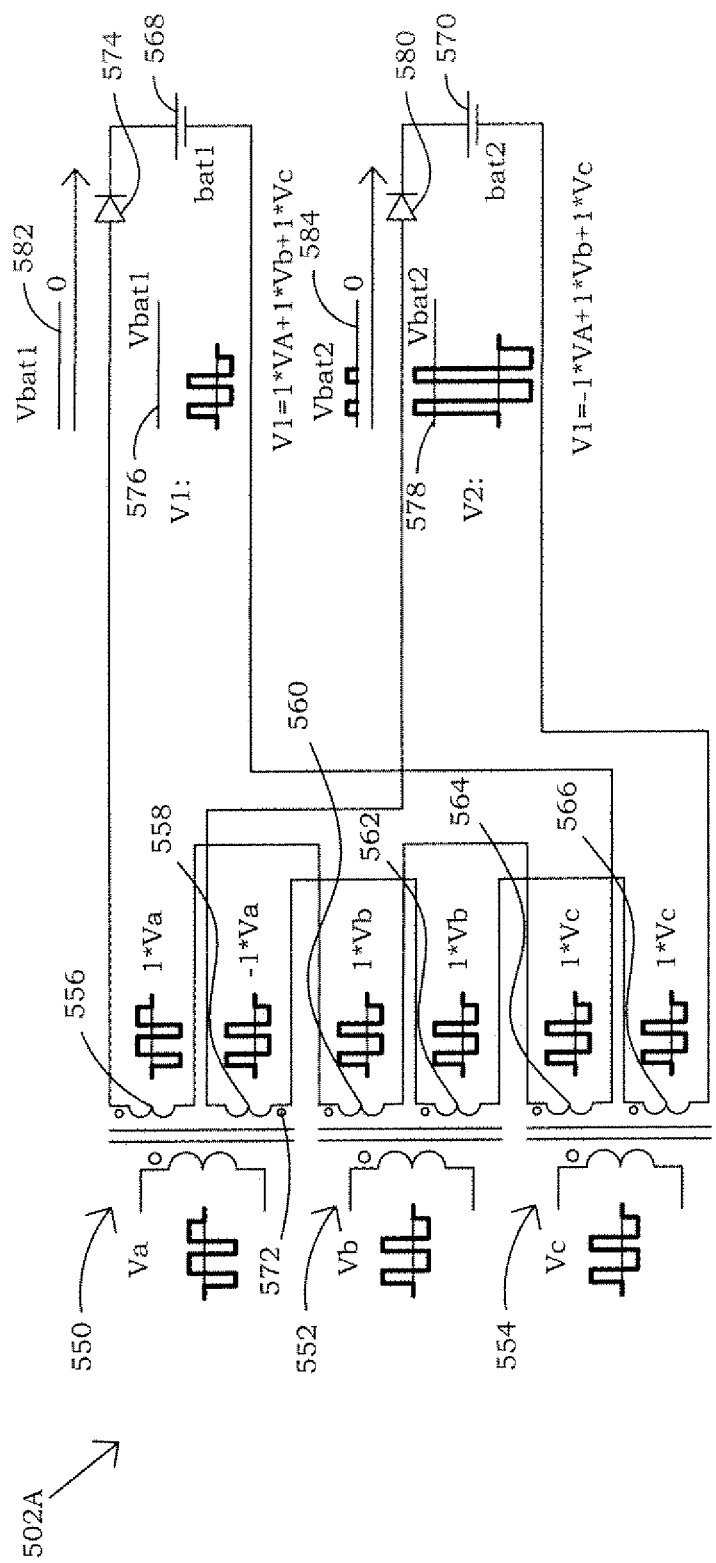
FIG. 31B is the circuit diagram schematic of FIG. 31B which shows principles of operation for selecting and charging a second battery cell or group of cells in accord with one possible embodiment of the present innovation.

A simplified example of selectively charging a particular battery cell using the above discussed principles is shown in FIG. 31A and FIG. 31B, where three transformers 550, 552, and 554 are utilized to form one possible embodiment of individual charger 502. The three transformers have two secondary windings each, namely, windings 556, 558, 560, 562, 564, and 566. In the example of FIG. 31A and FIG. 31B, it will be seen that secondary windings 556, 560, and 564 are connected in series with battery cell or bank 568 and that secondary windings 558, 562, and 566 are connected in series with battery cell or bank 570. In this embodiment, the same number of windings is used in each secondary winding and each primary winding. It will also be seen that winding 558 is wound in the opposite direction as indicated by winding direction notation mark 572. The reversed winding results in a negative sum for the sum of voltages, as discussed above.

Figure 32:
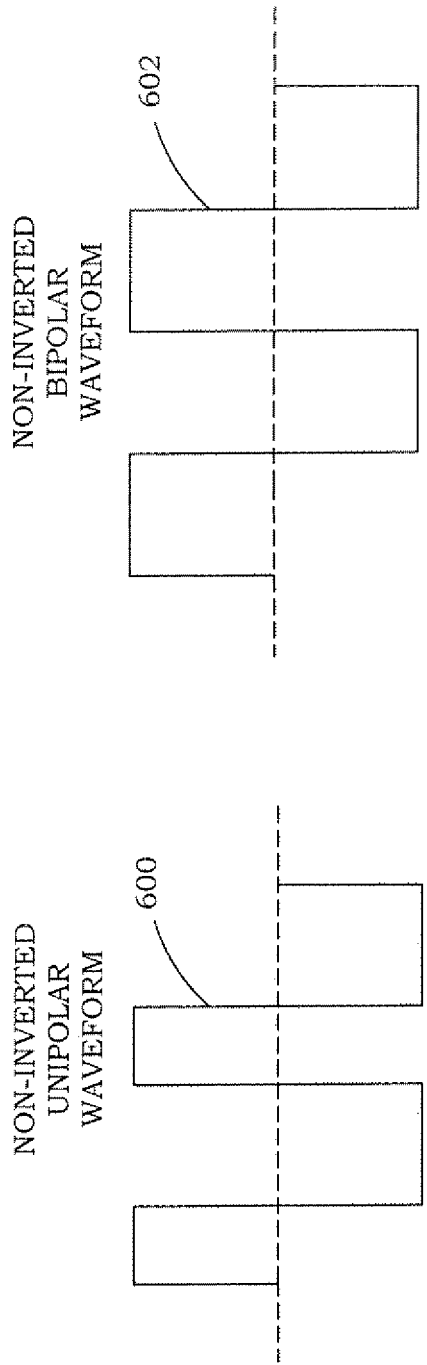
FIG. 32 is a waveform diagram showing positive or non-inverted unipolar and bipolar waveforms in accord with one possible embodiment of the present innovation.

FIG. 32 shows what may be referred to herein as unipolar waveform 600, which is used for plurality of waveforms Va, Vb, and Vc of FIG. 31A and FIG. 31B either in the non-inverted form or inverted form. In FIG. 31A, Va, Vb, and Vc are non-inverted. In FIG. 31B, only Va is inverted. FIG. 32 also shows what may referred to herein as a positive bipolar waveform 602, which may also be inverted or non-inverted. However, the present innovation is not limited to the unipolar and bipolar waveforms, which are used in this particular embodiment as a convenience. The concept of changing input waveforms to selectively charge particular cells can be implemented with many different waveforms.

In the example of FIG. 31A, the same non-inverted bipolar voltage waveform input Va, Vb, and Vc is simultaneously applied to the primary of each transformer 550, 552, and 554.

The waveforms then show how individual charger 502A selects and charge battery cell 568.

The resulting weighted sum of voltages V1 applied to battery 568 is:

V1=1*Va+1*Vb+1*Vc, where in this case V1 is greater than the battery voltage and diode 574 drop so as to be greater than voltage threshold 576. Accordingly, the input waveforms Va, Vb, and Vc when combined have sufficient amplitude to produce current 582, which is pulsed power applied to battery cell 568.

On the other hand, because secondary 558 is wound differently to result in a negative number as explained above, the voltage V2 is not sufficient to apply charge battery 570 because threshold 578 is not reached:

$$V2=-1*Va+1*Vb+1*Vc.$$

Accordingly, voltage/power 584 supplied to cell 570 remains at zero, and battery cell 570 is not charged or affected by the charging of cell 568.

FIG. 31B shows how changing input unipolar waveforms Va, Vb, and Vc changes the weighted sums to thereby select battery cell 570 for charging without affecting battery cell 568. In the example of FIG. 31B, because input waveform Va is inverted as compared to the example of FIG. 31A, V1 is no longer able to go over threshold 576, which is the voltage of battery 568 and the voltage drop of diode 574. Accordingly, the current 584 applied to battery 568 is zero On the other hand, the reversed polarity 572 of secondary winding 558 now inverts waveform Va causing V2 to be increased in peak voltage to go over threshold 578, producing voltage/current pulses 584, which are used to charge battery cell 570.

Accordingly, in the example of FIG. 31A and FIG. 31B, a plurality of unipolar waveforms are simultaneously applied as inputs to the primary or input windings of the plurality of transformers 550, 552, and 554. In this case, by using either a positive or negative unipolar waveform Va, the particular battery cell or bank of cells 568 or 570, can be selected for charging by altering the sum of voltages of interconnected output windings or secondary windings.

While the example of FIG. 31A and FIG. 31B only involves two battery cells for convenience of explanation, individual particular battery cells or banks or groups of battery cells can be selected from large numbers of battery cells. For example, Table 6 below shows that using only seven transformers, each having 320 secondary windings, the present innovation can be utilized to select between 560 battery cells or cell banks or groups of cells.

Figure 37:
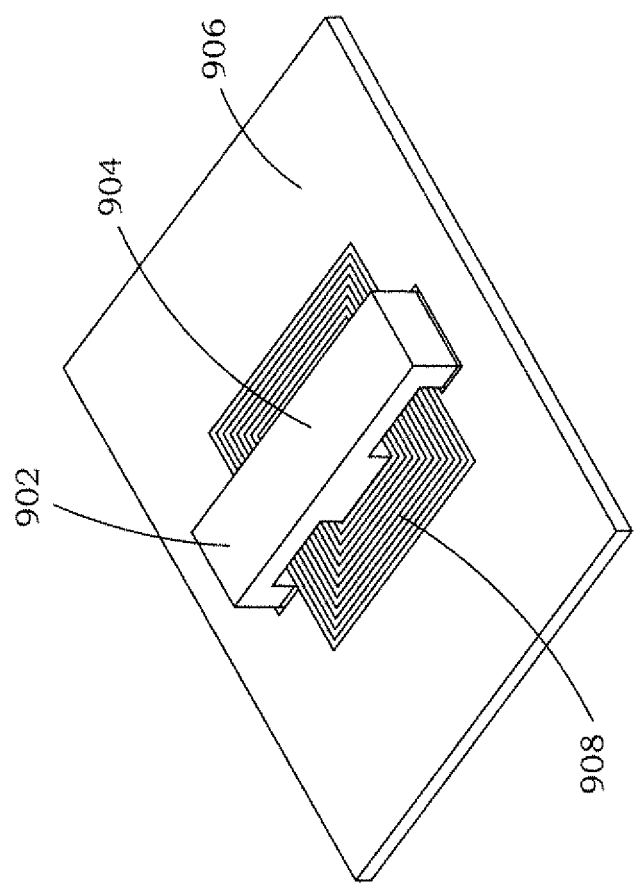
FIG. 37 is a perspective view of a planar transformer with printed wiring board for the windings in accord with one possible embodiment of the present innovation.

As discussed hereinafter with respect to FIG. 37, transformers can be easily and inexpensively produced with almost any number of secondary windings to implement this embodiment of the present innovation.

Referring again to FIG. 32, when using positive or non-inverted unipolar drive waveforms, the transformers are driven with waveforms that have a greater voltage magnitude in the positive direction than the negative. Both unipolar waveform 600 and bipolar waveform 602 conveniently may, if desired, have a zero DC component. In one embodiment, in order to maintain a zero DC component for unipolar waveform 600, the duration of the negative part of the waveform is longer than the duration of the positive part. In the bipolar method, the transformers are driven with a symmetric waveform.

Accordingly, in one embodiment, a transformer array, such as transformers 550, 552, 554 from FIG. 31A and FIG. 31B is utilized to generate a waveform for each cell that is a weighted sum of the pulses from the transformer drive section. The array provides electrical isolation and also performs the selection function whereby a particular cell or group of cells may be charged as desired.

In one embodiment, the transformer array comprises a desired number of transformers, each preferably (but not necessarily) with a single primary winding connected to the transformer drive circuit. Each transformer has a number of secondary windings that connect to the rectification and filtering circuit. The secondary winding from several transformers are connected in series so that the voltage across the secondaries add up to form a weighted sum of the voltages on the primaries. The weighted sum of voltages for each possible variation of the plurality of applied plurality of waveforms can be represented in tabular form as well as by a schematic diagram.

While transformer windings can be made to use ratios of integers (e.g. ⅔ or 5/7) in the weighted sums, using weights of 0, +1 or −1 makes transformer fabrication relatively easy.

One possible family of configurations of the present innovation are what may be referred to herein as binary configurations. In these, each battery cell connects to one winding on each transformer. In other words, as in the example of FIG. 31A and FIG. 31B, each cell is connected to one secondary winding on each of the three transformers. In a binary configuration, all the windings have the same number of turns but are wound with different polarities. The polarities are organized in a binary pattern. This means that with unipolar waveform drive, n transformers can control $2^n$ cell banks, and with bipolar waveform drive n+1 transformers can control $2^n$ cell banks.

Figure 33:
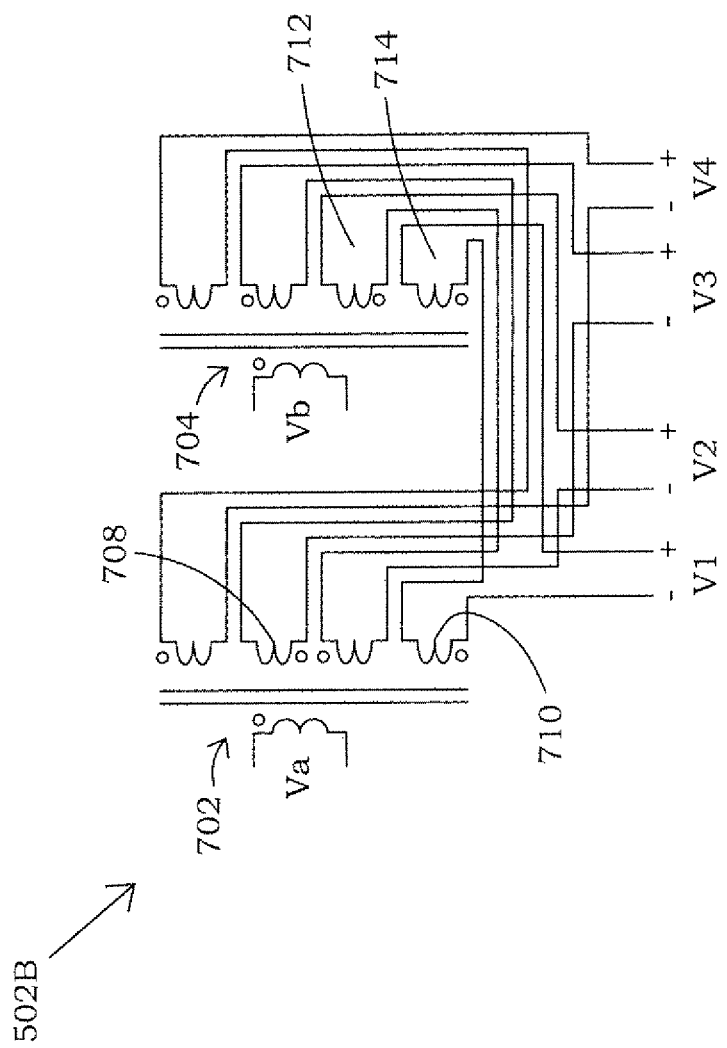
FIG. 33 is a simplified circuit diagram showing a two transformer binary configuration operable to selectively charge up to four battery cells or groups of cells in accord with one possible embodiment of the present innovation.

FIG. 33 shows a simplified two transformer binary configuration for individual charger 502B, with transformers 702 and 704 being utilized to drive four battery cells (not shown) with weighted voltages V1, V2, V3, and V4. It will be seen in FIG. 33 that the polarity of secondary windings 708, 710, 712, and 714 is reversed with respect to the other secondary windings. Two of the reversed secondary windings, namely 710 and 714, are connected in series to produce V1. The amplitude of Va and Vb is selected so that a positive sum of both voltages will result in charge being applied.

Referring to the matrix Table 1 below, V1 will be the sum of two negative voltages, when input waveforms Va and Vb are positive (non-inverted) unipolar signals. Assuming the threshold of the battery cell voltage and diode drop voltage is a positive voltage that must be reached to supply power, then for the situation where Va and Vb are positive (non-inverted) the battery cell associated with V1 will not be selected.

TABLE 1

Transformer Matrix

|    | Va | Vb |
|----|----|----|
| V1 | −1 | −1 |
| V2 | 1  | −1 |
| V3 | −1 | 1  |
| V4 | 1  | 1  |

On the other hand, referring to Table 1, and FIG. 33, if the waveforms Va and Vb applied simultaneously to 702 and 704 are positive (non-inverted), then V4 will be the sum of two positive voltages, and will be greater than the threshold, assuming Va and Vb have the appropriate amplitude, resulting in charging of the cell associated with V4 but no other cells. As also shown in Table 1, the weighted sum voltages V2 and V3 will simply be zero, resulting in no charge or effect for the associated battery cells.

All possible combinations for input waveforms Va and Vb are clear from Table 1. As another example, if Va is a positive or non-inverted unipolar waveform, and Vb is an inverted unipolar waveform, then V2 will be the only positive sum large enough to go over the threshold voltage to apply charge to the battery cell associated with V2.

Figure 34:
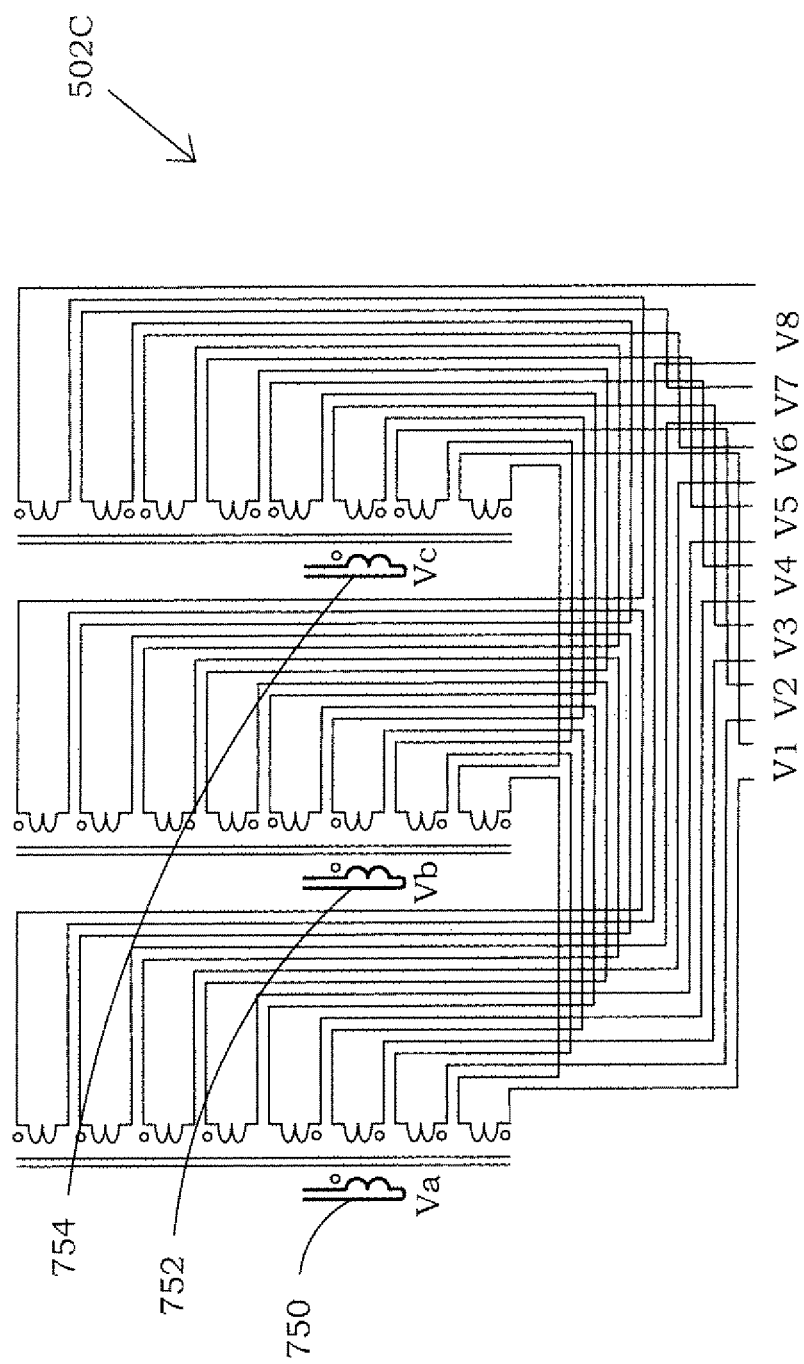
FIG. 34 is a simplified circuit diagram showing a three transformer binary configuration operable to selectively charge up to eight battery cells or groups of cells in accord with one possible embodiment of the present innovation.

FIG. 34 shows a three transformer binary configuration and associated Table 2 below shows all possibilities for combinations of inverted and non-inverted unipolar waveforms applied to the transformers. Utilizing the desired combination, any of eight cells or groups of cells may be selected for charging. Assume that the amplitudes are selected so that when the weighted sum of Va, Vb, and Vc are all positive, then the threshold is reached and the associated battery cell is charged.

TABLE 2

|  | Va | Vb | Vc |
|---|---|---|---|
| V1 | −1 | −1 | −1 |
| V2 | 1 | −1 | −1 |
| V3 | −1 | 1 | −1 |
| V4 | 1 | 1 | −1 |
| V5 | −1 | −1 | 1 |
| V6 | 1 | −1 | 1 |
| V7 | −1 | 1 | 1 |
| V8 | 1 | 1 | 1 |

For example, referring to Table 2, if Va, Vb, and Vc are positive or non-inverted unipolar waveforms of sufficient amplitude, which are applied simultaneously to transformers 750, 752, 754, then the battery cell (not shown) associated with weighted voltage V8 will be charged and the remaining battery cells will not be affected.

As another example, referring to Table 2, if Va, Vb, and Vc are inverted unipolar waveforms, which are applied simultaneously to transformers 750, 752, and 754, the battery cell associated with V1 will be charged and the remaining battery cells will not be affected.

Another embodiment of configurations of transformers for individual cell or cell bank charger 502 in FIG. 30 is what is referred to herein as permutation based configurations. Each of these configurations is based on the number of ways that a subset of k items may be chosen from a set of n items (sometimes known as the choice number).

In the context of this innovation, n is the number of transformers and k is the number of transformer windings that each cell bank is driven from. For unipolar drive waveforms, the number of cell banks will be $2^k \cdot n!/(n! \cdot (n-k)!)$. For bipolar drive waveforms, the number of cell banks will be half this, or $2^{(k-1)} \cdot n!/(n! \cdot (n-k)!)$.

Unlike the binary configurations, with these configurations, each cell is not connected to a secondary winding for each transformer. However, all the windings have the same number of turns but are wound with different polarities.

Table 3 shows a 2 of 3 permutation configuration with n=3 transformers, and k=2 secondary windings to drive each cell. The summed voltages for each combination of inverted or non-inverted set of two unipolar waveforms are listed.

TABLE 3

|  | Va | Vb | Vc |
|---|---|---|---|
| V1 | 1 | 1 | 0 |
| V2 | 1 | 0 | 1 |
| V3 | 0 | 1 | 1 |
| V4 | 1 | −1 | 0 |

TABLE 3-continued

|  | Va | Vb | Vc |
|---|---|---|---|
| V5 | 1 | 0 | −1 |
| V6 | 0 | 1 | −1 |
| V7 | −1 | 1 | 0 |
| V8 | −1 | 0 | 1 |
| V9 | 0 | −1 | 1 |
| V10 | −1 | −1 | 0 |
| V11 | −1 | 0 | −1 |
| V12 | 0 | −1 | −1 |

Figure 35:
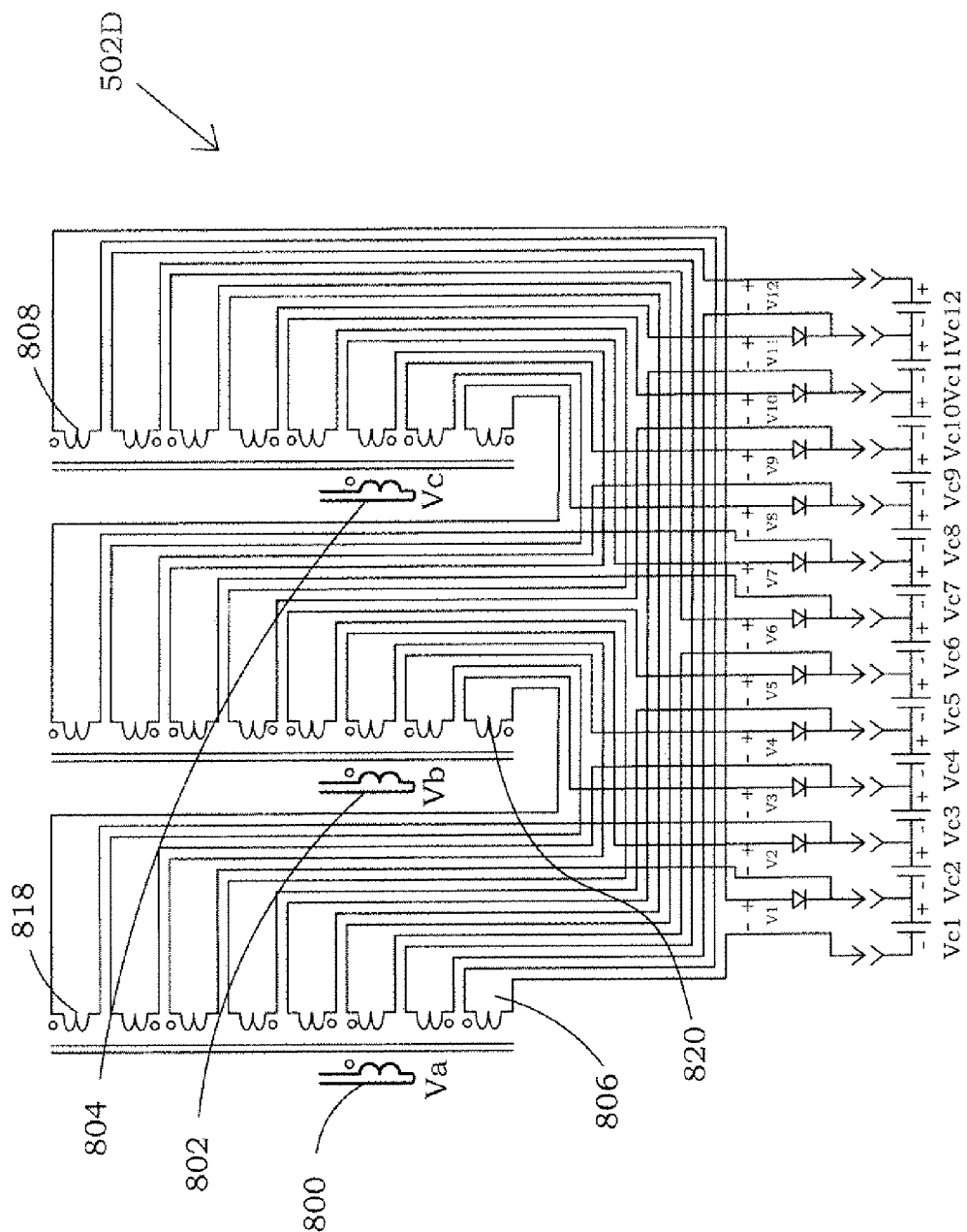
FIG. 35 is a circuit diagram showing a three transformer array and rectification section with a 2 of 3 permutational configuration operable to selectively charge up to twelve battery cells or groups of cells in accord with one possible embodiment of the present innovation.
Figure 36:
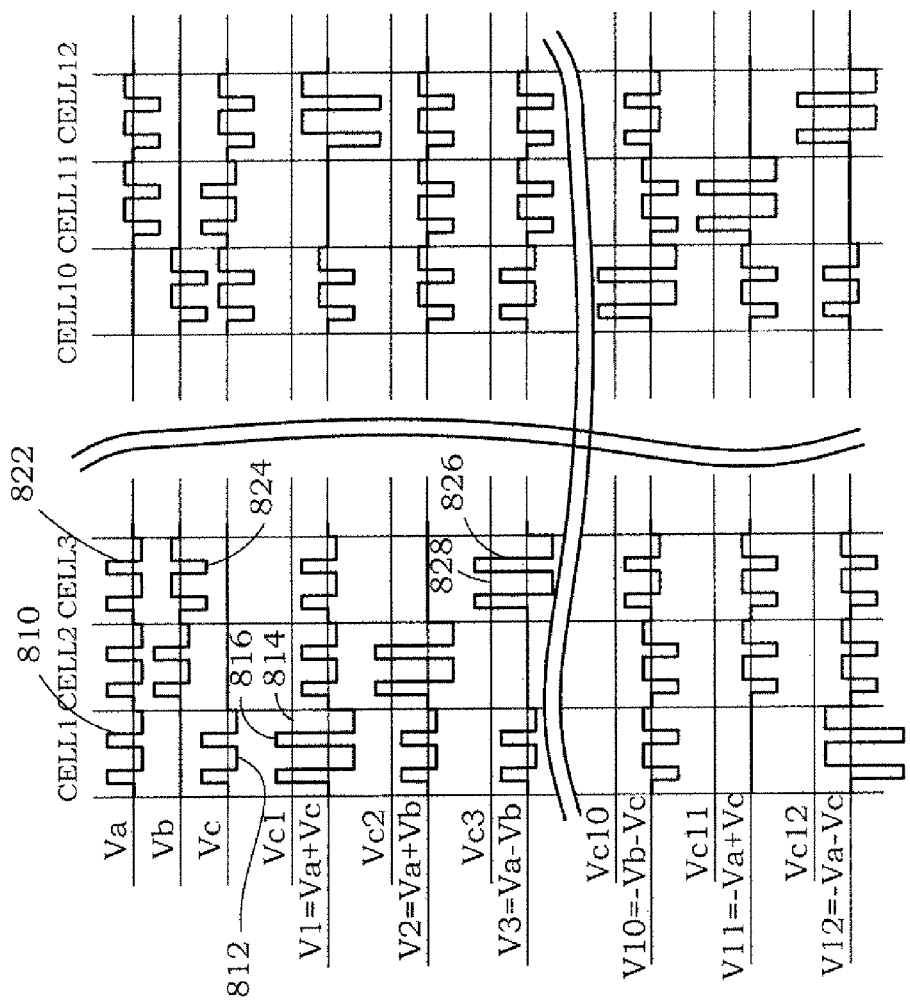
FIG. 36 is a timing diagram for the circuit of FIG. 35, which shows input waveforms and resulting weighted voltage sums in accord with one possible embodiment of the present innovation.

As an example, referring to FIG. 35, there is shown a 2 of 3 permutational configurations individual cell charger 502D. (Note: individual cell charger 502D is not wired as per the above Table 3, which is provided only as an example Table). FIG. 36 shows example waveforms for many of the combinations. In one embodiment, only two waveforms would be applied to the three transformers in a 2 of 3 permutational configurations.

As an example of operation of individual cell charger 502D, battery cell Vc1 is driven by the summed voltage V1, which is produced by the series connected secondary windings 806 and 808. If it is desired to charge battery cell Vc1, then non-inverted or positive unipolar waveforms are simultaneously applied to primary windings 800 and 804 as shown at 810 and 812 of FIG. 36. Because secondary winding 806 and 808 are wired with positive polarity, the resulting summed voltage V1 is sufficient to overcome threshold 814 and charge Vc1, as indicated by pulses 816, which are higher than threshold 814.

As another example, to charge battery cell or cell bank Vc3 of individual cell charger 502D, a non-inverted bipolar waveform Va as indicated at 822 (FIG. 36) is applied simultaneously with an inverted bipolar waveform Vb as indicated at 824 to secondary windings 800 and 802. The summed voltage V3 as indicated at 826 is the sum of voltages produced by series connected secondary windings 818 and 820. Because secondary winding 820 has a reversed polarity, the inverted bipolar waveform Vb is inverted twice making the waveform positive. Threshold 828 is overcome and battery cell or cell bank Vc3 is charged.

As yet another possible embodiment, another family of configurations is the trinary configurations. In these configurations, n transformers can drive $(3^n)-1$ cell banks (unipolar drive). The transformer weightings (turns ratios) correspond to balanced ternary notation (using −1, 0, 1 as digits) with an additional scaling factor. If the weighting for each cell is thought of as a vector, each one has a magnitude (square root of the sum of the squares). In order for proper operation, each weighting vector should have the same magnitude (normalized). The normalization can be approximated with small fractions. For instance, the square root of two can be approximated by 7/5.

As an example, Table 4 is for a two transformer trinary configuration.

TABLE 4

| Transformer Matrix | | |
|---|---|---|
|  | Va | Vb |
| V1 | −5 | −5 |
| V2 | 0 | −7 |
| V3 | 5 | −5 |
| V4 | −7 | 0 |
| V5 | 7 | 0 |

TABLE 4-continued

| Transformer Matrix | | |
|---|---|---|
| | Va | Vb |
| V6 | −5 | 5 |
| V7 | 0 | 7 |
| V8 | 5 | 5 |

Because of the normalization, the drive waveforms should have varying levels. This in turn means that the difference in voltage between the voltage driving the diode for the selected cell bank is not very different from the largest voltage driving the other diodes.

Other combinations of weighting factors may also be utilized that allow cells to be selected. However, they involve somewhat more complicated transformer turns ratios and drive voltage levels. An example is shown in Table 5 below.

TABLE 5

| | Va | Vb | Vb |
|---|---|---|---|
| 0 | 1.333 | 1.333 | 1.333 |
| 1 | 1.333 | 1.333 | −1.333 |
| 2 | 1.333 | −1.333 | 1.333 |
| 3 | 1.333 | −1.333 | −1.333 |
| 4 | −1.333 | 1.333 | 1.333 |
| 5 | −1.333 | 1.333 | −1.333 |
| 6 | −1.333 | −1.333 | 1.333 |
| 7 | −1.333 | −1.333 | −1.333 |
| 8 | 2.25 | 0 | 0 |
| 9 | −2.25 | 0 | 0 |
| 10 | 0 | 2.25 | 0 |
| 11 | 0 | −2.25 | 0 |
| 12 | 0 | 0 | 2.25 |
| 13 | 0 | 0 | −2.25 |

A transformer array can be produced fairly inexpensively. These embodiments may require many individual windings to run through several transformer cores. This can be accomplished by using planar transformers with a printed wiring board for the windings. This construction is a well established industry practice, and transformer components designed for this technique are readily available. An example is shown in FIG. 37, for transformer cores 902 and 904, printed circuit board 906, and windings 908 which run through the transformer cores.

Table 6 shown below provides a non-limiting overview of a few possible configurations of transformer arrays, waveforms, secondary windings per transformer, and cells or cell banks that may be driven by the associated configuration to provide an individual cell charger 502 for use in battery charge system 500 as shown in the block diagram of FIG. 30.

TABLE 6

| Description | Number of transformers | Number of cell banks | windings per transformers |
|---|---|---|---|
| Unipolar trinary | 2 | 8 | 6 |
| bipolar binary | 3 | 4 | 4 |
| unipolar binary | 3 | 8 | 8 |
| unipolar 2 of 3 perm | 3 | 12 | 8 |
| unipolar | 3 | 14 | 12 |
| bipolar binary | 4 | 8 | 8 |
| bipolar 2 of 4 perm | 4 | 12 | 6 |
| unipolar binary | 4 | 16 | 16 |
| unipolar 2 of 4 perm | 4 | 24 | 12 |
| bipolar binary | 5 | 16 | 16 |
| bipolar 2 of 5 perm | 5 | 20 | 8 |
| unipolar binary | 5 | 32 | 32 |

TABLE 6-continued

| Description | Number of transformers | Number of cell banks | windings per transformers |
|---|---|---|---|
| bipolar 3 of 5 perm | 5 | 40 | 24 |
| unipolar 2 of 5 perm | 5 | 40 | 16 |
| unipolar 3 of 5 perm | 5 | 80 | 48 |
| bipolar 2 of 6 perm | 6 | 30 | 10 |
| bipolar binary | 6 | 32 | 32 |
| unipolar 2 of 6 perm | 6 | 60 | 20 |
| unipolar binary | 6 | 64 | 64 |
| bipolar 3 of 6 perm | 6 | 80 | 40 |
| unipolar 3 of 6 perm | 6 | 160 | 80 |
| bipolar 4 of 6 | 6 | 120 | 80 |
| unipolar 4 of 6 | 6 | 240 | 160 |
| bipolar 2 of 7 perm | 7 | 42 | 121 |
| bipolar binary | 7 | 64 | 64 |
| unipolar 2 of 7 perm | 7 | 84 | 124 |
| unipolar binary | 7 | 128 | 128 |
| bipolar 3 of 7 perm | 7 | 140 | 60 |
| bipolar 4 of 7 perm | 7 | 280 | 160 |
| unipolar 3 of 7 perm | 7 | 280 | 120 |
| unipolar 4 of 7 perm | 7 | 560 | 320 |

For example, utilizing a unipolar 3 of 7 permutation configuration for individual cell charger 502, then 280 battery cells could be individually selected. Only 7 transformers would be needed.

Referring again to FIG. 30, transformer drive circuit 518 provides high power voltage pulses to transformer array 514 based on the logic level pulses received from timing and control section 520. Transformer drive circuits necessary to generate asymmetric waveforms are generally more complicated than those needed to make symmetric (square wave, push-pull) waveforms.

Figure 38:
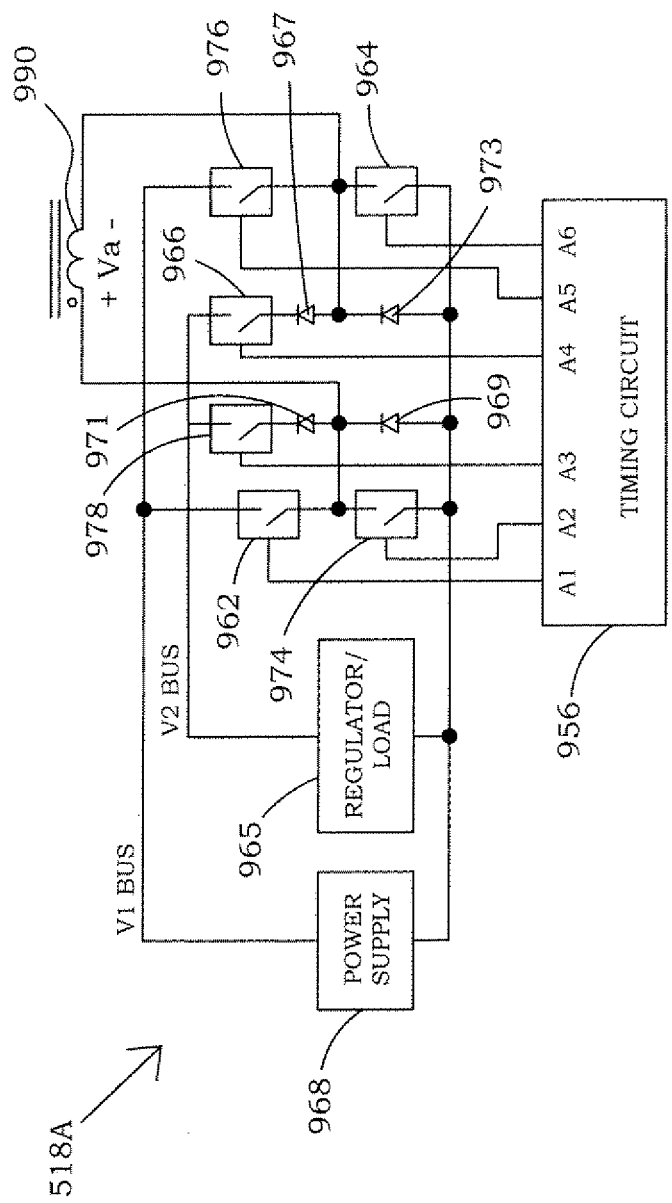
FIG. 38 is a circuit diagram schematic for a unipolar waveform drive circuit in accord with one possible embodiment of the present innovation.
Figure 39:
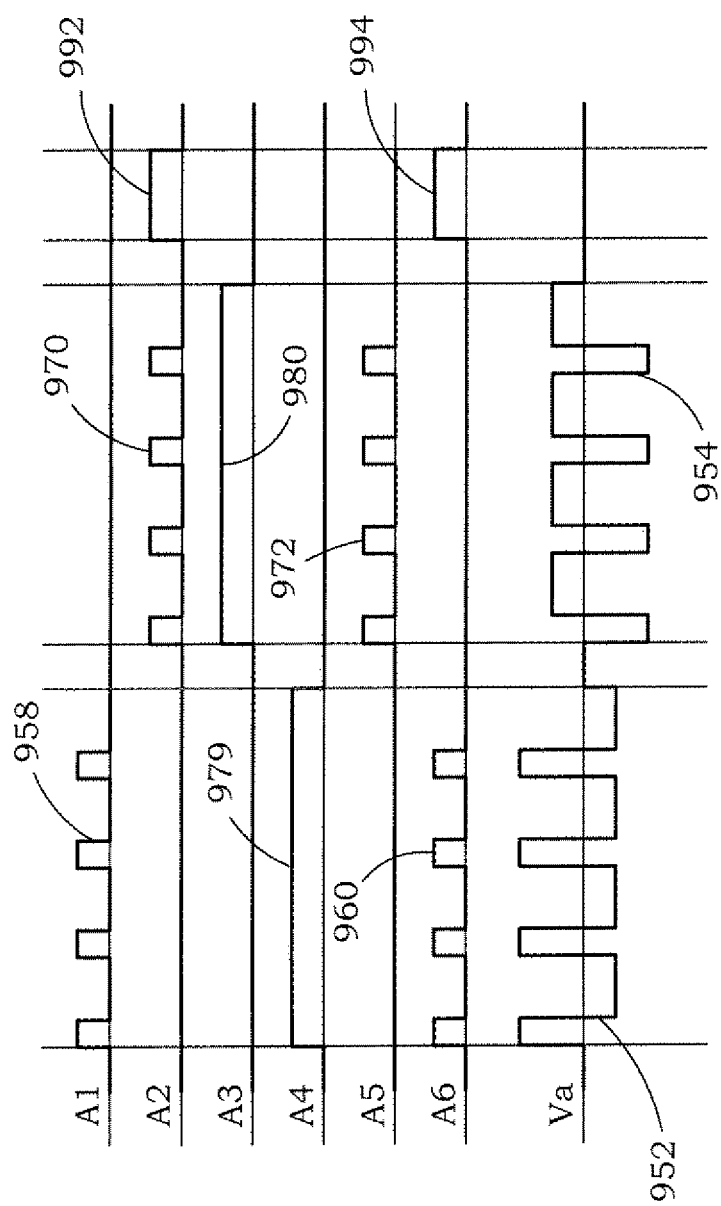
FIG. 39 is a timing diagram for the circuit of FIG. 38, which shows timing circuit signals in accord with one possible embodiment of the present innovation.

FIG. 38 shows one possible implementation of unipolar transformer drive circuit 518A. FIG. 39 shows a timing diagram wherein an example positive unipolar waveform 952 and an inverted or negative unipolar waveform 954 are produced.

Referring to FIG. 38 and FIG. 39, to produce positive unipolar waveforms, timing circuit 956 applies pulses 958 and 960 to close the switches 962 and 964, whereby the plus side of transformer input or primary winding 990 is connected with V1 power supply. Timing circuit 956 closes switch 966 with pulse 979 to connect to V2 power supply 965 to the minus side of winding 990 through diode 967 and diode 969 to produce the negative portion of the unipolar pulse, when switches 962 and 964 are opened.

To produce negative unipolar waveforms, timing circuit 956 applies pulses 970 and 972 to switches 974 and 976, whereby transformer input or primary is reverse connected across V1 power supply 968. Timing circuit 956 closes switch 978 with pulse 980 to connect to V2 power supply 965 to the plus side of winding 990 through diode 971 and diode 973 to produce the positive portion of the unipolar pulse, when switches 974 and 976 are opened.

When not producing a unipolar waveform, then switches 974 and 964 are closed by pulses 992 and 994 to ground both sides of primary winding 990.

Some transformer configurations require unipolar waveforms with multiple levels. One possible way of implementing this is by making power supplies 965 and 968 that set the bus voltages V1 and V2 in FIG. 38 adjustable.

Figure 40:
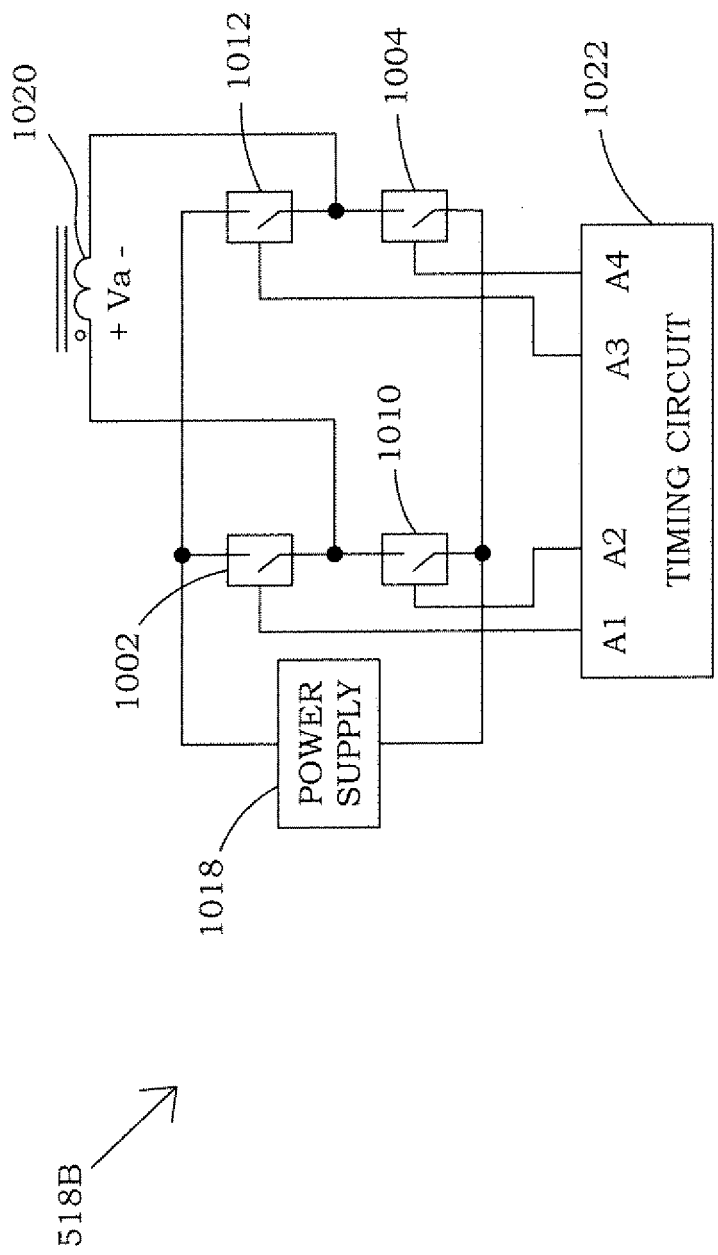
FIG. 40 is a circuit diagram schematic for a bipolar waveform drive circuit in accord with one possible embodiment of the present innovation.
Figure 41:
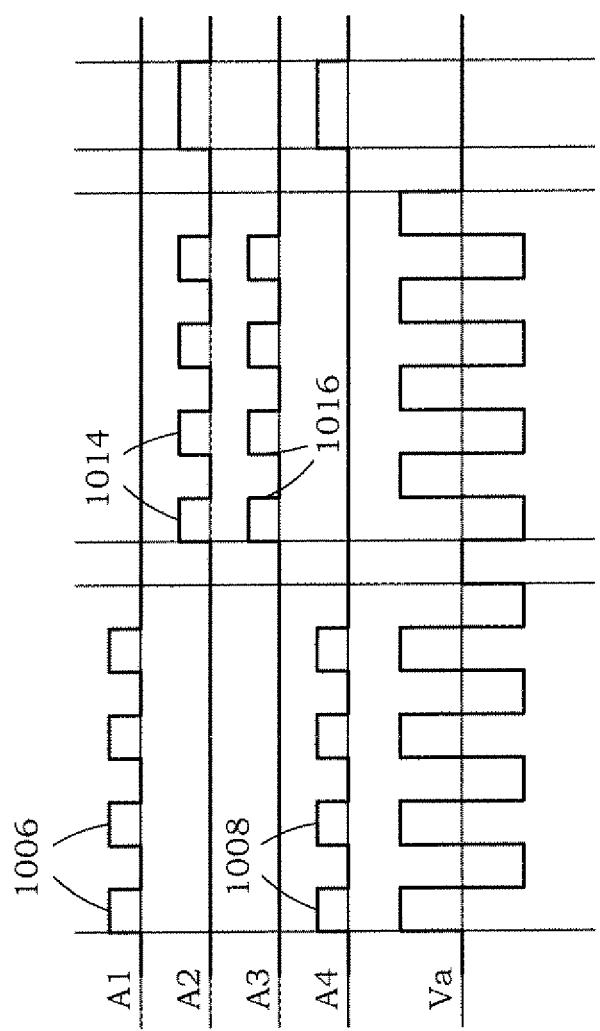
FIG. 41 is a timing diagram for the circuit of FIG. 40, which shows timing circuit signals in accord with one possible embodiment of the present innovation.

One possible bipolar drive circuit configuration 518B is shown in FIG. 40, which may be utilized to produce inverted and non-inverted unipolar waveforms as indicated by the timing diagram of FIG. 41.

To produce positive bipolar waveforms, timing circuit 1022 closes switches 1002 and 1004 with pulses 1006 and 1008 to connect the positive side of input winding 1020 to power supply 1018.

To produce negative bipolar, timing circuit 1022 closes switches 1010 and 1012 with pulses 1014 and 1016 to connect the negative side of input winding 1020 to power supply 1018.

Figure 42:
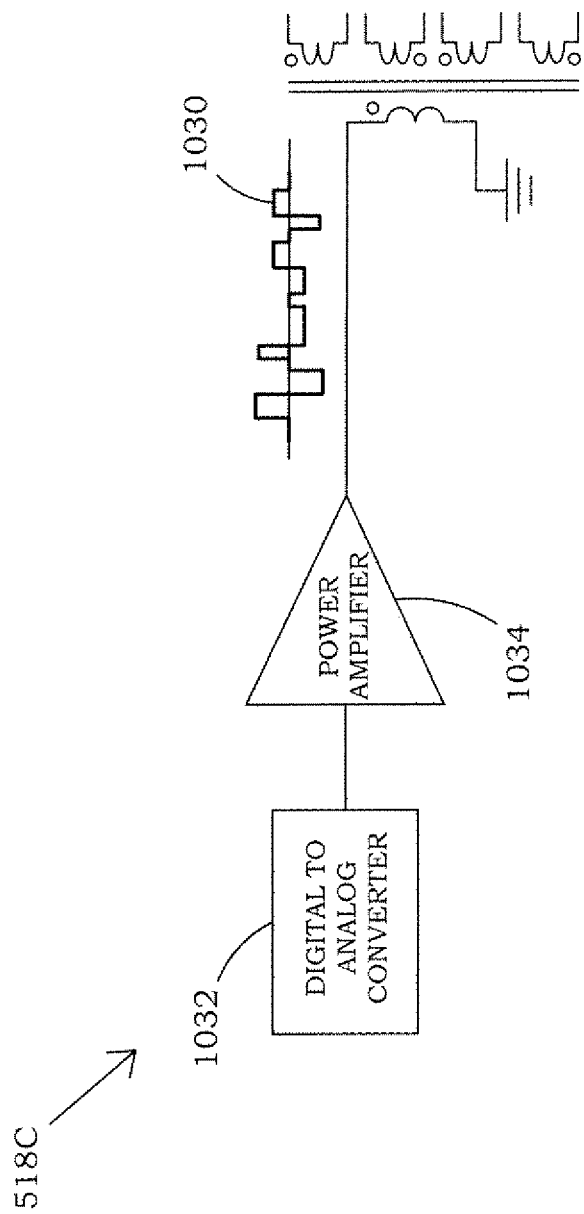
FIG. 42 is a block diagram schematic for a multiple level waveform drive circuit in accord with one possible embodiment of the present innovation.

Some transformer configurations require waveforms with multiple levels as indicated by waveform 1030 in FIG. 42. Transformer drive 518C shows one possible way of implementing this utilizing digital to analog converter 1032 to produce the waveform shape, which then is amplified by power amplifier 1034.

Figure 43:
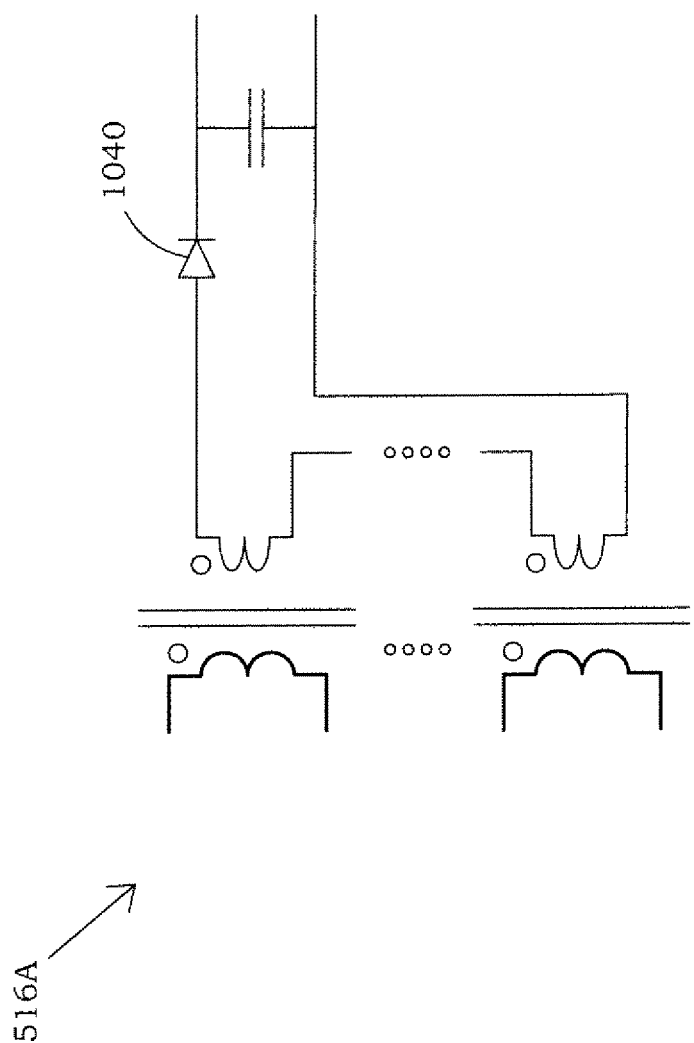
FIG. 43 is a circuit diagram for a rectifier section in accord with one possible embodiment of the present innovation.
Figure 44:
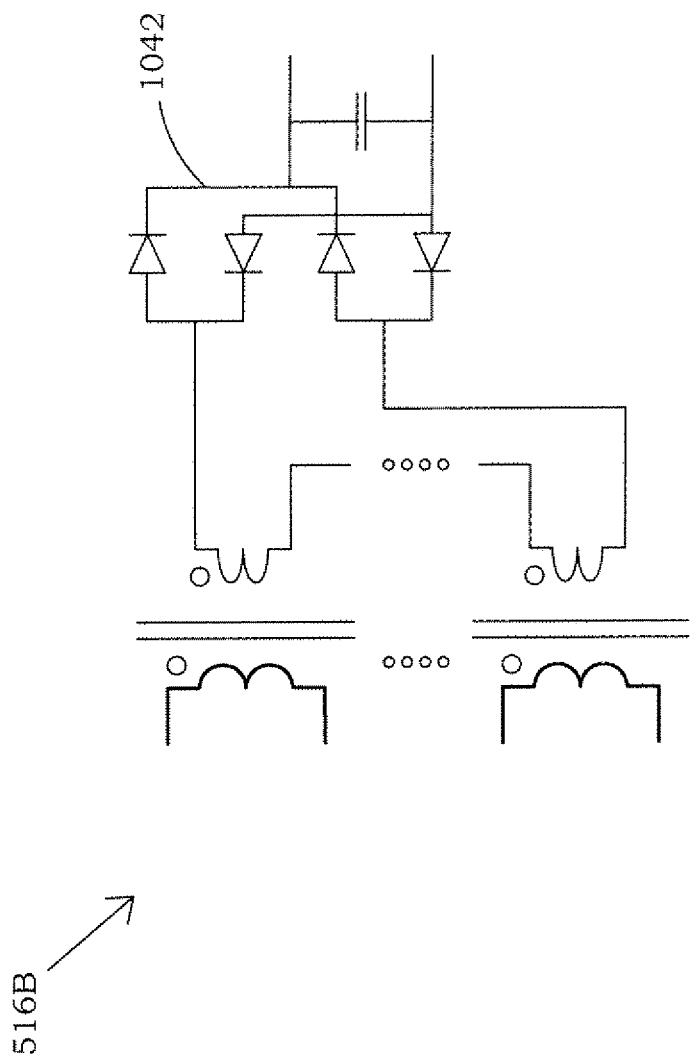
FIG. 44 is a circuit diagram for a bridge rectifier section in accord with one possible embodiment of the present innovation.

The output rectification and filtering section 516 shown in FIG. 30 rectifies and filters the waveforms generated by transformer array 514. The battery cell banks could accept significant AC current, but to hold down losses and EMI emissions, it is best to filter them out as close to the transformer array as possible. FIG. 43 shows output rectification and filtering section 516A utilizing diode rectifier 1040 to produce the weighted voltage discussed hereinbefore for unipolar signals. As may be more useful when utilizing bipolar waveforms, FIG. 44 shows output rectification and filtering section 516B with bridge rectifier 1042 to produce the weighted voltage.

Figure 45:
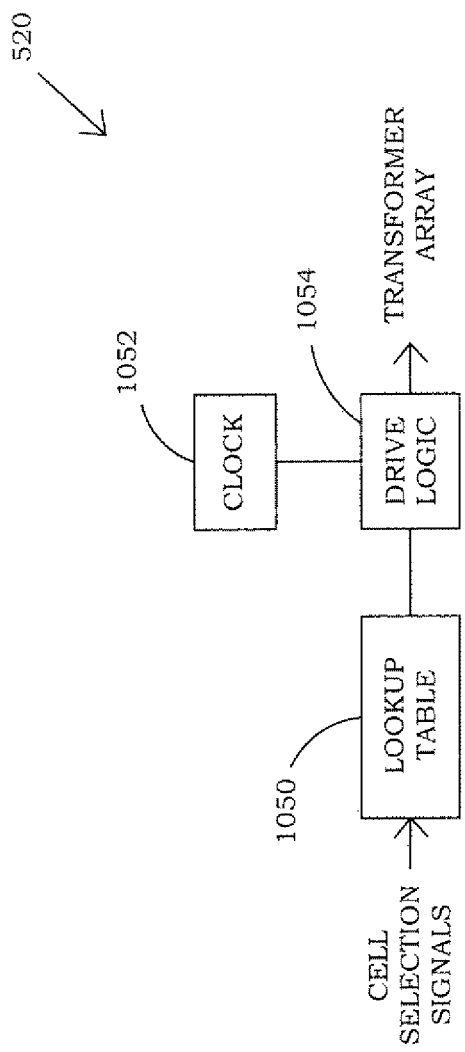
FIG. 45 is a block diagram for a timing and control section in accord with one possible embodiment of the present innovation.

Timing and control section 520 of FIG. 30 provides logic level signals to transformer drive section 518 of the right phasing to charge the cell selected by charge controller 512. FIG. 45 shows one possible implementation of timing and control section 520, which utilizes lookup table 1050, clock 1052, and drive logic 1054.

Referring again to FIG. 30, individual charger 502 can complement battery monitoring and instrumentation by providing for charging of individual cells or groups of cells. Main high power charger 510 runs current through the whole series string of cells 504. While this is happening, bank voltage monitoring 508 monitors individual cell bank voltages. If any cell bank appears to need additional charge, charge controller 512 commands individual charger 502 to provide additional charge to that cell or cell bank.

Various alternative techniques may be utilized. A current sensor (not shown) may be used on the power bus for power supplies 968 and 965 in FIG. 38 to monitor operations and for power supply 1018 in FIG. 40. A current source transformer drive circuit 518 may be utilized to better overcome leakage inductance and/or monitor cell voltages through the transformers. For additional charging, a current doubler circuit may be in rectification section 516.

Figure 46:
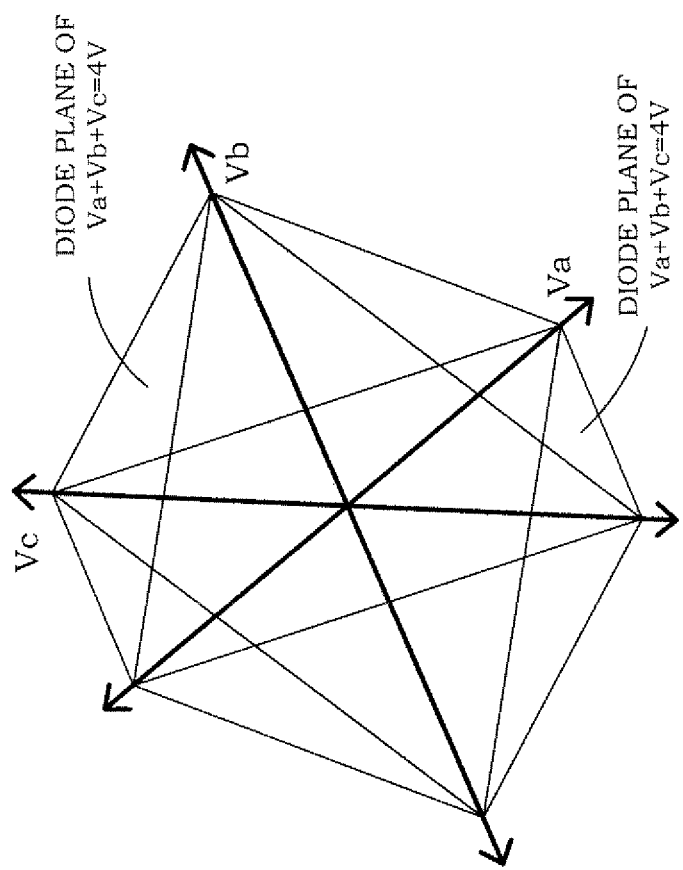
FIG. 46 is a geometric interpretation for operation of a transformer array in accord with one possible embodiment of the present innovation.

The operation of individual charger 502 can be considered in a geometrical view for additional insight of operation, an example of which is shown in FIG. 46. The instantaneous voltage across each transformer can be regarded as a coordinate of a phase space with as many dimensions as there are transformers.

This is easiest to see by considering a system with three transformers in a binary arrangement. At any moment in time, the instantaneous primary voltages of each of the three transformers define a point in a three dimensional phase space.

Each battery cell gets a weighted sum of these voltages, and the diode associated with each cell will conduct if that sum is greater than the cell voltage. This is equivalent to saying that the phase space point is on one side of a plane defined by that weighted sum and the cell voltage.

In the binary configuration with three transformers, as shown in FIG. 46, the eight weighted sums for the eight cells combine with the cell voltages to define eight diode activation planes. In FIG. 46, two of these eight diode activation planes are labeled. The activation planes form an octahedron in space.

Notice that it is possible to move from the center of the octahedron (where no diodes are conducting) to points just outside the octahedron where any desired diode (and no other) is conducting. It is also possible to move to points where more than one diode is conducting, but not to points where any arbitrary pair of diodes is conducting.

The transformers impose the condition that the average position of the point over time should be at the origin (no DC component on the transformers). In practice this means that the point swings back and forth on a line through the origin.

In unipolar operation, the point swings farther along the line on one side of the origin than on the other side. This means that the point will only cross one plane.

In bipolar operation, the point swings equally on both sides of the origin. This means that the point will cross two opposite planes alternately and half as many cells can be distinguished.

Other considerations for an individual cell or bank charger 502 include fault tolerance, which is easily added with fuses in output rectifier and filter section 516. Current limiting may be provided. Individual charger 502 can easily be constructed so that a single component fault will not short a battery cell bank by adding a fuse on each cell connection. It will be seen that a diode failing short in the bridge configuration does not short the cell bank, just the transformer drive circuit.

In another possible non-limiting embodiment of the innovation, a monitoring network is provided that can be added to a battery consisting of many parallel and/or series connected battery cells. The network may be configured to allow the health of individual cells and/or groups of cells, as measured by the current that they produce under load, to be monitored. If one or more cells are producing less current than the others, the network allows the discrepant cells and/or groups to be sensed. In one embodiment, the cells that are not performing correctly may also be located.

As one example, a sense network of individual saturating transformers may be connected in series with individual cells of a bank of many parallel cells. In this example, the transformers share common excitation and sense windings. When a current waveform is applied to the excitation winding while a test load is placed on the whole battery, the waveform that appears on the sense winding allows poorly performing cells to be detected.

The use of transformers in the present innovation for sensing and balancing circuitry results in intrinsic electrical isolation of the battery cells. Because sensing is made through the transformers, it is unnecessary to provide fusing on the sense wires. In one embodiment of the innovation, possible examples of which are shown in FIG. 12-24, electronics such as diodes and/or FETs are not necessarily utilized and/or required. In another possible embodiment, the present innovation may possibly utilize an array of saturating core transformers connected by diodes and/or FETs and/or other switching devices to battery cells.

Transformers are typically designed to operate without magnetic saturation. As well, the core of most transformers is not designed to retain any significant magnetization state. In most applications, it is usually essential to avoid reaching magnetic saturation since it is accompanied by a drop in inductance, which transformers typically require for proper operation. However, unlike typical transformers, one possible embodiment of the present innovation uses magnetic saturation and magnetization of the core advantageously, as discussed hereinafter.

Magnetic saturation is a limitation occurring in inductors/transformers having a ferromagnetic or ferrimagnetic core. Initially, as current is increased, the magnetic flux increases proportionally. At some point, however, further increases in current lead to progressively smaller increases in magnetic flux. Eventually, the core can make no further contribution to flux growth and any increase thereafter is limited.

In other words, in typical transformer operation, current through the primary winding induces a change in magnetic flux in the transformer core. The change in magnetic flux then induces current flow in the secondary winding. However, if the transformer core is saturated, then a change in magnetic flux is not created by current flow through the primary winding. Thus, there will be little or no resulting current induced in the secondary winding. The transformer essentially ceases to operate when the transformer core is saturated.

Contrary to typical prior art designs, the present innovation utilizes transformers designed to saturate, as discussed in more detail in the paragraphs hereinafter. In one embodiment of the innovation, multiple transformers may be excited simultaneously to detect cells which are not operating properly.

However, in another embodiment, only a selected transformer continues to operate. To make a measurement in a particular battery cell, the present innovation applies a pulse to a selected transformer with a current direction that produces magnetic flux in a direction opposite to the direction of flux saturation. The selected transformer then saturates in the opposite direction. In other words, the selected transformer creates a change in magnetic flux in response to current in the primary winding. Therefore, a sense winding will detect this change in flux, thereby detecting a voltage in the battery connected to the selected transformer. Only the selected transformer continues to operate due to magnetic flux change. Other non-selected transformers remain saturated in the same direction, and do not operate, and do not contribute any significant amount to the induced voltage in the sense coil of the selected transformer.

In the present innovation, windings on the transformers may be used to allow an individual transformer to be selected by selectively saturating the core, whereupon the voltage/current of the associated battery cell may be measured. In another embodiment, charge can also be transferred to or removed from selected cells to balance the selected battery cells.

The transformers may or may not be electrically arranged in physical or virtual rows and columns with row and column windings. In one embodiment, the voltage amplitude of the pulses is limited by the diode and battery cell connected to the transformer, which may be measured with an analog to digital converter connected to a sense winding.

In one embodiment, the sense winding may be directed through the entire group of transformers, but saturation prevents all except the selected transformer from making a contribution to the reading. In another embodiment, the sense winding may be directed through an entire group of transformers, and change of direction of magnetization in the cores produces a signal that can locate faulty individual cells or groups of cells.

Addressable magnetic cores take advantage of a square hysteresis loop to retain, at least substantially, their magnetization state when no current is applied. A matrix of addressable magnetic cores was frequently used in magnetic core memories about fifty years ago. However, those magnetic core matrices were used simply to store information in the cores in the form of a flux state, which represented either a digital "1" or "0." Their use was unrelated to measuring analog values of a matrix of battery cell voltages and/or for balancing the cell voltages. In one possible embodiment, the present innovation does not require addressing the row and column simultaneously, as was typically done previously in magnetic core memories. However, the present innovation is not limited to any particular wiring arrangement for addressing and/or changing the magnetic flux states of the magnetic cores to measure and/or balance the battery cells.

Referring now to the drawings and, more particularly, to FIG. 1 and FIG. 2 there is shown one possible embodiment of battery system 100 in accordance with the present innovation. Battery system 100 may comprise battery assembly 10, which includes battery cell array 16. Battery cell array 16 may comprise parallel and/or series connected battery cells that store electrical energy. In FIG. 1, battery cell array 16 is darkened to allow the array to stand out more clearly.

Monitoring array 18 comprises transformer cores and interconnecting wires that allow the voltages of individual cells to be measured. Charge may be put in individual battery cells as desired. Monitoring array 18 may also comprise switch elements such as diodes, semiconductor switches, and the like. In this example, diodes such as diode 32 are shown connected to the winding of the transformers to which the battery cells are connected.

Battery voltage sensing system 14 connects to monitoring array 18 and comprises circuitry for measuring and/or balancing cell voltages. In this example, battery voltage sensing system 14 connects to monitoring array 18 via one or more connectors, designated as connector 20, and provides pulses for sensing and charging. In one embodiment, battery voltage sensing system 14 is separate from main charge system 12. In one possible embodiment, battery voltage and sensing system 14 may be designed to have the following functions:

1. Provide row and column pulses to select transformers and associated cells.
2. Measure the characteristics of the pulses on the sense winding to determine the voltage of the cells.
3. Supply balancing currents to selected cells by repeatedly pulsing the appropriate row and column windings.
4. Measure any reference voltages in the battery and perform self-calibration.
5. Report measured voltages to the user or an external computer system or network.
6. Decide which battery cells or cell banks need balancing currents.

In one embodiment, referring to FIG. 2, the present innovation may be designed to be operable in parallel with what may be a simple battery charger that supplies the main charge current, such as main charge power supply 12. Main charge power supply 12 may be connected to battery assembly 10 with connector 21. The present innovation can monitor cell voltage during and after charging. However, in one embodiment, the balancing function is operated after the main charge currents are shut off.

Although the individual circuit elements are shown in detail hereinafter, the battery cells in FIG. 1 are labeled B00 to Bnm, with the m numbers being the rows, and the n numbers being the columns. The maximum array size is set by wire resistance and parasitic inductances in the collective sense windings that would cause waveform degradation. Utilizing only the circuitry of the embodiment shown in FIG. 1, an array of several hundred cells could be monitored. However, additional separate circuitry can be added to permit monitoring of any number of battery cells.

An example of a typical battery cell from FIG. 1 is battery cell B00, which may be labeled as battery cell 22, and is represented by a positive and negative electrode.

Figure 4:
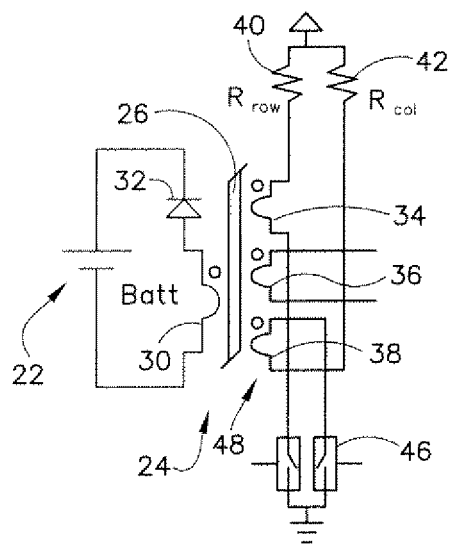
FIG. 4 is an electronic schematic diagram which shows a simplified circuit diagram associated with a single battery cell from an array of battery cells in accord with one possible embodiment of the present innovation.
Figures 10, 11:
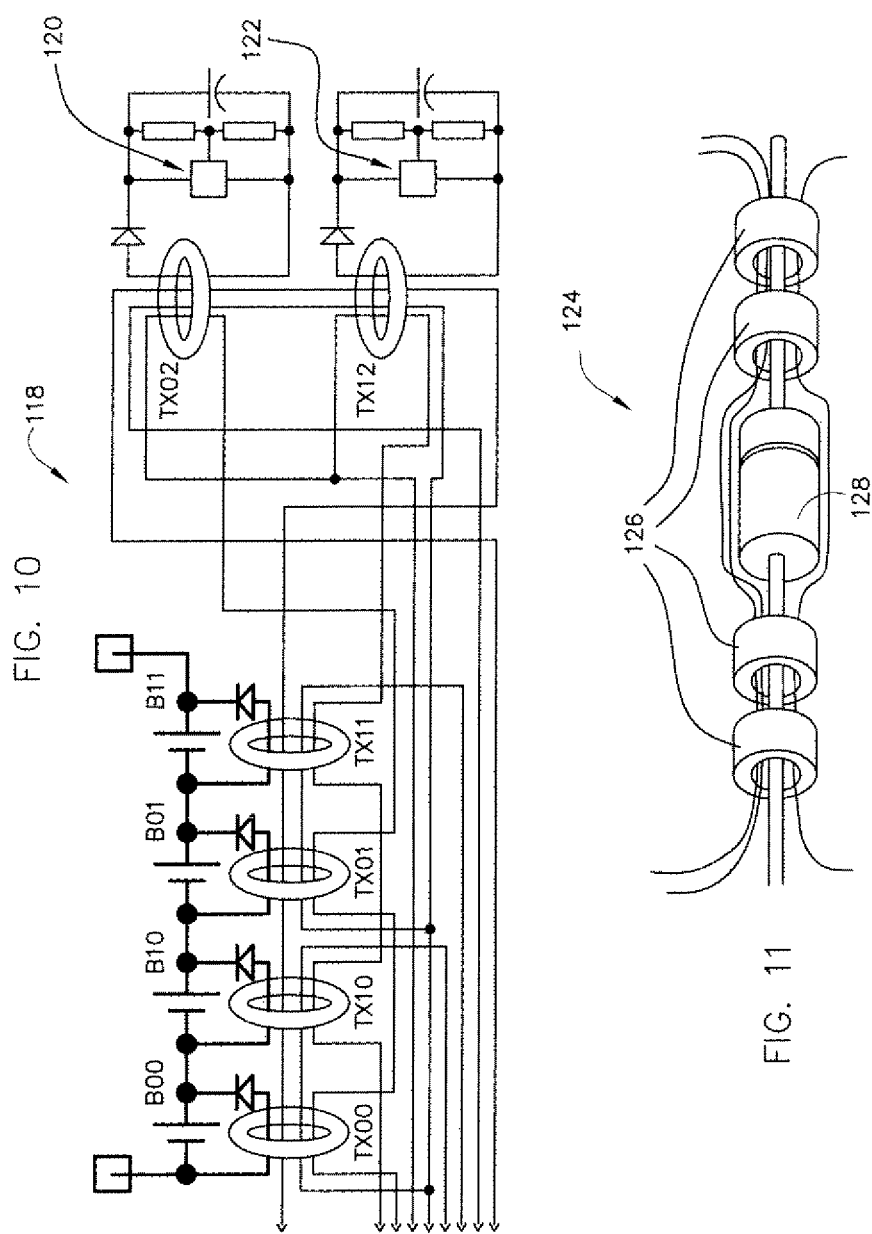
FIG. 10 is an electronic schematic diagram which utilizes additional transformers that provide precision voltages references that might be utilized for auto calibrations to improve cell voltage measurement accuracy in accord with yet another possible embodiment of the innovation.
FIG. 11 is a physical layout, which shows multiple transformer cores, diode, and related wiring in accord with yet another possible embodiment of the innovation.

Referring to FIG. 4, there is shown a simplified drawing of battery cell 22. In FIG. 4, a typical transformer 24 is associated with battery cell 22, which comprises saturable core 26. A physical example of one possible suitable saturable core is shown in FIG. 11 as core 126. Transformer 24 has windings 28 and 30, which may be referred to herein as primary and secondary windings. In this embodiment, each individual battery cell is connected to an associated transformer. However, other embodiments may have other arrangements between battery cells and transformers, and some of the other possibilities are discussed hereinafter. Secondary winding 30 is connected to the battery cell associated with the transformer. In this embodiment, diode 32 may be utilized to allow charging current to flow into battery cell 22 but prevent leakage that would drain the battery. The primary winding comprises three separate windings, which include row select winding 34, column select winding 38, and a sense winding 36.

As can be seen in FIG. 1, the sense winding may pass through or be connected through all transformers. For example the sense windings may be series connected. It is then possible to measure all battery cell voltages of each battery cell or each bank of battery cells. As discussed hereinafter, the selection process permits measurement of individual battery cell voltages even if all transformer sense windings are connected in series.

The row select winding, such as row select winding 34, connects with all the transformers in a given row or virtual row of the transformer matrix.

The column select winding, such as column select winding 38, can be seen to connect with all the transformers in a given column or virtual column of the transformer matrix.

Figure 6:
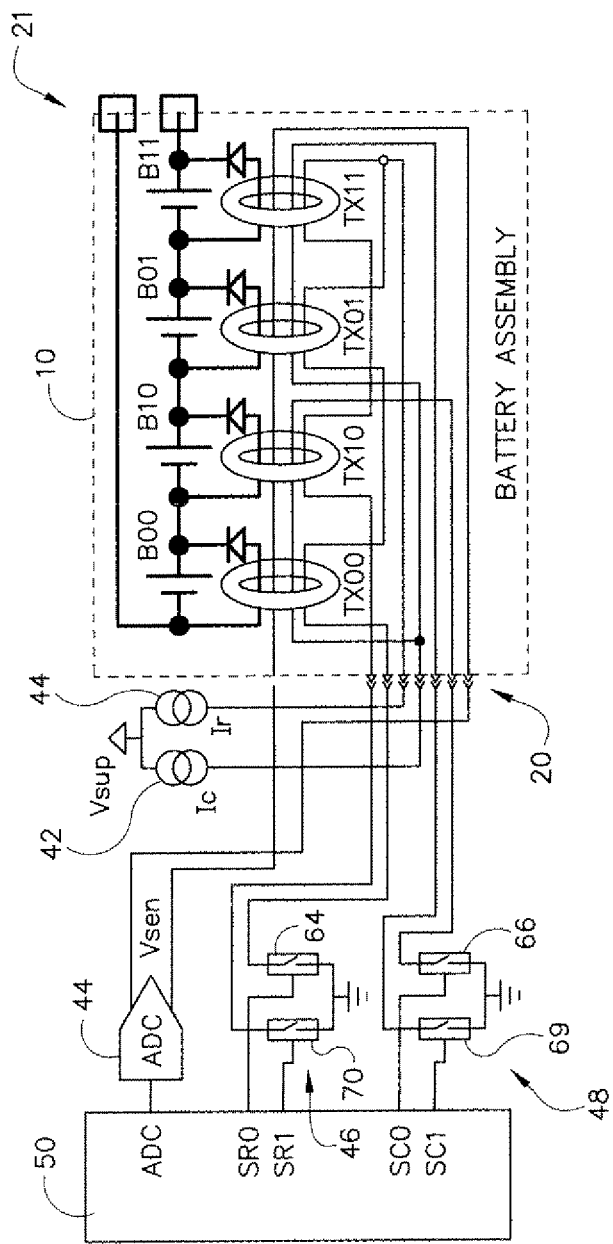
FIG. 6 is an electronic schematic diagram of a 2×2 battery cell array for use with FIG. 6 in accord with one possible embodiment of the innovation.

While columns and rows are used herein to provide an easier and quicker understanding of the innovation concepts, the actual physical layout may or may not correspond to this description. More generally, column and row descriptions may refer to a virtual column or row which may not be physically arranged as are the electrical connections. For example, FIG. 6 shows a circuit that could be physically arranged as a single 4×1 array as diagrammatically shown, but is electrically connected as a 2×2 array. The operation is described in terms of a 2×2 array with columns and rows. Thus, the use of column and row terminology is a convenient means visualizing the addressing techniques and understanding addressing of individual transformers. The column and row terminology of the innovation is not limited to this wiring configuration and could have, for example, a 3-D structure with other windings, which may be configured to select individual transformers or transformer cores, as discussed hereinafter.

In other words, it may be understood that rows and columns as used herein may or may not correspond to physical rows and columns and may or may not correspond to the arrangement shown in the diagrams. Instead, rows and columns may be electrically configured in rows and columns. More generally, the rows and columns actually correspond and are intended herein to refer to groups of transformers and battery cells that may be more easily visualized in rows and columns. For example, "row" 0, and "column" 1 are labels that correspond, in matrix terminology, to a first group 01 and second group 02 which have an intersection at a particular transformer. Thus, rows and columns are simply easily understandable labels for various groups of transformers and battery cells. The terms row and column more easily provide a visual description of how a combination of a particular row winding and a particular column winding may be utilized to address a particular transformer, but in the present innovation, row and column may also mean groups with intersection points.

Figure 9:
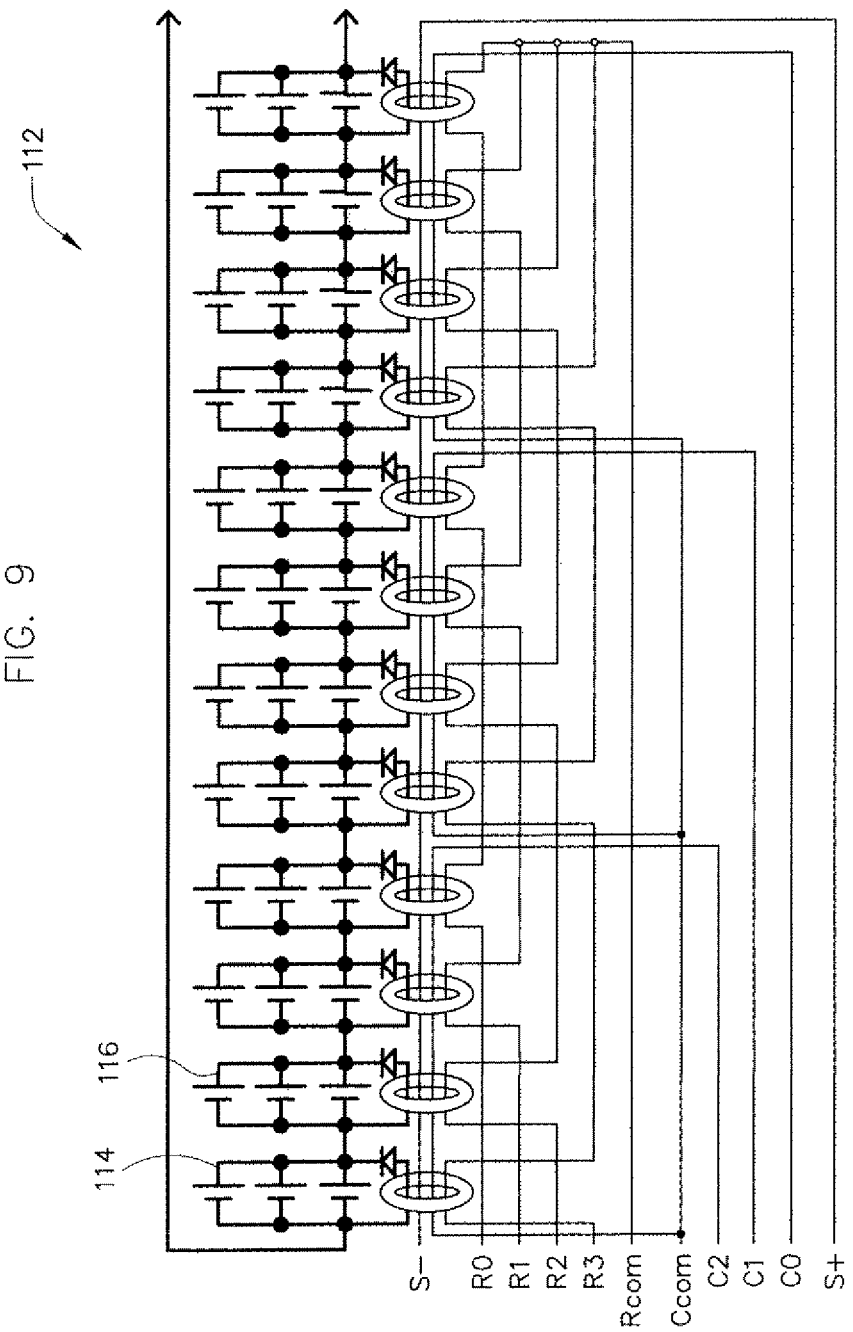
FIG. 9 is an electronic schematic diagram showing series connected banks of battery cells in accord with yet another possible embodiment of the innovation.

In one embodiment of the innovation, each battery cell (or bank of parallel battery cells as shown in FIG. 9) has a single transformer associated with it. As discussed above, the transformers may be electrically but perhaps not physically arranged in a matrix with rows and columns. This matrix does not need to correspond with the physical arrangement of the battery cells. For instance, there could be a single string of 24 cells with the corresponding transformers electrically arranged as a matrix of four rows and six columns. It is possible to have additional transformers in the matrix that are not associated with cells.

In the embodiment of FIG. 1, row and column current sources 40 and 42 may be utilized for saturating the transformer magnetic cores with a desired magnetic flux direction or magnetic state as discussed hereinafter. In one embodiment, a voltage supply and current limiting resistor may be utilized for current sources 40 and 42, which in combination effectively provide a current supply.

Pulses are produced utilizing current from row and column current sources 40 and 42 as row and column switches 46 and 48 are opened and closed. The pulses applied to the row and column windings should be sized to be able to swing one core from one magnetic extreme to the other. In one embodiment, the pulse generation circuitry is able to handle a momentary direct short once the cores are saturated. Therefore, a current source may be utilized although any suitably reliable power supply may be utilized so long as it operates as discussed herein. If desired, the current source may be shared between rows or columns because in one possible embodiment only one row or column at a time is pulsed.

Analog to digital converter 44 may connect to the collective sense windings of the transformers to measure individual cell voltages as discussed hereinafter. Row switches 46 and column switches 48 are utilized to control the electrical current through the row and column current windings, and in this manner address particular transformers. Control electronics 50 are utilized to operate the aforementioned devices as discussed hereinafter. If desired, additional analog to digital converters could be connected to different groups of transformers to limit the collective length of the current windings in any particular group.

Figure 3A:
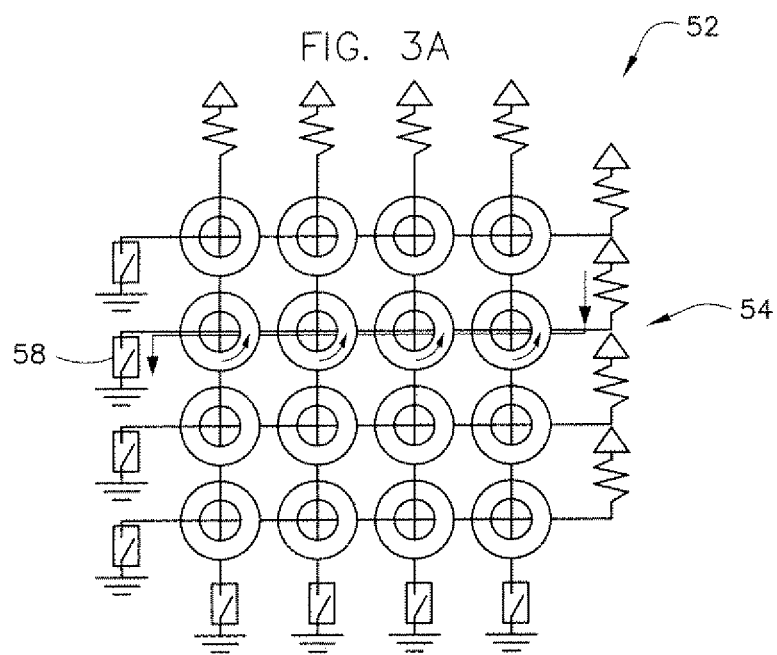
FIG. 3A is an electronic schematic diagram which illustrates a possible step of magnetizing cores CCW in a selected row N by closing a row switch in accord with one possible embodiment of the present innovation.
Figure 3B:
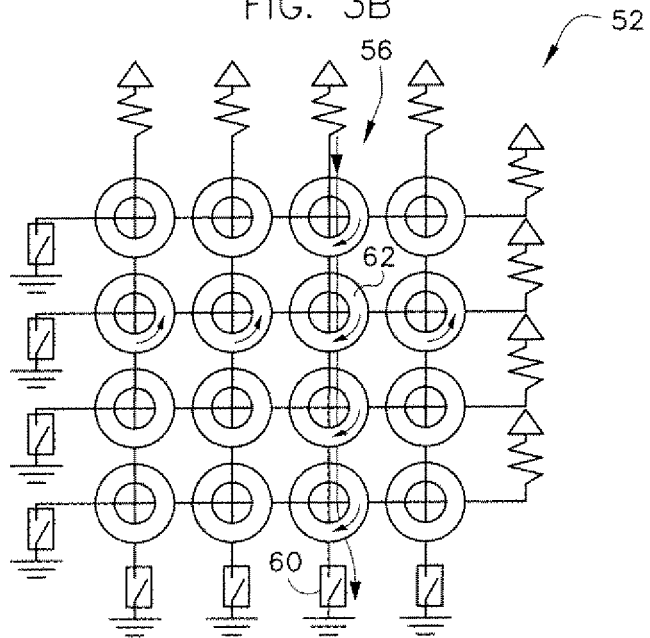
FIG. 3B is an electronic schematic diagram which illustrates a subsequent possible step from that shown in FIG. 3A, whereby in FIG. 3B cores in a selected column are magnetized CW by closing a column switch in accord, which results in a particular core in row N being the only core that is magnetized CW in accord with one possible embodiment of the present innovation.

Array addressing operating principles of one possible embodiment of the present innovation are illustrated in FIGS. 3A and 3B. A 4×4 array of transformers and transformer cores 52 is shown in FIGS. 3A and 3B. In the following steps, transformer core 62 is selected. Step 1: Row switch 58 is momentarily closed, whereby all cores in row 54 are magnetized to a first magnetic state such that the magnetic flux for each core flows in a first direction. As an example, the direction of the magnetic flux may be counterclockwise (CCW) as indicated by the arrows. Row switch 58 may now be opened again. Step 2: Column switch 60 is momentarily closed whereby all cores in column 56 are magnetized in a second magnetic state such that the magnetic flux flows in an opposite direction. For example, the direction of the magnetic flux may be clockwise (CW) as indicated by the arrows. Now, desired core 62 has been selected because it is the only core in row 54 that is magnetized CW. As discussed in the following paragraphs, voltage measurements or power transfer for individual battery cells can be performed by using this addressing scheme.

FIG. 6 and FIG. 7A illustrate operation principles for cell measurement in accord with one possible embodiment of the innovation. In this example, for ease of understanding, battery assembly 10 of FIG. 6 comprises a 2×2 array. The following method samples the cell voltage of each cell, as indicated at pulses 68, 71, 72, and 74, on the Vsen signal line shown in FIG. 7A. The signal flow chart of FIG. 7A is conveniently broken into sixteen steps as numbered at the bottom of the chart. ADC 44 measures voltages during pulses as shown by the Vsen signal line shown in FIG. 7A. The present innovation may be utilized to perform the selection function by exploiting the nonlinear saturation and magnetization characteristics of transformers. In this embodiment, an individual transformer is addressed and the corresponding cell selected by alternately pulsing its row winding with positive pulses and its column winding with negative pulses.

As a general explanation of one embodiment of operation, when a row winding and column winding are alternately pulsed, all the transformers that share the sense winding fall into one of 4 classes.

A first group of transformers receives no pulses because neither their row nor column windings are pulsed. These transformers do not affect the amplitude of the pulse on the sense winding, which is measured by analog to digital converter (ADC) 44.

A second group of transformers receive only positive pulses on their row windings. After one or more pulses, these transformers will be saturated in a desired magnetic state. After several such pulses, they contribute negligibly to the sense winding pulse detected by ADC 44.

A third group of transformers receive only negative pulses on their row windings. After several such pulses, they are also saturated and will contribute negligibly to the sense winding pulse detected by ADC 44.

Finally, a selected transformer at the intersection of the selected row and column receives both positive row pulses and negative column pulses. This transformer alternates between positive and negative pulses. This transformer becomes the only transformer to produce a significant contribution to the sense winding. The positive pulses will forward bias the diode connected to the corresponding cell. This puts a small charge current into that cell, which when repeated may be utilized for balancing the associated battery cell. The voltage of the positive pulse is set by the diode forward voltage drop and the cell voltage.

A detailed description of measurement steps for all four cells of battery assembly 10 of FIG. 6 is as follows:

Measure Voltage of Cell B00 (Row 0, Column 0)

1: Control electronics 50 is utilized to close row switch 64 to set all transformer fluxes in row 0 to a first flux state, which may be referred to as a positive flux state. Looking at the signal flow chart, SR0 (FIG. 7A) shows the positive pulse applied to row switch 64 by control electronics 50. When current from current supply 44 flows through the row windings, this saturates the cores of TX00 and TX01 (row 0) to a positive magnetic flux state as shown in signal flow chart 7A. Row switch 64 is then opened as indicated by the pulse in SR0 of signal flow chart 7A. It will be noted that TX00 and TX01 are in row 0 based on their matrix identifier rather than being physically shown as being in a row 0. As discussed above, the terms "row" and "column" as used herein are not limited to physical rows and columns. Instead "row" and "column" are simply terms to describe groups of cores that have common intersections, which intersections are more easily visualized when discussing columns and rows.

2: Reset all fluxes in column 0 to a negative magnetic flux state by closing column switch 66. In other words, control electronics 50 applies a momentary pulse that closes column switch 66, allowing current from current supply 42 to flow through the column windings that are connected as column 0. In particular, this saturates TX00 to a negative magnetic flux state. Note that Vsen goes to a negative value, namely, −Vsup. This pulse has a longer duration to reset multiple transformers. See also the equivalent circuit shown in FIG. 5B, which is discussed hereinafter.

3: Again, momentarily close row switch 64 to set fluxes in row 0 to a positive magnetic flux state. This will only result in flux change in TX00. The other transformers do not change their magnetic state and therefore do not induce current in the sense winding. Thus, at this time, Vsen=$V_{B00}$+Vdiode. The voltage measurement may be taken after the initial spike on Vsen, such as in middle of pulse. Vsen is measured by ADC 44. See also the equivalent circuit shown in FIG. 5A, which is discussed hereafter. In other words, the voltage of a particular battery cell, namely battery cell B00 has now been measured in accord with one embodiment of the present innovation. The process goes on to measure the voltage of all four battery cells.

Measure Voltage of Cell B10 (Row 1, Column 0)

4: Reset fluxes in column 0 to a negative magnetic flux state, e.g. control electronics 50 momentarily activates relay 66.

5: Set the fluxes in row 1 to a positive magnetic flux state, e.g., activate relay 70. The Vsen measured by ADC 44 will now be the sum of two battery voltages (plus diode drops) because two magnetic flux states change to a positive magnetic flux state, namely that of TX10 and TX11 as shown in FIG. 7A.

6: Reset column 0 fluxes to a negative magnetic flux state. This changes only TX10 to a negative magnetic flux state, as shown in FIG. 7A.

7: Set the fluxes in row 1 to a positive magnetic flux state. This will only result in flux change in TX10, and Vsen=$V_B10$+Vdiode. The voltage measurement may be taken after the initial spike on Vsen, such as in middle of pulse.

Measure Voltage of Cell B01 (Row 0, Column 1)

8: Reset column 0 fluxes, e.g., activate switch 66.

9: Set row 0 fluxes, e.g., activate switch 64.

10: Reset all column 1 fluxes negative, e.g., activate switch 69.

11: Set the fluxes in row 0 to a positive magnetic flux state, e.g., activate switch 64. The magnetic flux state of TX01 goes high, as shown in FIG. 7A. The voltage pulse will read Vsen=$V_{BO1}$+Vdiode, when the voltage measurement is taken after the initial spike, such as in the middle of pulse.

Measure Voltage of Cell B11 (Row 1, Column 1)

12: Reset column 1 fluxes to a negative magnetic flux state, e.g., activate switch 69. As shown in FIG. 7A, the magnetic flux state of TX01 saturates negative. The magnetic flux state TX11 is already negative.

13: Set row 1 fluxes, e.g., activate switch 70. Since two cores change, Vsen is the sum of two battery voltages (plus diode drops). The magnetic flux state of TX11 goes positive.

14: Reset column 1 fluxes to a negative flux state. The magnet flux state of TX11 goes negative.

15: Set the fluxes in row 1, e.g., activate switch 70. Then, Vsen=$V_B11$+Vdiode. The voltage measurement may be taken in middle of pulse.

16: Reset column 1 fluxes.

Figure 7B:
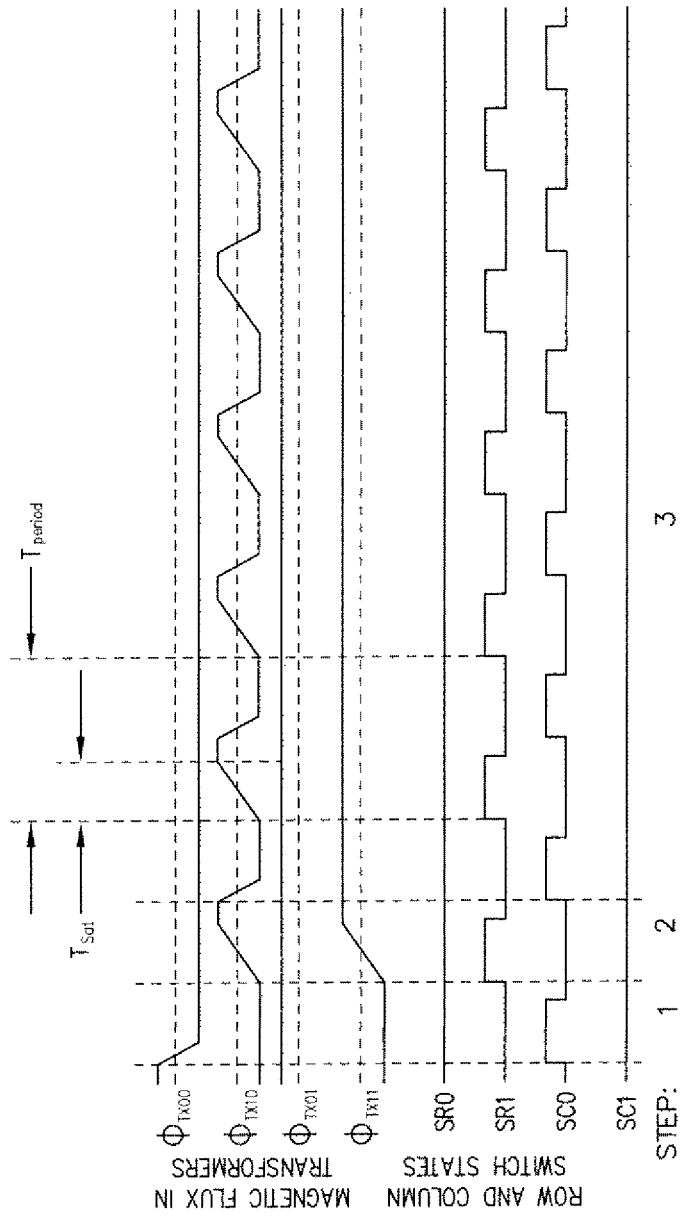
FIG. 7B is a pulse diagram example of selected measurement points in the 2×2 battery cell array of FIG. 7A during possible steps to balance battery cell B10 of the 2×2 battery cell array in accord with one possible embodiment of the innovation.

FIG. 7B is a signal diagram that illustrates the signals involved in cell balancing. In this example, cell B10 of FIG. 7A is balanced, i.e., charge is added to cell B10. As seen above, any cell could be selected to balance.

Steps involved in balancing cell B10 (row 1, column 0):

1: Set column 0 fluxes to a negative magnetic flux, e.g., pulse switch 66 as shown in step 1 of FIG. 7B via control circuitry 50. Then the magnetic flux state of TX00 and TX10 are both saturated negative.

2: Set all transformer fluxes in row 1 to a positive magnetic flux, e.g. pulse switch 70. Both TX10 and TX11 are now saturated to a positive magnetic flux state.

3: Reset all fluxes in column 0 negative. Only TX10 goes to a negative magnetic flux as shown in FIG. 7B. Then, alternate applying pulses between switch 70 for row 1 (SR1) and switch 66 for column 0 (SC0). The flux state of TX10 alternates between saturating positive and negative. This process acts as a simple switching power supply and charges B10 with the following current:

$$I_{charge} = I_R * (T_{sat}/T_{Period})$$

where $T_{sat}$ (the time for saturation) and $T_{period}$ (the period of the recharging cycle) are shown in FIG. 7B

In this way, if a cell is measured as being below the voltage of other cells, the cell can be balanced or charged up. The cell voltage can be simultaneously monitored as shown in step 7 of the cell voltage measurement as shown in FIG. 7A. In the disclosed embodiment, charge current may range up to a few hundred milliamps. The charge current can be increased with additional transformer winding turns. It should be noted that a "transformer winding" as used herein might go through the transformer core without looping around the core.

While only charging is illustrated, if the diodes are replaced with switches, such as FETs, so that current could flow in either direction through the batteries, then the same techniques discussed hereinbefore may be utilized to select particular cells for either adding charge to or subtracting charge from individual battery cells. Accordingly, the present innovation is not limited to only charging batteries for balancing.

The battery connector(s) pin count is kept quite efficient in accord with the present innovation. For example, if the battery has N cells, and N Is less than or equal to the number of rows (R) times the number of columns (C), then the total number of connector pins would be R+C+4. There would need to be one for each row, with one common to all rows, one for each column, one common to all columns, and two for the sense winding, for a total of R+C+4.

For numbers of cells less than about 10, the direct sense line connection may be optimum. However, for batteries with more than about 30 cells, the number of contacts for direct sense lines (the standard battery practice) in the prior art is more than double that necessary for the present innovation.

Figure 5A:
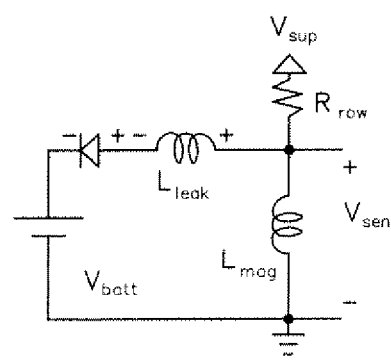
FIG. 5A is an electronic schematic diagram which shows an equivalent circuit for a saturable transformer after closing row switch in accord with one possible embodiment of the innovation.

In more detail of operation of both cell measurement and balancing, and referring to FIG. 5A and the Vsen line in FIG. 7A, there is shown an equivalent circuit after initial closing of the row switch where the magnetic flux is initially negative for the circuit but then eventually saturates with a positive magnetic flux. The sense line Vsen therefore detects a positive pulse. The leakage inductance causes an initial spike on Vsen, as shown on the leading edge of positive pulses in FIG. 7A. The time constant that sets the time for leakage inductance to charge up can be adjusted by selection of $V_{sup}$ and $R_{Row}$, which form the current supply. During this step, charge is also supplied to the battery as discussed hereinbefore. In one preferred embodiment, the time for leakage inductance to charge up is less than half of the time for the core to saturate to permit good measurements. However, this time may be considerably faster. In this embodiment, after the leakage inductance spike has died down, then $$V_{sen} = V_{batterycell} + V_d$$

where $V_d$ is the voltage drop across the diode, and $V_{battery\ cell}$ is the battery cell voltage.

Figure 5B:
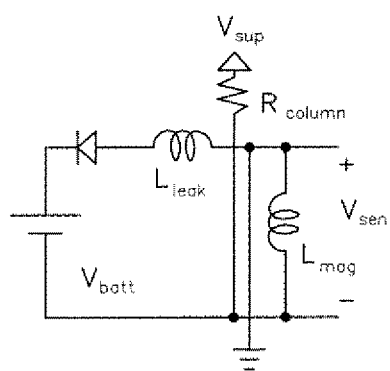
FIG. 5B is an electronic schematic diagram which shows an equivalent circuit for a saturable transformer column after closing column switch in accord with one possible embodiment of the innovation.

FIG. 5B shows the equivalent circuit after closing the column switch, whereupon the magnetic flux eventually changes from positive to negative. The diode in this case is reverse biased because the column winding is oppositely wound than the row winding. See for example row winding 34 and column winding 38 in FIG. 1. After the column switch is closed, Vsen goes to −Vsup until the core saturates. This can be seen as the negative pulses on the Vsen trace in FIG. 7A. When more transformers change magnetic flux states, the negative pulse is wider.

Figure 8:
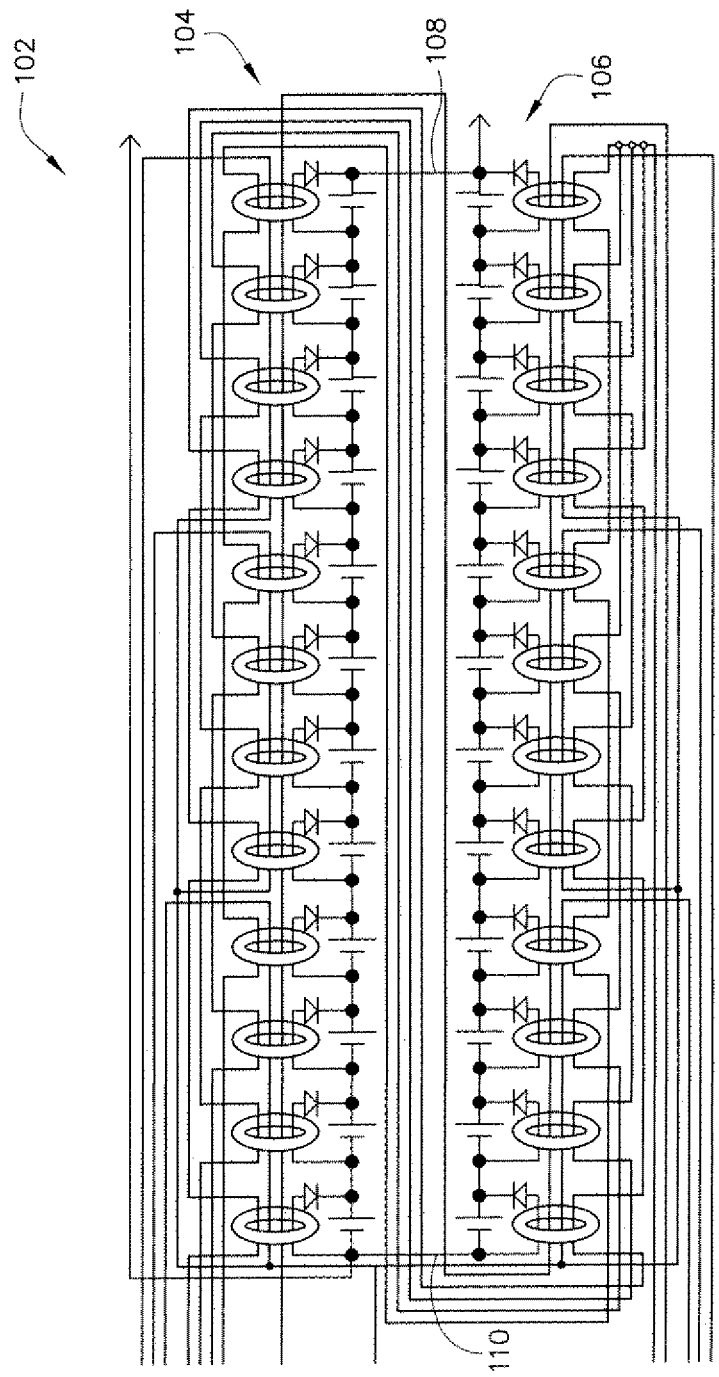
FIG. 8 is an electronic schematic diagram showing two parallel strings of series connected battery cells in accord with yet another possible embodiment of the innovation.

Referring now to FIG. 8, there is shown series parallel circuit 102, which discloses one of many possible variations of the present innovation. In this example, series connected strings of cells 104 and 106 are connected in parallel as indicated by parallel connections 108 and 110. It will be appreciated that each individual battery cell is associated with a transformer as discussed hereinbefore. Therefore, each battery cell voltage may be individually measured and the cell balanced as discussed hereinbefore.

Referring to FIG. 9, there is shown another of many possible variations, namely series bank circuit 112. In this example, subsequent parallel-connected banks of battery cells are also connected in series. In FIG. 9, representative battery cell banks 114 and 116 each have three cells connected in parallel, although other numbers of cells may be connected in the banks. With each bank is associated a transformer whereby the voltage of each bank may be measured and balanced.

Another possible embodiment of the present innovation is shown in FIG. 10 where circuit 118 may utilize additional transformers besides those used to measure and balance cells, e.g., transformers TX02 and TX12. In this example, TX02 and TX12 are connected to precision voltage references 120 and 122. Voltage reference 120 may be set to a maximum normal cell voltage. Voltage reference 122 may be set to a minimum normal cell voltage. In this way, measurements by analog to digital converter 44 (see FIG. 1) may be accurately calibrated automatically, perhaps with each cycle of measuring battery cell voltages.

Although many types of precision voltage references are available, one type of suitable voltage regulator may comprise a TL431 or similar type connected to the transformer utilizing the same type of diode such as diode 32 shown in FIG. 4. In this example, the transformer and the diode, which may be the same as those used for measuring the battery cells, are connected to a shunt voltage reference and capacitor. The capacitor is charged up by the diode, and its voltage is limited by the shunt. The control electronics 50 (see FIG. 1) may then be programmed to perform an auto calibration at any desired intervals to reduce cell voltage measurement inaccuracies. In sum, measurement accuracy may be improved by including one or more of these voltage reference channels that include matching circuitry as that utilized for measuring the battery cell voltages.

FIG. 11 shows a physical layout of one possible configuration 124 of diode 128 and cores 126. In this embodiment, several small cores 126 are connected in series, which improves the mechanical form factor.

Thus, in one possible embodiment of the innovation, an array of saturating transformers are connected by diodes to a plurality of battery cells. Each transformer may have a row winding, a column winding, and a sense winding. A particular transformer may then be addressed by alternately applying positive pulses to its row winding and negative pulses to its column winding. Other transformers that share these windings will saturate with a desired magnetic flux direction as they receive pulses of only one polarity. The voltage of the corresponding battery cell can be measured by an analog-to-digital converter connected to the sense-winding common to all the transformers as energy is transferred to that cell through the diode. Operation of battery cell selection requires transformers that once magnetized (saturated) in one direction, hold their magnetization so that the magnetic field in the core changes only a small amount if the magnetization pulse is repeated. Transformer cores with a "square loop" are designed to have this property.

In the above example, when the selected transformer receives a train of positive and negative pulses, the amplitude of the negative pulses is set by the pulse generation circuitry. The amplitude of the positive pulses is limited by the battery voltage and the forward conduction voltage of the diode associated with the cell. There will be an initial transient caused by the leakage inductance associated with the diode and cell connection. The capacitance of the cell and the cell resistance also affect the pulse shape.

Measuring the cell voltage transfers a small amount of charge to the cell. If this is done repeatedly, a quantity of charge will be transferred to the battery. The average current is limited by the positive current pulse amplitude, which is limited by requirements of voltage monitoring. In one embodiment, this level of charge current is thereby automatically limited. Balancing charge may be provided after the main charge is provided by a main charger.

Many variations or additions of the embodiments of the innovation discussed hereinbefore are possible. For instance, For instance, a current sensor may be utilized to sense the magnetic saturation and thereby more accurately eliminate or reduce unnecessary pulses and control the required pulse length. While Vsen presently measures the pulse height, it is also possible to obtain measurements of measurements of battery cell charge by measuring other aspects of the voltage pulse such as slope, length, and the like of the voltage pulse. Compensation may be provided for diode voltage drops such as MOSFET devices or other devices to eliminate the diode drop on the cell side. Thus, additional circuitry can be provided on the cell side of the transformers. Multiple turns on the saturating transformers can be used to extend pulses, change voltages, and/or allow higher charge currents. Soft turn-on of row and column switches can be used to compensate for stray inductance. Adjustable row and column switch current sources can be used to optimize measurement and balancing. Parallel/series arrangements of diodes or other elements can be utilized to improve failure tolerance. Transistors, MOSFET devices, and the like may be utilized in place of diodes.

Figure 12:
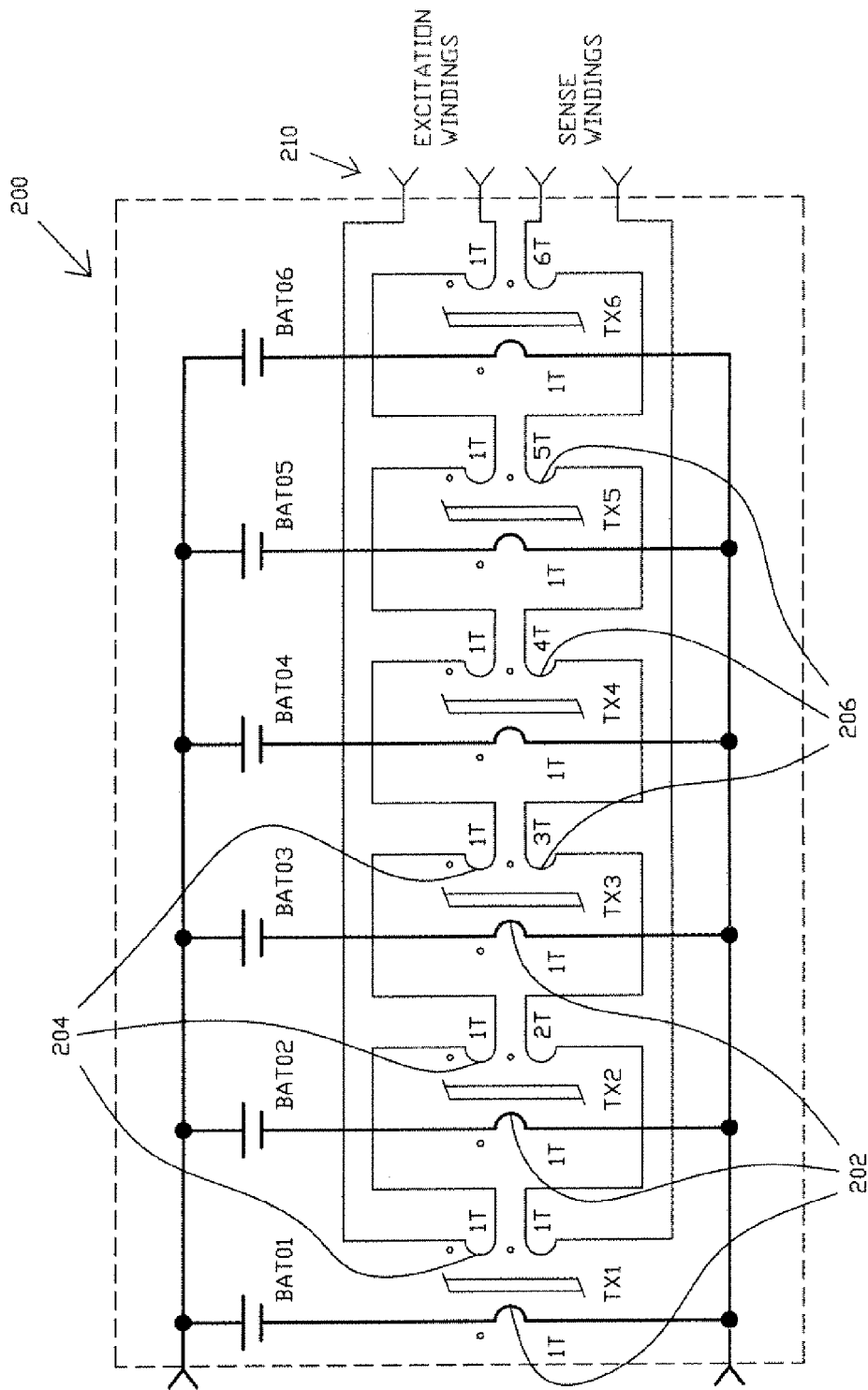
FIG. 12 is a circuit diagram showing a battery with a plurality of battery cells and monitoring network which allows the health of individual battery cells to be monitored in accord with one possible embodiment of the present innovation.

In another embodiment, it is not necessary to address individual or groups of transformers or provide semi-conductor switching devices. Accordingly, FIG. 12 shows battery fault detection system 200. The battery assembly in battery fault detection system 200 has only six battery cells BAT01-BAT06. However, as discussed hereinbefore, the detection systems disclosed herein may be utilized with large numbers of battery cells. In this example, each battery cell has an associated transformer TX1-TX6.

Although not required in all embodiments, in this embodiment each transformer has three windings. Battery windings, as indicated at 202, may comprise a single turn in series with the monitored cell. In this embodiment, each excitation winding 204 comprises a single turn. In this embodiment, the excitation windings 204 are in series with each other for all of the transformers.

In this embodiment, each transformer also has a sense winding 206 comprising one or more turns. Sense winding 206 can be provided in series with the sense windings of the other transformers. In this embodiment, the number of turns will be different for each transformer so that each transformer has a different number of turns as compared to the remaining transformers. In this example, the number of turns for each transformer is indicated on FIG. 12 and ranges sequentially from one turn or pass through the transformer core to six turns or passes through the transformer core. Other numbers of turns might be utilized if desired.

Figure 13:
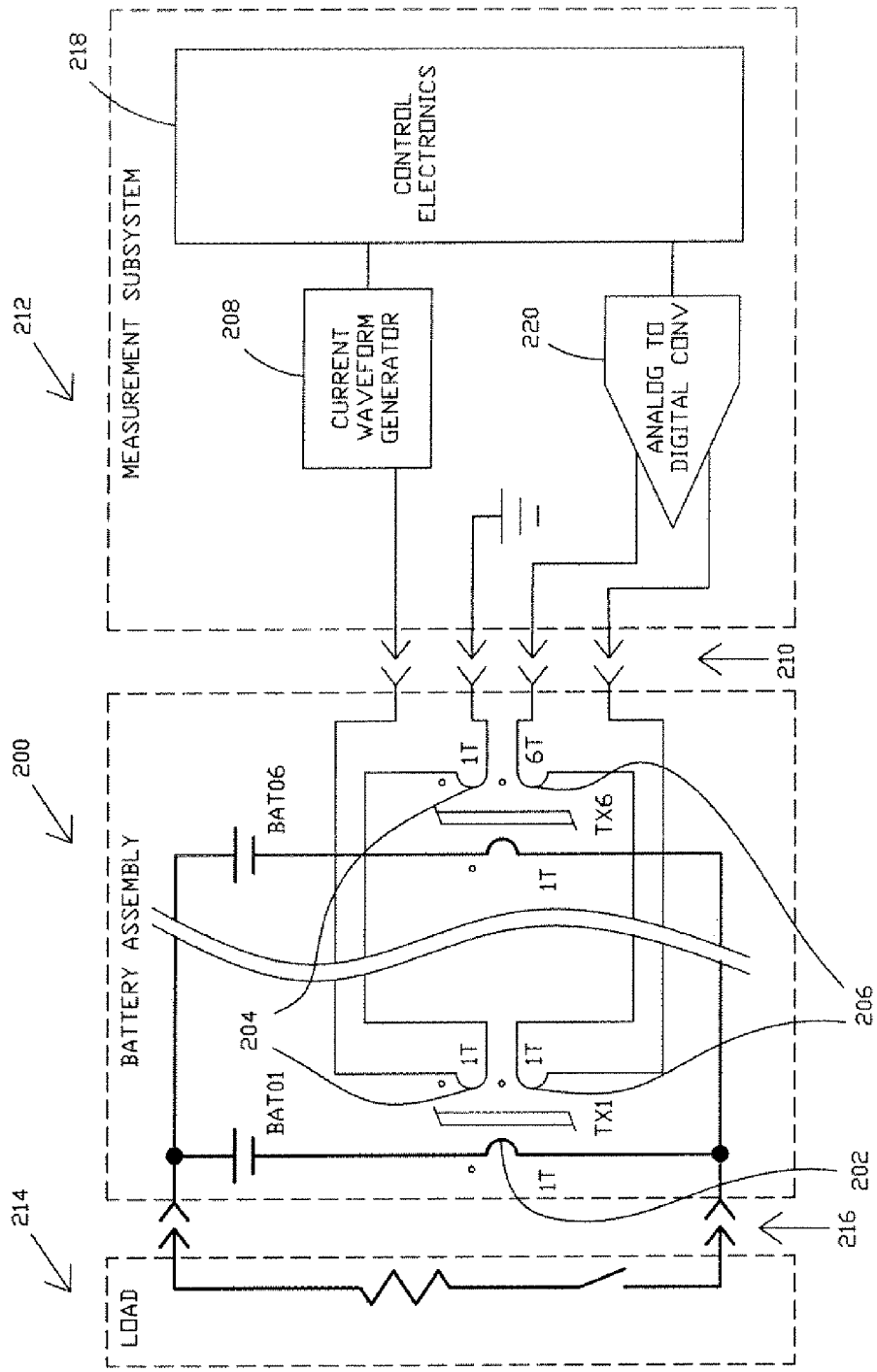
FIG. 13 is a circuit diagram showing a load, battery assembly, and measurement subsystem which allows the health of individual battery cells to be monitored in accord with one possible embodiment of the present innovation.

As shown in FIG. 13, excitation windings 204 are supplied with a current waveform from current waveform generator 208. For example, current waveform generator 208 may produce a current waveform with a positive going zero crossing portion, such as a bipolar triangular wave, or a sine wave. The waveform should be of sufficient amplitude or power to swing the transformer cores from being magnetically saturated in one direction, to being unsaturated, and then to being magnetically saturated in the other direction. A voltage pulse may appear at sense windings 206 of each transformer when the core of the transformer is momentarily unsaturated.

In operation, when the total current of the transformer excitation windings 204 passes through zero, the transformers may momentarily become unsaturated, and at that time may induce a voltage pulse on each of sense windings 206. Since excitation windings 204 pass through all the transformers with the same number of turns, they may each have the same excitation current waveform. As well, if each battery cell current through battery windings 202 is the same, then all the transformers may pulse at the same time. A healthy battery may show a single large pulse on the sense winding. This pulse may be composed of simultaneous pulses from each transformer added together.

However, if any battery cell current through the associated battery winding 202 is different, making the total current through winding 204 different, then the transformer for that cell will pulse at a different time than the others. A battery with a poorly performing cell (one that is providing significantly less current than the other cells) will show two pulses, one corresponding to the poorly performing cell, and the other corresponding to the good cells. In this embodiment, the deviant cell will be identifiable by the amplitude of the pulse due to the different number of turns in the associated sense winding 206. If a particular cell produces less current, then the amplitude of the pulse for the associated transformer will correspond to the number of turns on the sense winding.

In one preferred embodiment, the innovation is intended to be operated during test and verification operations of the battery, and not during normal load operations. However, the innovation may be operated during load checks of the battery or during operating phases when the current consumption is well characterized.

Battery fault detection system 200 may be implemented with numerous alternate embodiments. As examples, all the sense windings and excitation windings may have one turn. In this case, a bad cell is sensed but the particular cell is not identified. In another possible embodiment, a separate sense winding is not used and instead a back EMF is sensed on the excitation winding, making the construction even simpler. In another embodiment, if there are many parallel strings of battery cells that make up a battery, then battery fault detection system 200 might be utilized to locate a faulty string of battery cells. Many other possible configurations are possible when using transformers for detection of underperforming battery cells, some of which are discussed herein.

Placing series transformers TX1-TX6 on each battery cell BAT01-BAT06 will affect the battery impedance. However, this effect can be significantly reduced by selecting "square loop" transformers or saturable core transformers, as discussed hereinbefore. These transformer cores are constructed of a material that, once magnetized, holds its magnetization.

This means that once load current is first applied to the battery, the transformers may all become magnetized (saturated) in the same direction. The transformers may stay in this saturated, low inductance state until current reverses (charge current). Suitable transformer cores for this purpose have been discussed hereinbefore. Generally, the weight of the transformer cores operable to provide the above described functions can be less than 10 grams and may be less than 5 grams. Larger transformer cores could also be utilized, especially where weight is not a significant concern.

As discussed previously, the transformers provide electrical isolation for battery monitoring system 200 to reduce the danger of shocks. The embodiment of the innovation shown in FIG. 12 adds a small four-pin connector to the battery. If it is not desired to use the transformers for charging/balancing the battery cells, then switching elements such as diodes, transistors, and FETs need not be connected to the transformers as have been used in some embodiments discussed hereinbefore.

FIG. 13 shows battery monitoring system 200 for a battery assembly in conjunction with measurement subsystem 212 and load 214. Load 214 may be connected to the battery assembly via connector 216.

Measurement subsystem 212 may be mounted outside the battery assembly and is then connected thereto via four pin connector 210. Measurement subsystem 212 provides excitation current to excitation windings 204 utilizing current waveform generator 208, which may be controlled with control electronics 218. Current waveform generator 208 may provide a current waveform with a controlled ramp rate across zero current. Current waveform generator 208 may be implemented in different ways. For example a square wave may be produced for driving an inductor to thereby produce a triangular current waveform. As another possibility, a sine wave current waveform, or the like, could be utilized.

Analog to digital converter 220 may be connected to sense windings 206 as a signal detector for measuring the amplitude and timing of the pulses that appear on the sense winding. Control electronics 218 may then be utilized to analyze and/or report measured voltages to an operator or an external computer system or network.

With use of very long instrumentation cables, measurement errors in detecting pulses on the sense connections may result. However, controlled impedance cables combined with impedance matching networks may be utilized to compensate for this measurement error. The present innovation does not interfere with the use of an external battery charger.

Figure 14:
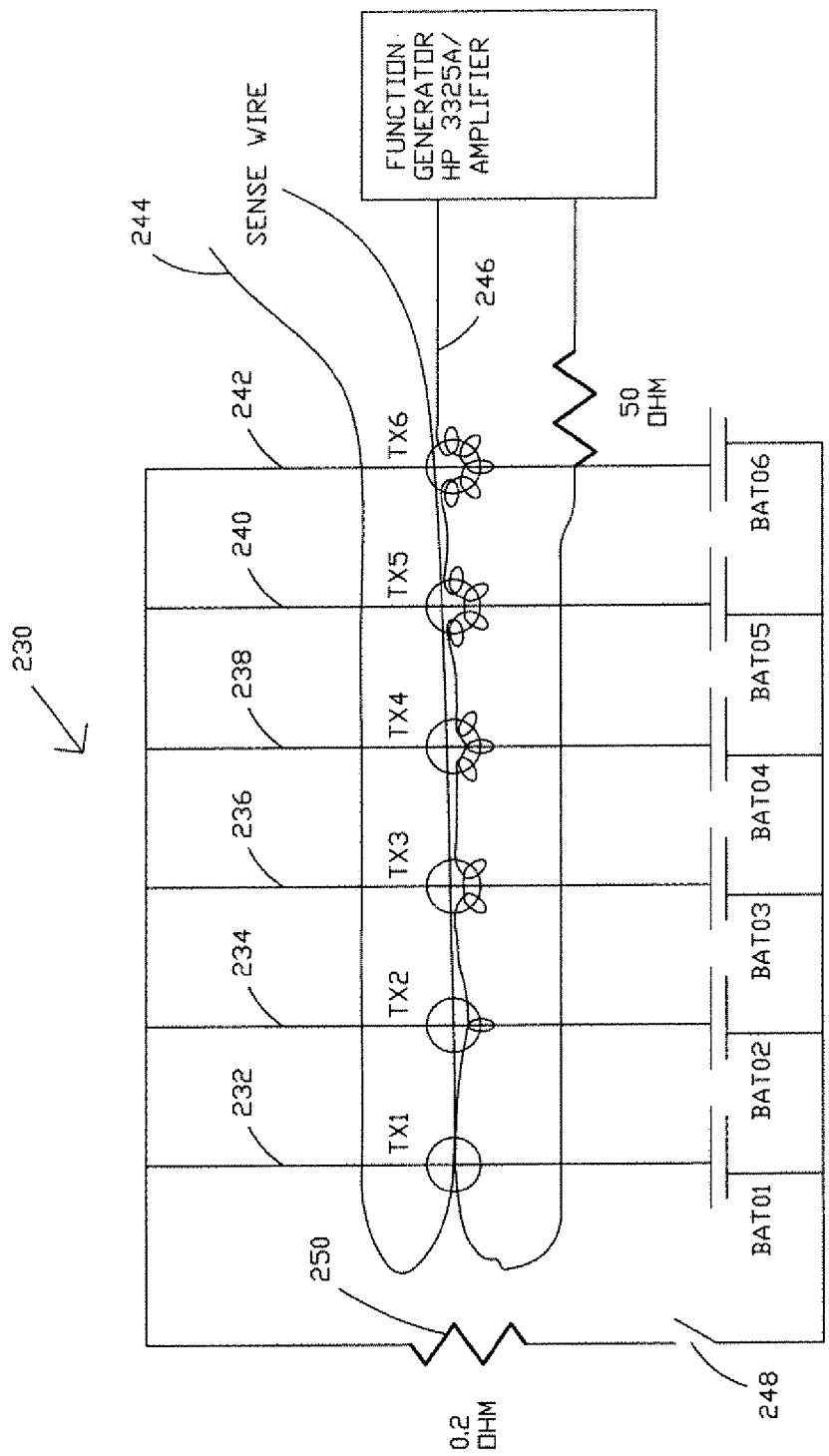
FIG. 14 is a circuit diagram for a prototype monitoring system with magnetic cores wound with different numbers of excitation windings which allows the health of individual battery cells to be monitored in accord with one possible embodiment of the present innovation.

FIG. 14 shows prototype battery monitoring system 230, which is utilized to produce signals as shown in oscilloscope views of FIG. 15 through FIG. 24. The signals are detected by analog to digital converter 220 and may be utilized to diagnose the health of the battery assembly. In this example, battery cells BAT01 through BAT06 of the battery assembly are connected in parallel. Saturable toroid magnetic cores, which may be round doughnut-like cores such as those shown in FIGS. 3A and 3B for example, can be utilized in transformers TX1-TX6. Wires 232, 234, 236, 238, 240, and 242 pass through and/or wrap around the cores of TX1-TX6 and also connect to corresponding battery cells BAT01 through BAT06. These windings of TX1-TX6 may therefore be referred to herein as the battery windings.

In this embodiment, sense wire 244 passes through each core and the two ends are connected to the oscilloscope (not shown), and may be referred to herein as the sense windings. Excitation wire 246 pass through each core and loop around each core with a sequentially increasing number of loops, and may be referred to herein as excitation windings. Excitation wire 246 effectively has one loop or pass through the core of TX1, two loops or passes through the core of TX2, and so forth. The ends of excitation wire 246 are connected to a current source created with a function generator and the 50 ohm resistor.

It may be noted that whereas in battery monitoring system 200 the excitation wire had only one loop and the sense wire had a variable number of loops, in this example sense winding 244 has only one loop or pass through the transformer cores and excitation wire 246 has a variable number of loops or passes through the transformer cores. Thus, this embodiment is not limited to either of these constructions. For that matter, the sense windings, the excitation windings, the battery windings, and/or combinations of these can conceivably comprise a variable number of loops through the transformer cores.

A 0.2 ohm resistor provides a known value for load 250 for testing the battery assembly. Load switch 248 may be opened or closed to disengage or engage load 250. To show the signals, an oscilloscope is utilized to provide visual measurements of peak voltage levels, which measurements can be used to detect faulty cells. However, other peak voltage detection circuitry, integrated circuits, and/or the like may be utilized to distinguish peak voltages.

Figure 15:
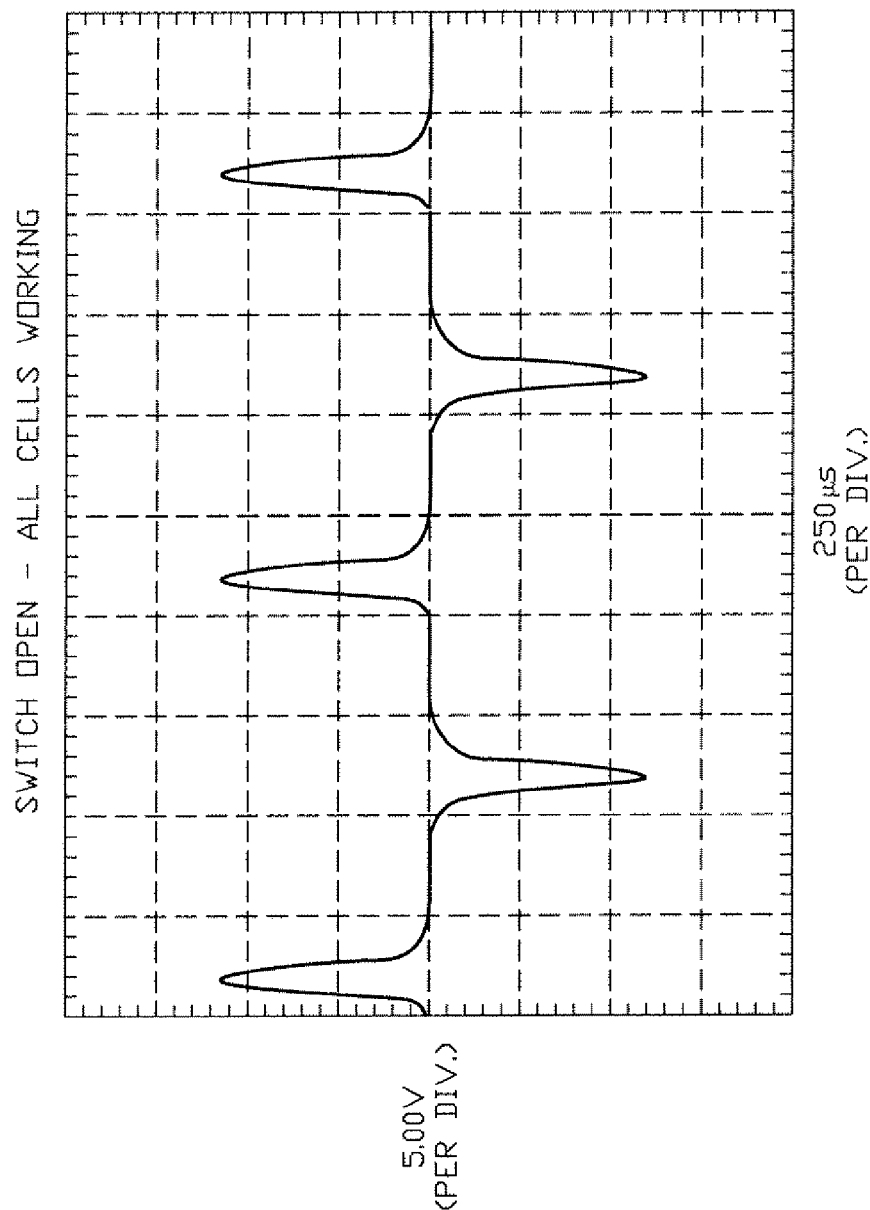
FIG. 15 is an oscilloscope measurement of the sense winding of the prototype monitoring system of FIG. 14 with all cells working and the load switch open in accord with one possible embodiment of the present innovation.

High power batteries may be constructed by connecting large numbers of individual battery cells in parallel. The purpose of this project was to develop a method to easily detect any faults in individual cells without the introduction of complex circuitry. Sense wire 244 detects the magnetic field variations in the transformers. When a cell has current going though it, the corresponding transformer hysteresis curve is adjusted eliminating the effect of the sine wave. FIG. 15 shows an example of all cells working with switch 248 open.

FIGS. 16-24 show the corresponding peak voltages with load switch 248 closed for various situations of battery assembly health. The load of resistor 250 in this case is known.

Figure 16:
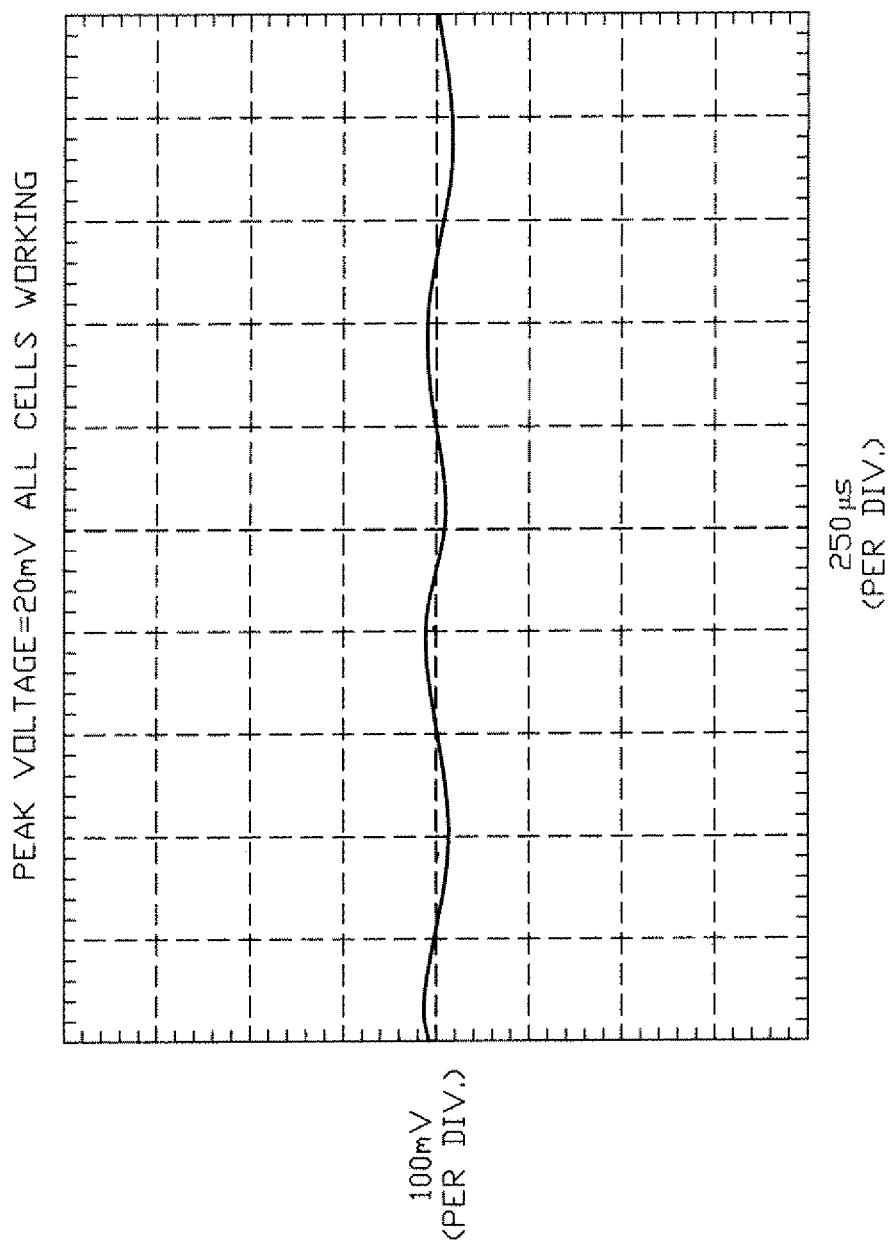
FIG. 16 is an oscilloscope measurement of the sense winding of the prototype monitoring system of FIG. 14 with all cells working and the load switch closed in accord with one possible embodiment of the present innovation.
Figure 17:
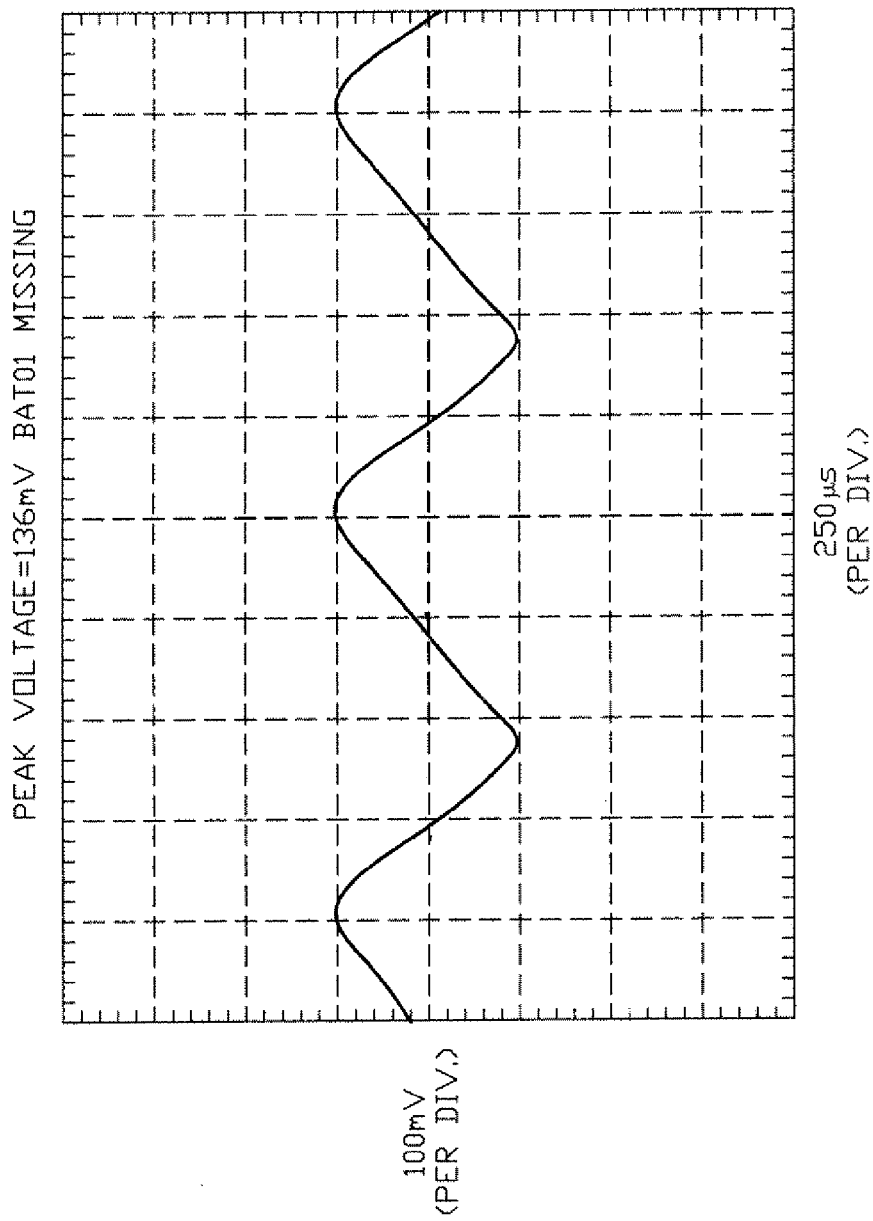
FIG. 17 is an oscilloscope measurement of the sense winding of the prototype monitoring system of FIG. 14 with cell one missing and the load switch closed to provide a peak voltage of 136 mV in accord with one possible embodiment of the present innovation.
Figure 18:
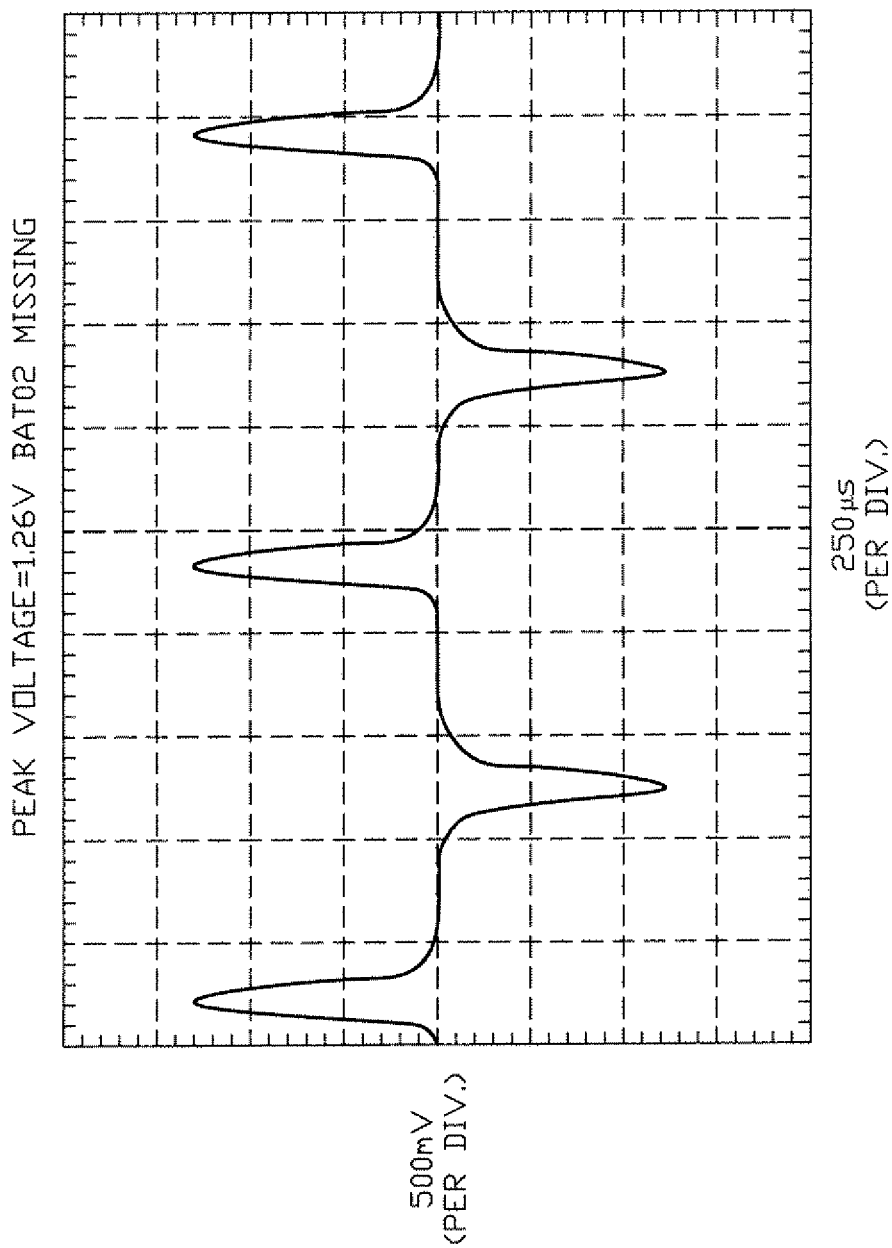
FIG. 18 is an oscilloscope measurement of the sense winding of the prototype monitoring system of FIG. 14 with cell two missing and the load switch closed to provide a peak voltage of 1.26 V in accord with one possible embodiment of the present innovation.
Figure 19:
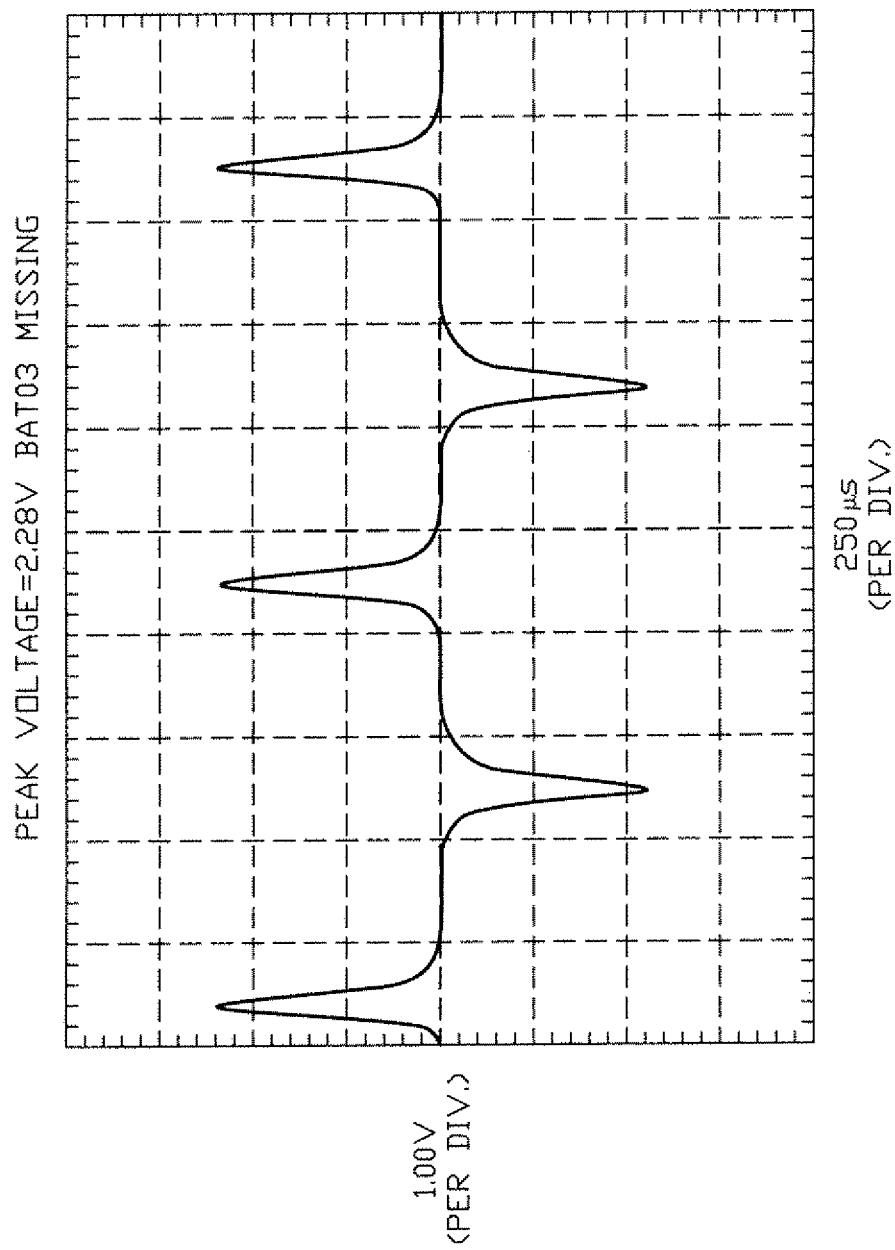
FIG. 19 is an oscilloscope measurement of the sense winding of the prototype monitoring system of FIG. 14 with cell three missing and the load switch closed to provide a peak voltage of 2.28 V in accord with one possible embodiment of the present innovation.
Figure 20:
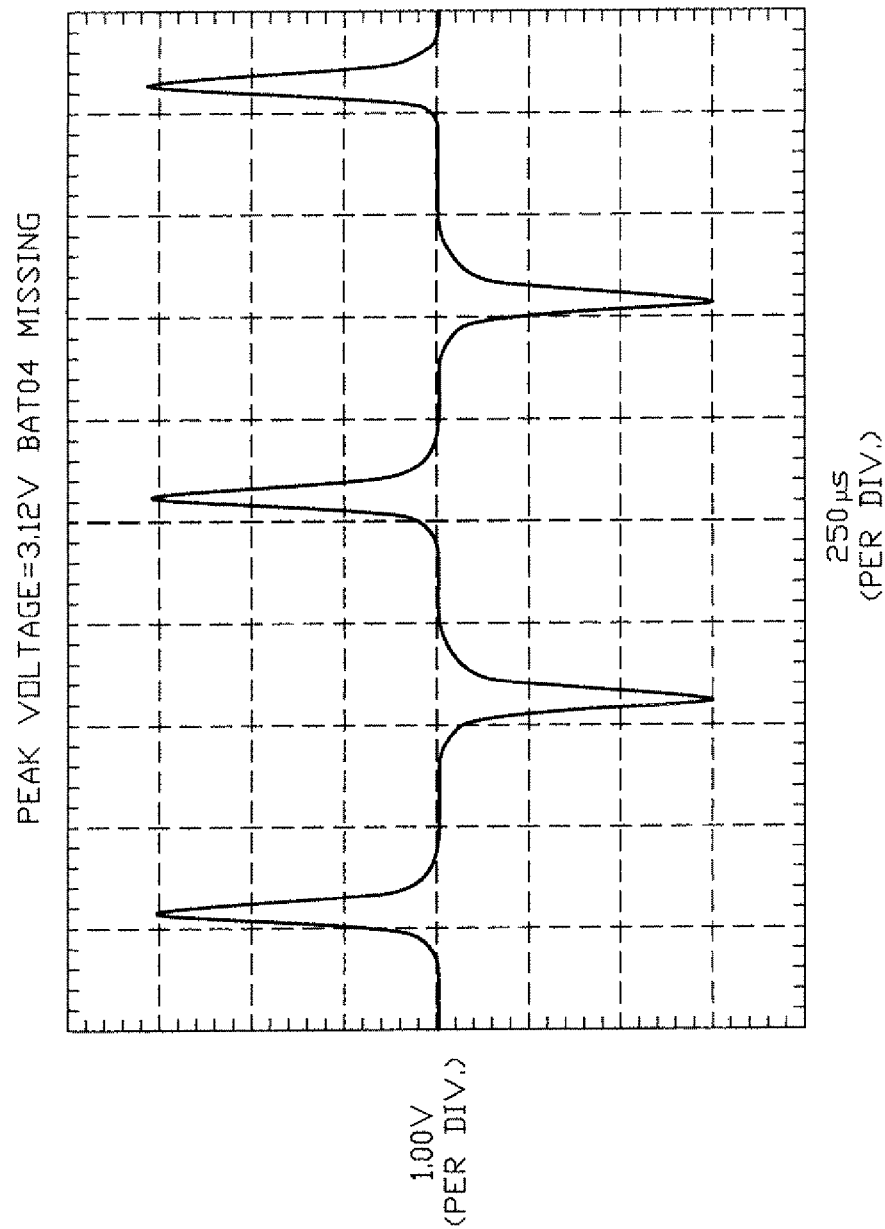
FIG. 20 is an oscilloscope measurement of the sense winding of the prototype monitoring system of FIG. 14 with cell four missing and the load switch closed to provide a peak voltage of 3.12 V in accord with one possible embodiment of the present innovation.
Figure 21:
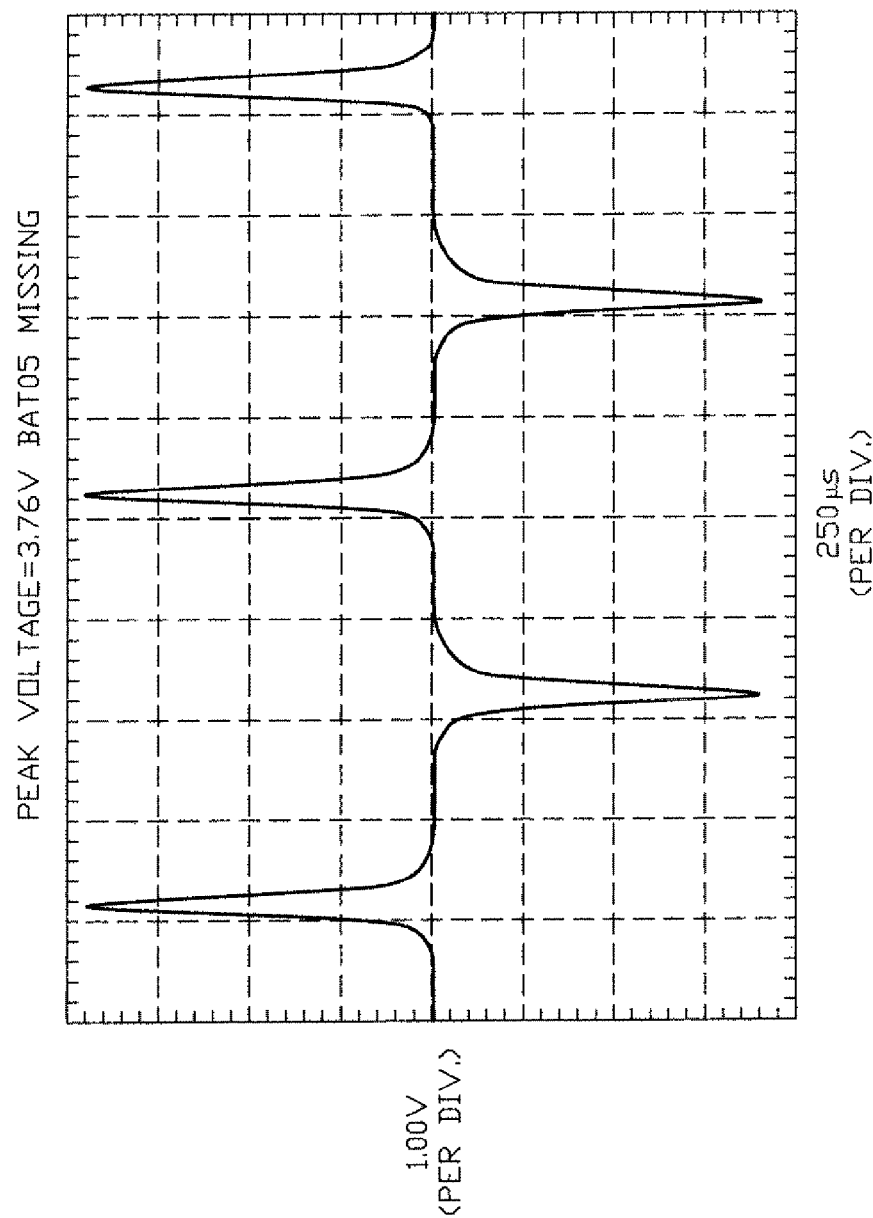
FIG. 21 is an oscilloscope measurement of the sense winding of the prototype monitoring system of FIG. 14 with cell five missing and the load switch closed to provide a peak voltage of 3.76 V in accord with one possible embodiment of the present innovation.
Figure 22:
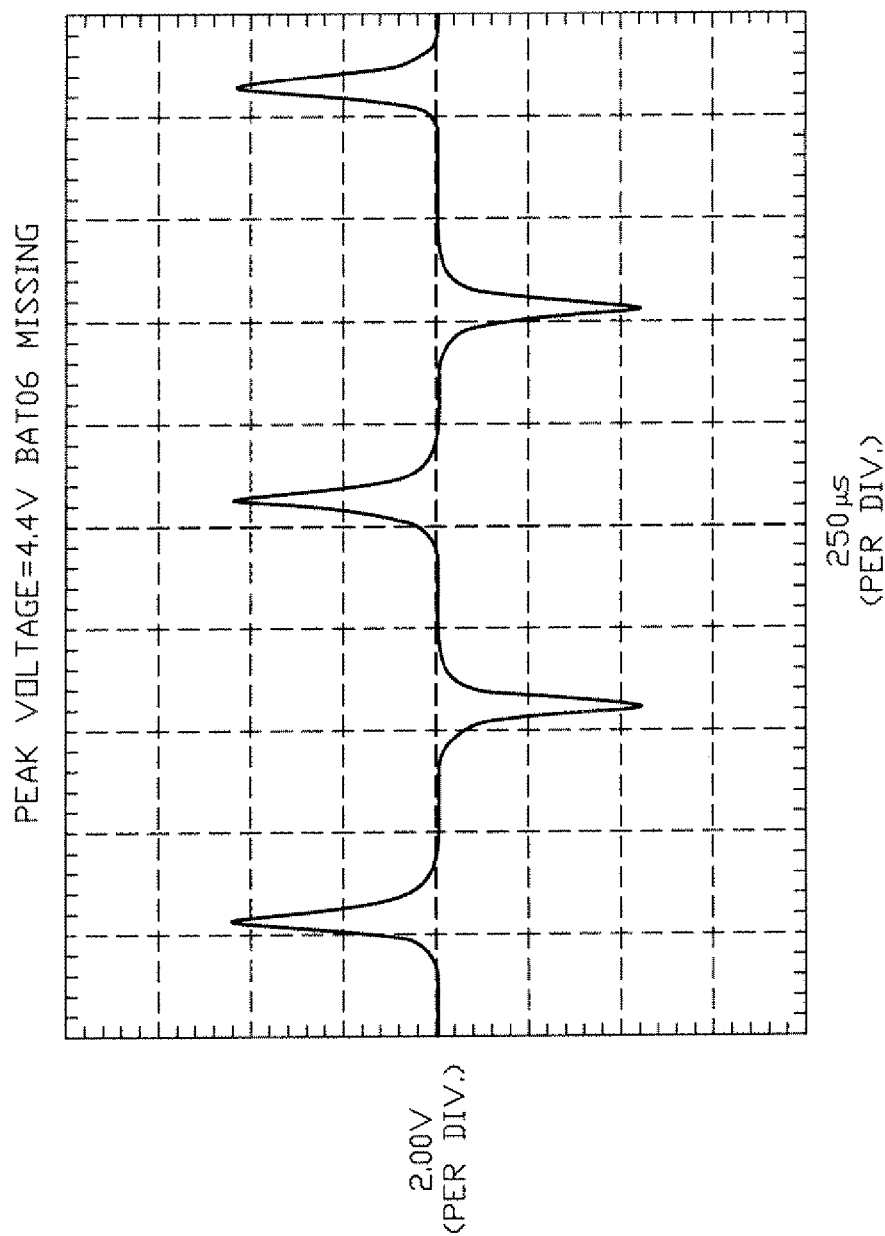
FIG. 22 is an oscilloscope measurement of the sense winding of the prototype monitoring system of FIG. 14 with cell six missing and the load switch closed to provide a peak voltage of 4.4 V in accord with one possible embodiment of the present innovation.

If a battery cell is missing, this produces a peak voltage level reading on the oscilloscope that corresponds to the cell that is missing because of the unique number of windings for each cell. The following figures from oscilloscope snapshots show the peak voltage with different battery cells missing and with switch 248 closed:

| FIG. 16 | All cells working | 20 mV |
|---------|-------------------|-------|
| FIG. 17 | BAT01 missing | 136 mV |
| FIG. 18 | BAT02 missing | 1.26 V |
| FIG. 19 | BAT03 missing | 2.28 V |
| FIG. 20 | BAT04 missing | 3.12 V |
| FIG. 21 | BAT05 missing | 3.76 V |
| FIG. 22 | BAT06 missing | 4.4 V |

Looking at FIG. 16, with the oscilloscope setting to 100 mV per division, and all cells working, there is very little amplitude. The peak voltage is approximately 20 mV. However, in FIG. 17, with BAT01 missing, and BAT01 having only one turn or pass through the core, a pulse is produced that has a peak voltage of 136 mV. Thus, an operator or computer can determine that BAT01 has a problem. In this prototype system, BAT01 may be disconnected to show this effect.

BAT02 has two turns or passes through the core and therefore produces a significantly larger pulse of 1.26 peak volts when BAT02 is missing as shown in FIG. 18. Likewise the peak pulses of BAT03-BAT06 are increasingly larger due to the increasingly larger number of turns for each associated transformer. As seen in FIG. 18-22, the peak voltage continues to increase due to the increasing number of turns for each respective battery cell, so that the missing battery cell is easily discernable.

If desired, a greater difference in peak voltages for the different situations can be produced if the associate number of turns or passes through the transformer cores has a greater difference. For example, BAT02 might have three turns, BAT03 five turns, and so forth.

As discussed hereinbefore, the fact that the cores saturate means that effects of the windings on battery impedance during normal operation is minimized. When the transformer is saturated, the transformer effectively quits operating. There is virtually no effect on battery DC and low frequency impedance. It is also possible to short out the sense and/or excitation windings when the monitoring system is not utilized to further reduce impedance effects.

Figure 23:
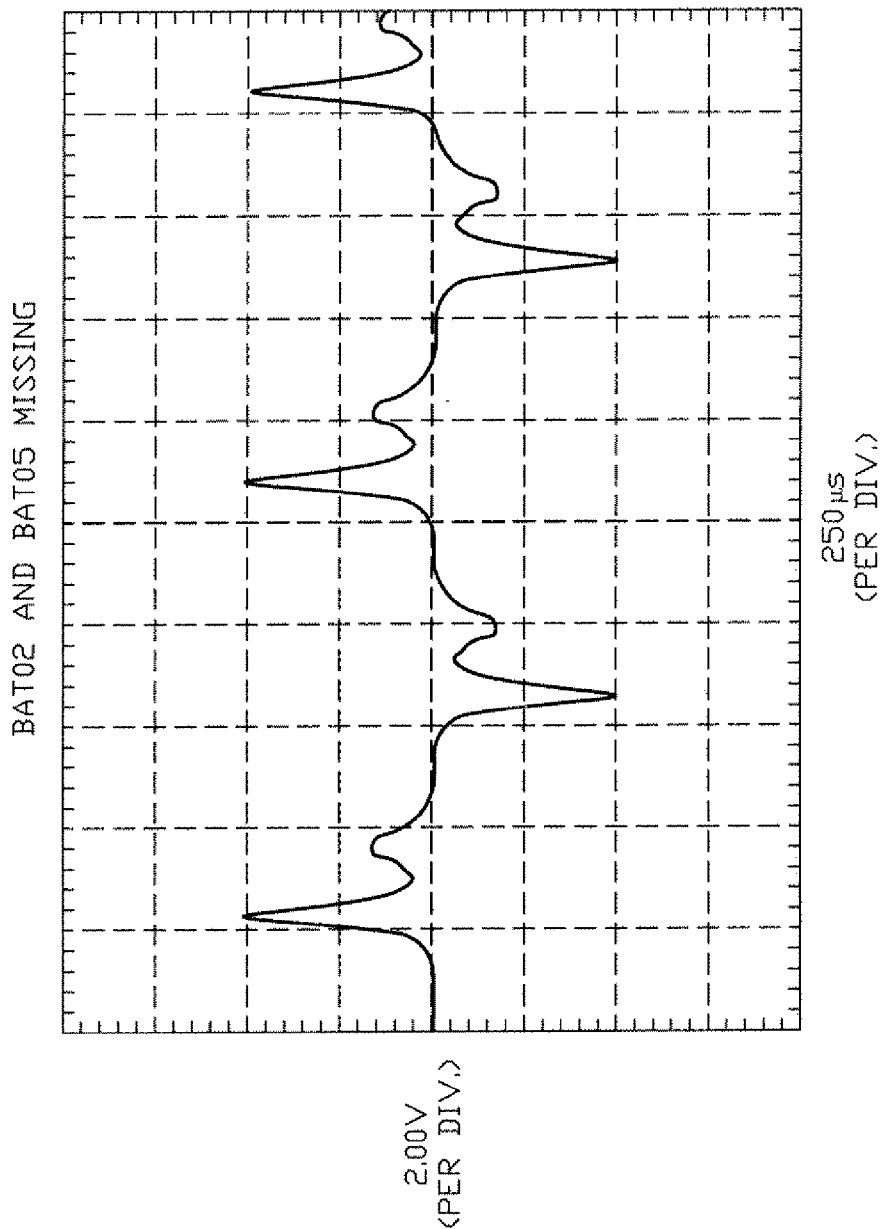
FIG. 23 is an oscilloscope measurement of the sense winding of the prototype monitoring system of FIG. 14 with cells two and five missing and the load switch closed in accord with one possible embodiment of the present innovation.
Figure 24:
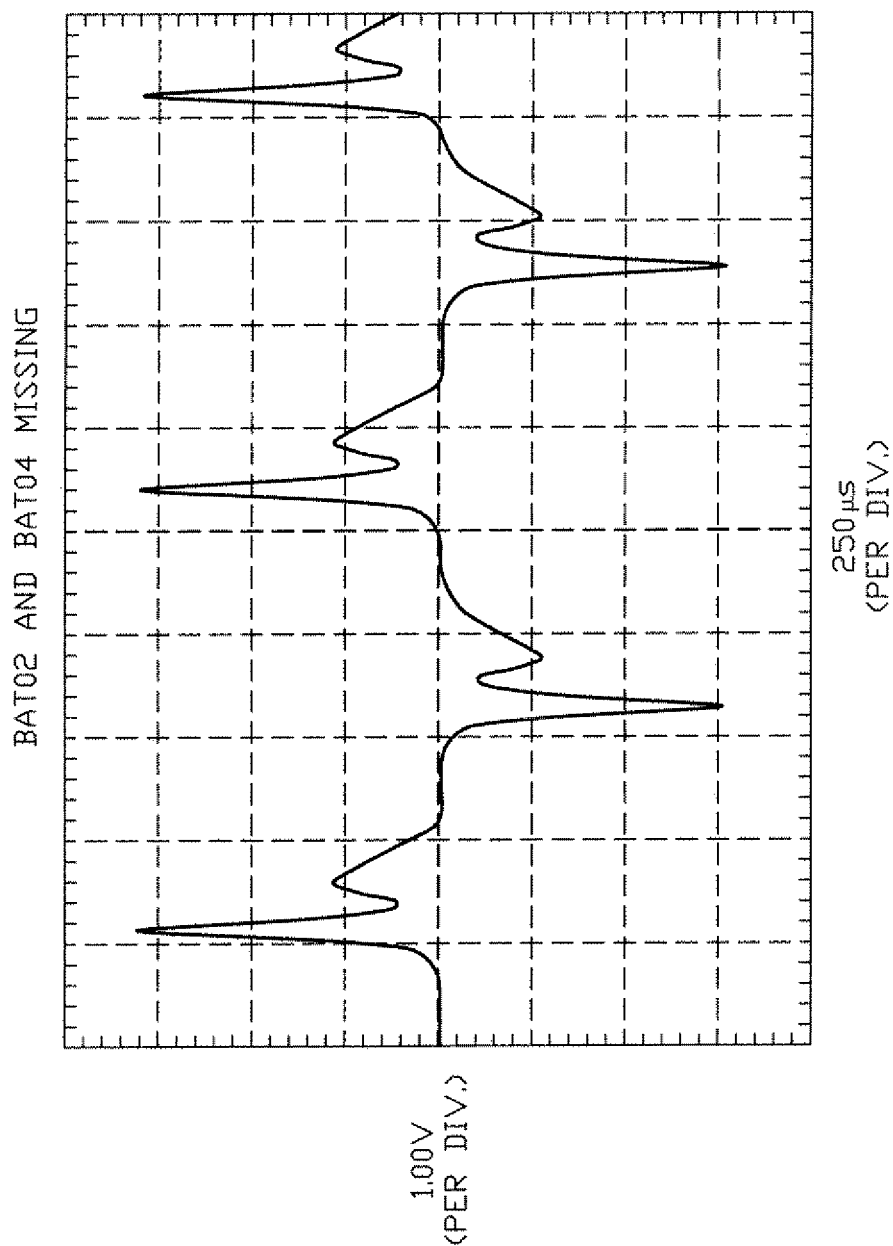
FIG. 24 is an oscilloscope measurement of the sense winding of the prototype monitoring system of FIG. 14 with cells two and four missing and the load switch closed in accord with one possible embodiment of the present innovation.

FIGS. 23 and 24 show instances of two cells malfunctioning or missing, whereupon two pulses are shown where previously there was only one pulse. For example, in FIG. 23 the amplitude of the pulses indicates that BAT02 and BAT05 are missing. In FIG. 24, BAT02 and BAT04 are missing. Accordingly, this embodiment of the present innovation is also able to detect the case when multiple cells are not performing correctly.

Many additional variations of the present innovation are possible. For example, in FIG. 25, there is shown monitoring system 300, which in one embodiment allows the health of numerous strings of battery cells to be monitored. In this example, the battery assembly comprises strings of battery cells S1, S2, S3, S4, S5, S6, S7 and S8 wherein each string comprises nine battery cells connected in series with each other. The strings of battery cells S1-S8 are connected in parallel to each other. For each string of battery cells S1, 82, S3, S4, S5, S6, S7 and S8, corresponding battery windings provide connections with corresponding. In this embodiment, each string need be connected to only one transformer through only one battery cell of the string of battery cells.

A minimum of electronics are utilized to monitor the health of a large number of battery cells. Thus, in this example, two pins are connected to only eight batteries, whereas the remaining sixty-four batteries do not require any connections to the monitoring system.

It may be noted that the monitoring system of FIG. 12 discussed hereinbefore could also be utilized to monitor strings of battery cells instead of single battery cells whereupon any malfunctioning string could be identified. In other words, monitoring system 200 of FIG. 12 could replace monitoring system 300 in the battery assembly shown in FIG. 25 for identifying which string of battery cells malfunctions, if any.

Figure 25:
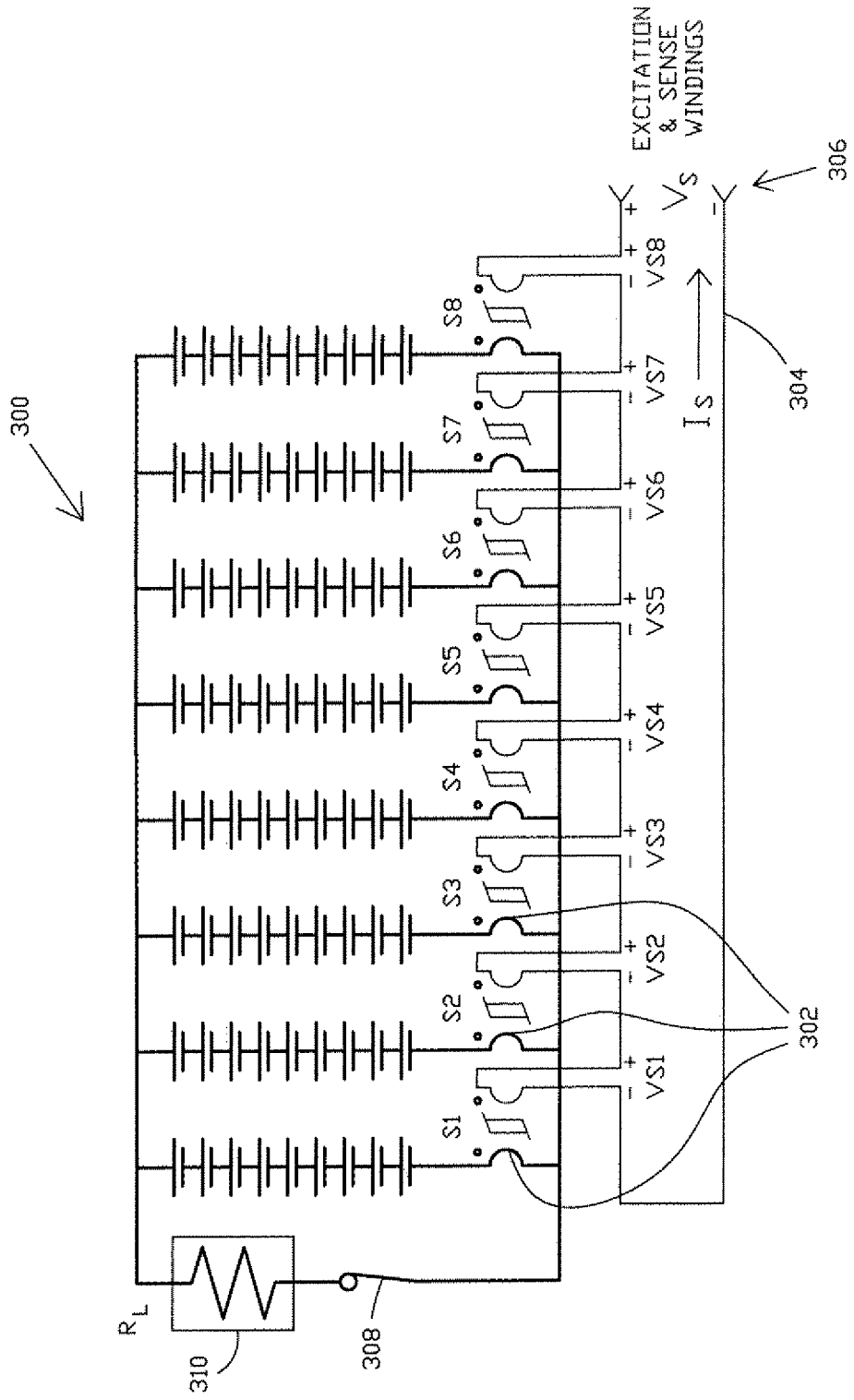
FIG. 25 is a circuit diagram showing a battery assembly comprising strings of battery cells and monitoring network which allows the health of the strings of battery cells to be monitored in accord with one possible embodiment of the present innovation.

In FIG. 25, the excitation windings and the sense windings are the same. Thus, a single wire, excitation/sense wire 304, passes through or loops through each transformer core so that the coils are in series. Excitation/sense wire 304 then connects to the measurement subsystem (not shown) utilizing a simple two pin connector 306. Fuses and/or means to isolate high voltages are not necessary for two pin connector 306.

Figure 26:
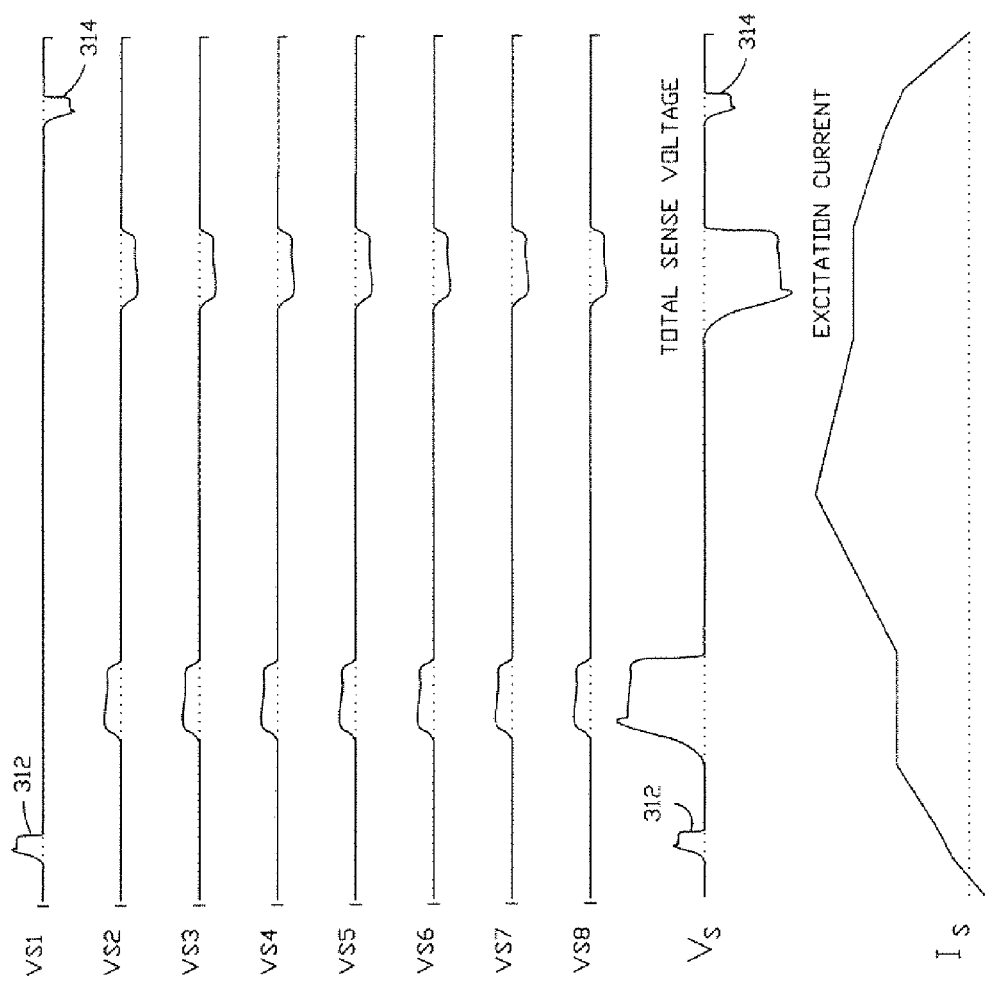
FIG. 26 is a signal diagram showing voltages and currents for the strings of battery cells of FIG. 25 with one string failed which may be monitored in accord with one possible embodiment of the present innovation.

In the signal waveform diagram of FIG. 26, the voltage waveforms VS1, VS2, VS3, VS4, VS5, VS6, VS7, VS8, $V_s$, and current waveform $I_s$ produced by measurement system 300 are shown. Excitation current waveform $I_s$ acts on the transformer cores to create the voltage pulses VS1-VS8. As discussed hereinbefore, the waveform may be a triangular current waveform suitable to drive the transformer cores from saturation in one direction to saturation in the other direction. When the triangular waveform is applied to the transformers with switch 308 closed to known load 310, the resulting somewhat distorted excitation current waveform $I_s$ is produced.

The composite signal of waveforms VS1, VS2, VS3, VS4, VS5, VS6, VS7, and VS8 is measured as $V_s$. From $V_s$, in this example, it can be determined that one of the strings of battery cells is malfunctioning due to error pulses 312 and 314. With the single excitation/sense winding 304 shown in FIG. 25, the fact that one of the strings is malfunctioning may be determined, but not which particular string. As another alternative, the strings could be divided into banks of strings whereby separate sense/excitation windings could be utilized on each bank. For example, the use of two sense/excitation windings could distinguish between faults on bank S1-S4 and bank S5-S8. As another alternative, different numbers of windings could be utilized, whereby with simple two pin connector 306 for the measurement subsystem (not shown), the faulty string could be located.

Figure 27:
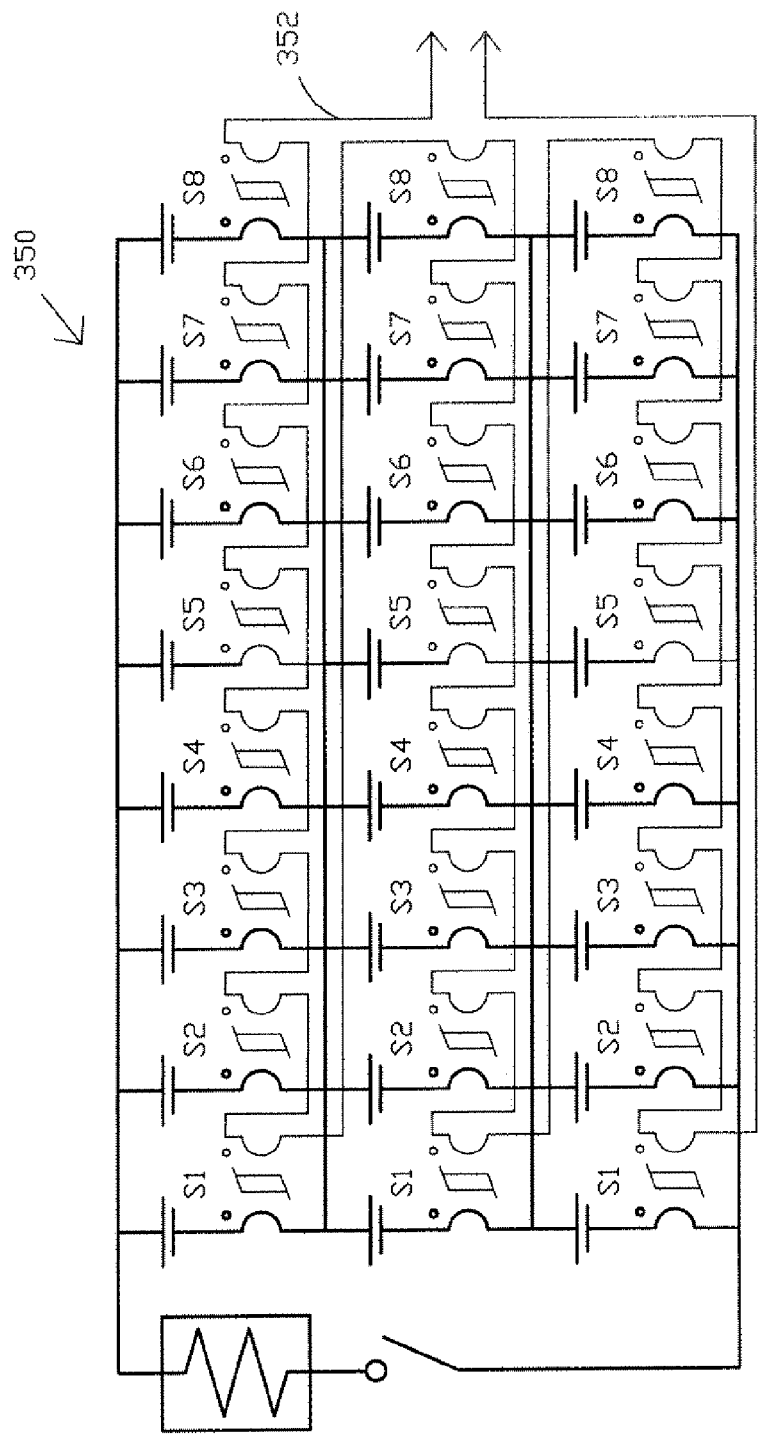
FIG. 27 is a circuit diagram showing a battery comprising series banks of parallel cells and monitoring network which allows the health of the battery cells to be monitored in accord with one possible embodiment of the present innovation.

Another possible embodiment of the innovation, shown in FIG. 27, comprises monitoring system 350 that utilizes a single excitation/sense wire 352 to monitor a battery assembly comprised of series banks of parallel battery cells. However, it may be understood that each battery cell symbol may also represent a string of battery cells. In this embodiment, each battery cell is connected to a respective transformer and excitation/sense wire 352 passes through or wraps around each transformer core one time. If desired, variations in the number of wraps could be utilized to distinguish which cells have faults, as discussed hereinbefore.

Accordingly, many different battery assembly configurations can be monitored by the present innovation. Moreover, faulty operation of individual battery cells or groups of battery cells can be detected and, if desired, located.

Figure 28:
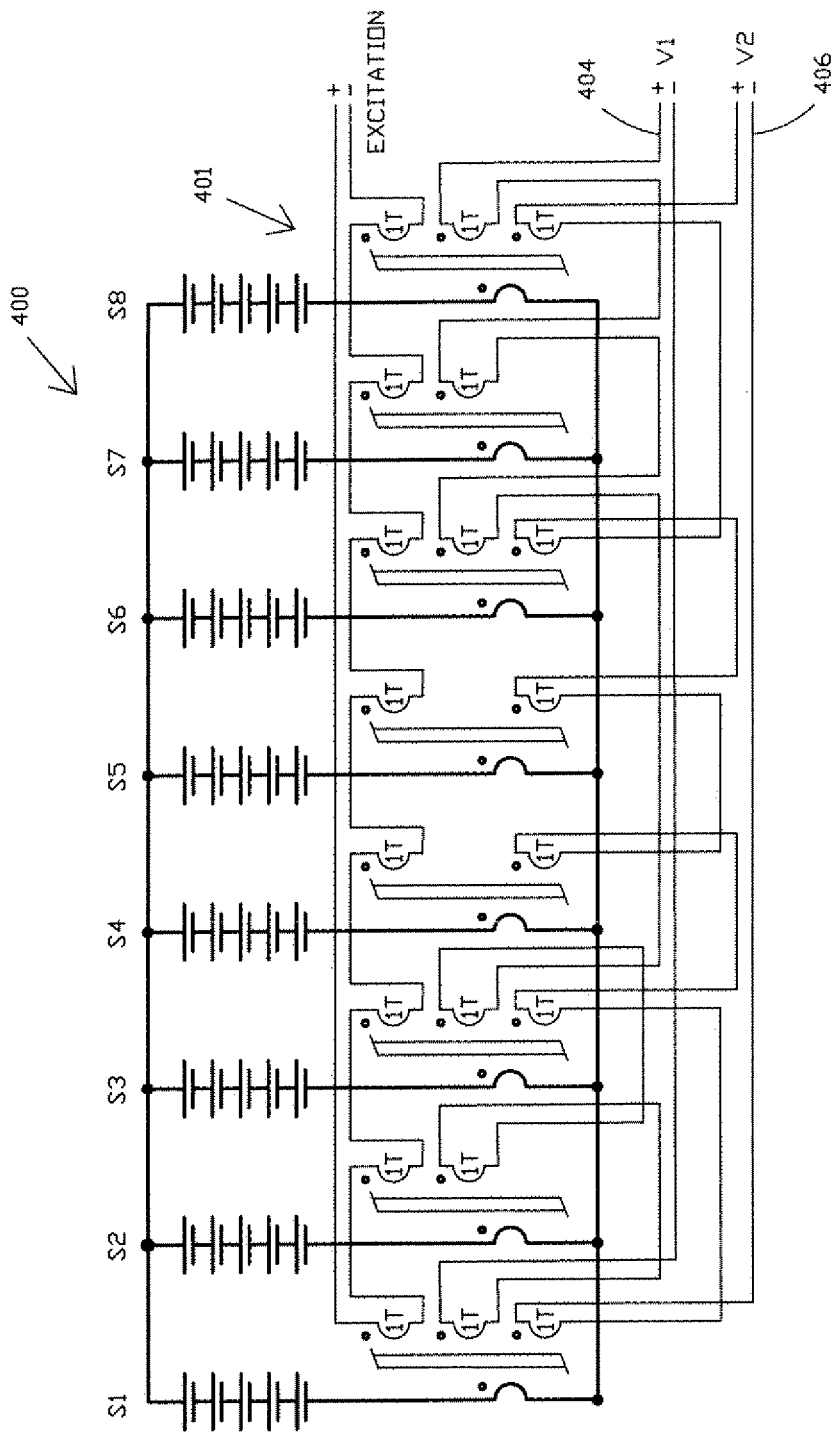
FIG. 28 is a circuit diagram showing a battery comprising strings of battery cells and monitoring network which allows the health of the strings of battery cells to be monitored in accord with one possible embodiment of the present innovation.

FIG. 28 provides yet another possible embodiment of the present innovation wherein monitoring system 400 is utilized to monitor strings S1-S8 of battery cells. If a fault occurs, then monitoring system 400 is operable to detect which string of battery cells had the fault.

As a result of applying a current waveform to excitation/ sense winding 401, if a fault occurs, positive and negative voltages are detected on windings 404 and 406 which can be utilized to locate the battery cell string in which the fault occurred as indicated by the chart in FIG. 29. It may be noted that the direction of the windings varies with different transformers, whereby both positive and/or negative pulses are produced, if there is a fault.

If there is no fault, or if a wire does not run through a transformer which is connected to a faulty battery cell, then pulses may not be produced. Accordingly, there are three possible readings for both V1 and V2, namely, a positive pulse, a negative pulse, or no pulse. This gives rise to nine possible outcomes utilizing two sense wires. The nine possible outcomes are shown in the battery assembly diagnosis chart of FIG. 29.

For the no fault condition shown in the chart of FIG. 29, during normal operation of monitoring system 400, the pulses produced by the excitation signal will cancel each other. However, if there is a fault, depending on which group of battery strings in which the fault is located, then the pulses produced on excitation/sense wires 404 and 406 will not cancel. In this example, the use of two excitation/sense windings permits identification of the string in which the fault occurs for eight strings of battery cells.

It may be appreciated that with an additional sense/excitation wire, twenty seven possibilities can be achieved. Additional variations to distinguish faulty battery cells or groups of battery cells may be produced as discussed hereinbefore.

As well, the sense and excitation wires can be separated as shown hereinbefore in FIG. 12, which reduces the effects of wire impedance on measurements, allows resistive pads to match impedance to retain signal integrity over long cable runs, and limits the effects of transformers on battery impedance.

While a few exemplary embodiments of this innovation have been described in detail above, a person skilled in the art will readily appreciate that many modifications are possible in the exemplary embodiments without materially departing from the novel teachings and advantages of this innovation. Accordingly, all such modifications are intended to be included within the scope of this innovation as defined in the following claims. In the claims, any means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A charge balancing method for use with a plurality of battery cells electrically connected together for balancing a charge state of a particular battery cell or a particular group of battery cells from said plurality of battery cells, said method comprising:
    providing a plurality of transformers, wherein each transformer in said plurality of transformers is comprised of a primary winding and a plurality of secondary windings, wherein one of said plurality of secondary windings for each said primary winding is connected in series and comprise a group of series connected secondary windings;
    operatively connecting each said group of series connected secondary windings to a distinct said particular battery cell or distinct said particular group of battery cells;
    simultaneously applying a plurality of waveforms to said plurality of transformers; and
    using said plurality of transformers to selectively vary said plurality of waveforms and apply a charge current to said particular battery cell or said particular group of battery cells for selectively balancing said charge state of said particular battery cell or said particular group of battery cells.

2. The method of claim 1, wherein said plurality of waveforms represent a plurality of input voltages and further comprising:
    utilizing each said group of series connected secondary windings and said plurality of input voltages to produce a plurality of weighted sums of voltages for selectively balancing said charge state of said particular battery cell or said particular group of battery cells, wherein each said plurality of weighted sums of voltages is based on summing output voltages of two or more secondary windings within each group of series connected secondary windings.

3. The method of claim 1, further comprising:
    providing that said plurality of transformers is fewer in number than said plurality of battery cells.

4. The method of claim 1, wherein said step of using said plurality of transformers to selectively vary said plurality of waveforms comprises selectively inverting and not inverting respective of said plurality of waveforms with respect to each other.

5. An apparatus for use with a plurality of battery cells electrically connected together, said apparatus being operable for balancing a charge state of a particular battery cell or a particular group of battery cells of said plurality of battery cells, said apparatus comprising:
    a plurality of transformers wherein each transformer is comprised of:
        a plurality of input windings; and
        a plurality of output windings operatively connected to a distinct said particular battery cell; and
    a transformer drive operably connected to each said plurality of input windings, said transformer drive being configured to simultaneously apply a plurality of waveforms to each said plurality of input windings, said transformer drive being configured to selectively vary said plurality of waveforms with respect to each other, whereby said apparatus is operable for selectively balancing said charge state of said particular battery cell or said particular group of battery,
wherein said plurality of waveforms represent a plurality of input voltages,
wherein said plurality of output windings comprise a plurality of series connected output windings that produce a plurality of weighted sums of voltages in response to said plurality of input voltages such that said plurality of weighted sums of voltages are selectively variable with respect to each other, and
wherein said plurality of weighted sums of voltages are capable of selectively balancing said charge state of said particular battery cell or said particular group of battery cells.

6. The apparatus of claim 5, wherein said plurality of transformers are fewer in number than said plurality of battery cells.

7. The apparatus of claim 5, wherein said particular battery cell comprises a first particular battery cell and a second particular battery cell, wherein said particular group of battery cells comprises a first particular group of battery cells and a second particular group of battery cells, and wherein said plurality of output windings further comprise,
    a first group of output windings, said first group of output windings being connected in series to said first particular battery cell or said first particular group of battery cells, and
    a second group of output windings, said second group of output windings being connected in series to said second particular battery cell or said second particular group of battery cells.

8. The apparatus of claim 7, wherein said first and second group of output windings are each associated with a different set of said plurality of input windings.

9. An apparatus for use with a plurality of battery cells electrically connected together, said apparatus being operable for balancing a charge state of a particular battery cell or a particular group of battery cells from said plurality of battery cells, said apparatus comprising:
    a plurality of transformers operatively connected to said plurality of battery cells said plurality of transformers comprising a plurality of secondary windings, wherein said plurality of secondary windings comprise a plurality of series connected secondary windings operatively connected to each said particular battery cell or each said particular group of battery cells;
    a transformer drive operatively connected to said plurality of transformers and being operable for simultaneously applying a plurality of waveforms to said plurality of transformers; and a controller operable to control said transformer drive to selectively vary said plurality of waveforms for selectively balancing said charge state of said particular battery cell or said particular group of battery cells from said plurality of battery cells.

10. The apparatus of claim 9, wherein each secondary winding within each said plurality of series connected secondary windings is associated with a different said plurality of transformers.

11. The apparatus of claim 9, wherein said plurality of waveforms represent a plurality of input voltages, wherein said plurality of series connected secondary windings is operable to produce a selectively variable weighted voltage for each said particular battery cell or each said particular group of battery cells utilizing said plurality of input voltages.

12. The apparatus of claim 9, wherein said plurality of transformers are fewer in number than said plurality of battery cells.

13. The apparatus of claim 9, wherein said transformer drive is capable of producing a plurality of substantially identical waveforms which are selectively either inverted or non-inverted with respect to each other.

14. The apparatus of claim 9, wherein said transformer drive is capable of producing a plurality of waveforms which are variable in amplitude with respect to each other.

* * * * *